(12) United States Patent
Abe et al.

(10) Patent No.: US 12,042,813 B2
(45) Date of Patent: Jul. 23, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Hiroshi Abe, Kyoto (JP); Takashi Ota, Kyoto (JP); Takaaki Ishizu, Kyoto (JP); Kenji Kobayashi, Kyoto (JP); Ryo Muramoto, Kyoto (JP); Sei Negoro, Kyoto (JP); Manabu Okutani, Kyoto (JP); Wataru Sakai, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 504 days.

(21) Appl. No.: 17/133,647

(22) Filed: Dec. 24, 2020

(65) Prior Publication Data
US 2021/0197224 A1   Jul. 1, 2021

(30) Foreign Application Priority Data

Dec. 27, 2019 (JP) ................................. 2019-239589
Feb. 28, 2020 (JP) ................................. 2020-034469

(51) Int. Cl.
*B05C 11/08* (2006.01)
*B05B 1/24* (2006.01)
(Continued)

(52) U.S. Cl.
CPC ................ *B05C 11/08* (2013.01); *B05B 1/24* (2013.01); *G03F 7/40* (2013.01); *H01L 21/0262* (2013.01);
(Continued)

(58) Field of Classification Search
CPC ................ B05C 11/08; H01L 21/0262; H01L 21/02628; H01L 21/67098; H01L 21/6715;
(Continued)

(56) References Cited

U.S. PATENT DOCUMENTS 9,259,758 B2  2/2016  Emoto et al.
9,768,011 B2  9/2017  Okutani
(Continued)

FOREIGN PATENT DOCUMENTS

JP   2012222254   11/2012
JP   2014112652    6/2014
(Continued)

*Primary Examiner* — Matthew W Jellett
*Assistant Examiner* — Christopher D Ballman
(74) *Attorney, Agent, or Firm* — JCIPRNET

(57) ABSTRACT

A substrate processing method includes a liquid film forming step of forming a liquid film, a liquid film heat retaining step of keeping the liquid film warm, a gas phase layer forming step of forming a gas phase layer which holds the processing liquid on a center portion of the liquid film, an opening forming step of forming an opening in the center portion of the liquid film by excluding the processing liquid held by the gas phase layer, a substrate rotating step of rotating the substrate around a rotation axis, and an opening expanding step of expanding the opening, while a state in which the gas phase layer is formed on an inner circumferential edge of the liquid film is maintained, by moving the irradiation region toward a circumferential edge portion of the substrate while the liquid film heat retaining step and the substrate rotating step are performed.

15 Claims, 51 Drawing Sheets

(51) Int. Cl.
*G03F 7/40* (2006.01)
*H01L 21/02* (2006.01)
*H01L 21/67* (2006.01)
*H01L 21/687* (2006.01)
*H05B 3/00* (2006.01)

(52) U.S. Cl.
CPC .. *H01L 21/02628* (2013.01); *H01L 21/02057* (2013.01); *H01L 21/67017* (2013.01); *H01L 21/67034* (2013.01); *H01L 21/67051* (2013.01); *H01L 21/67098* (2013.01); *H01L 21/67103* (2013.01); *H01L 21/67115* (2013.01); *H01L 21/6715* (2013.01); *H01L 21/68764* (2013.01); *H01L 21/68785* (2013.01); *H05B 3/0047* (2013.01)

(58) Field of Classification Search
CPC ......... H01L 21/68785; H01L 21/67017; H01L 21/02057; H01L 21/67034; H01L 21/67051; H01L 21/67103; H01L 21/67115; H01L 21/68764; B05B 1/24; G03F 7/40; H05B 3/0047
See application file for complete search history.

(56) References Cited

U.S. PATENT DOCUMENTS

| | | | |
|---|---|---|---|
| 10,121,648 B2 | 11/2018 | Kimura | |
| 10,281,210 B2 | 5/2019 | Miyazaki et al. | |
| 10,695,792 B2 | 6/2020 | Okutani et al. | |
| 10,720,320 B2 | 7/2020 | Emoto et al. | |
| 11,177,124 B2 | 11/2021 | Okutani et al. | |
| 11,289,324 B2 | 3/2022 | Okutani | |
| 11,469,116 B2 | 10/2022 | Hidaka et al. | |
| 2009/0081810 A1 | 3/2009 | Hamada et al. | |
| 2014/0127908 A1 | 5/2014 | Okutani | |
| 2015/0243542 A1* | 8/2015 | Yoshihara | H01L 21/68728 156/345.23 |
| 2016/0214148 A1* | 7/2016 | Okutani | H01L 21/67017 |
| 2017/0282210 A1 | 10/2017 | Okutani et al. | |
| 2019/0035652 A1 | 1/2019 | Hashimoto | |
| 2022/0172942 A1 | 6/2022 | Okutani | |

FOREIGN PATENT DOCUMENTS

| | | |
|---|---|---|
| JP | 2014197571 | 10/2014 |
| JP | 2015029041 | 2/2015 |
| JP | 2015185805 | 10/2015 |
| JP | 2015211201 | 11/2015 |
| JP | 2016136599 | 7/2016 |
| JP | 2017041512 | 2/2017 |
| JP | 2017069346 | 4/2017 |
| JP | 2017162916 | 9/2017 |
| JP | 2017183634 | 10/2017 |
| JP | 2017201728 | 11/2017 |
| JP | 2019050427 | 3/2019 |
| JP | 2019134073 | 8/2019 |
| JP | 2020017633 | 1/2020 |
| KR | 1020180046034 | 5/2018 |
| KR | 101866662 | 7/2018 |
| TW | I609725 | 1/2018 |
| WO | 2006038472 | 4/2006 |

* cited by examiner

SUBSTRATE PROCESSING METHOD AND SUBSTRATE PROCESSING APPARATUS

CROSS-REFERENCE TO RELATED APPLICATION

This application claims the priority benefit of Japanese Patent Application No. 2019-239589, filed Dec. 27, 2019 and Japanese Patent Application No. 2020-034469, filed Feb. 28, 2020. The entirety of the above-mentioned patent application is hereby incorporated by reference herein and made a part of this specification.

BACKGROUND OF THE INVENTION

Field of the Invention

The disclosure relates to a substrate processing method and a substrate processing apparatus which process a substrate. For example, the substrates to be processed may include semiconductor wafers, liquid crystal display device substrates, flat panel display (FPD) substrates for organic electroluminescence (EL) display devices or the like, optical disc substrates, magnetic disc substrates, magneto-optical disc substrates, photomask substrates, ceramic substrates, solar cell substrates, and the like.

Description of the Related Art

In substrate processing by a single-wafer type substrate processing apparatus which processes the substrates one by one, for example, a chemical liquid is supplied to a substrate held substantially horizontally by a spin chuck. Then, a rinse liquid is supplied to the substrate, and thus the chemical liquid on the substrate is replaced with the rinse liquid. After that, a spin drying step is performed to remove the rinse liquid on the substrate.

When a pattern is formed on a surface of the substrate, the rinse liquid which has entered the inside of the pattern may not be removed in the spin drying step. Therefore, poor drying of the substrate may occur. Since a liquid level (an interface between air and liquid) of the rinse liquid which has entered the inside of the pattern is formed inside the pattern, a surface tension of the liquid acts on a contact position between the liquid level and the pattern. When the surface tension is large, the pattern is likely to collapse. Since water which is a typical rinse liquid has a large surface tension, collapse of the pattern in the spin drying step cannot be ignored.

Therefore, it has been proposed to supply Isopropyl alcohol (IPA) which is an organic solvent having a lower surface tension than that of water. The water which has entered the inside of the pattern is replaced with the IPA by processing the upper surface of the substrate with IPA. After that, the upper surface of the substrate is dried by removing the IPA.

However, in recent years, fine patterns (columnar patterns, line-shaped patterns, and the like) having a high aspect ratio have been formed on the surface of substrates for high integration. The fine patterns having a high aspect ratio are likely to collapse. Therefore, it is necessary to shorten a time during which the surface tension acts on the fine patterns after a liquid film of the IPA is formed on the upper surface of the substrate.

Therefore, U.S. Patent Application Publication No. 2014/127908 proposes a substrate processing method in which a gas phase layer of IPA is formed. In this substrate processing method, the substrate is heated by a heater, and thus the gas phase layer of the IPA is formed between a liquid film of the IPA and an upper surface of the substrate. Thus, since the inside of the fine pattern is filled with the gas phase IPA, the time during which the surface tension acts on the fine pattern can be shortened as compared with a method for gradually evaporating the IPA inside the fine pattern from above.

In the substrate processing method described in U.S. Patent Application Publication No. 2014/127908, the liquid film of the IPA is excluded to the outside of the substrate since a state in which the liquid film of the IPA floats from the upper surface of the substrate and is not in contact with the upper surface of the substrate is maintained. The specification of U.S. Patent Application Publication No. 2014/127908 discloses, for example, a method in which the substrate is tilted such that the liquid film of the IPA slides off (refer to FIGS. 11A-11C in the specification of U.S. Patent Application Publication No. 2014/127908), a method in which the liquid film of the IPA is excluded by suctioning the liquid film of the IPA with a suction nozzle (refer to FIGS. 12A-12C in the specification of U.S. Patent Application Publication No. 2014/127908), and the like as a method for excluding the liquid film of the IPA to the outside of the substrate in a state in which the gas phase layer is formed.

In these methods, when the liquid film is not excluded after the entire liquid film of the IPA has floated from the upper surface of the substrate, the IPA may remain on the upper surface of the substrate. Therefore, it is necessary to sufficiently heat the substrate with a heater. On the contrary, when the substrate is heated too much, the IPA may evaporate locally and the liquid film may split while the substrate is heated by the heater to float the entire liquid film of the IPA.

SUMMARY OF THE INVENTION

The disclosure provides a substrate processing method and a substrate processing apparatus capable of satisfactorily excluding a processing liquid from an upper surface of a substrate in a configuration in which a gas phase layer is formed between a liquid film of the processing liquid and the upper surface of the substrate when the processing liquid is excluded from the upper surface of the substrate.

The disclosure also provides a substrate processing method and a substrate processing apparatus capable of curbing collapse of a pattern.

One embodiment of the disclosure provides a substrate processing method including a liquid film forming step of supplying a processing liquid to an upper surface of a substrate horizontally held and forming a liquid film of the processing liquid on the upper surface of the substrate, a liquid film heat retaining step of keeping the liquid film warm by heating the entire substrate to a temperature lower than a boiling point of the processing liquid, a gas phase layer forming step of evaporating the processing liquid in contact with a center portion of the upper surface of the substrate and forming a gas phase layer which is in contact with the upper surface of the substrate and holds the processing liquid on a center portion of the liquid film by irradiating an irradiation region set on the center portion of the upper surface of the substrate with light from a radiation unit which faces the upper surface of the substrate to heat the center portion of the upper surface of the substrate, while the liquid film heat retaining step is performed, an opening forming step of forming an opening in the center portion of the liquid film by excluding the processing liquid held by the gas phase layer, a substrate rotating step of rotating the substrate around a rotation axis which passes through the center portion of the upper surface of the substrate and extends in a vertical direction, and an opening expanding step of expanding the opening, while a state in which the gas phase layer is formed on an inner circumferential edge of the liquid film is maintained, by moving the irradiation region toward a circumferential edge portion of the substrate while the liquid film heat retaining step and the substrate rotating step are performed.

According to the method, the light is applied to the irradiation region set on the center portion of the upper surface of the substrate to heat the center portion of the upper surface of the substrate. Thus, the processing liquid in contact with the center portion of the upper surface of the substrate is evaporated, and the gas phase layer is formed on the center portion of the upper surface of the substrate. The liquid film floats from the center portion of the upper surface of the substrate by forming the gas phase layer. The opening is formed in the center portion of the liquid film by excluding the processing liquid held by the gas phase layer formed on the center portion of the upper surface of the substrate. After the opening is formed, the opening is expanded, while the state in which the gas phase layer is formed on the inner circumferential edge of the liquid film is maintained, by moving the heating region toward the circumferential edge portion of the substrate while the substrate is rotated. In other words, when the liquid film is excluded from the upper surface of the substrate, an annular region (a gas phase layer forming region) in which the gas phase layer is formed moves toward the circumferential edge portion of the upper surface of the substrate as the opening expands.

Therefore, as compared with a method in which the liquid film held in the gas phase layer is excluded after the gas phase layer is formed over the entire upper surface of the substrate, a time from the formation of the gas phase layer to the exclusion of the processing liquid held in the gas phase layer can be shortened at an arbitrary position on the upper surface of the substrate. Thus, it is possible to curb excessive heating of the entire substrate during the formation and expansion of the opening. Therefore, it is possible to curb local evaporation of the processing liquid and thus splitting of the liquid film.

Further, the formation and expansion of the opening are performed while the liquid film of the processing liquid is kept warm. Therefore, the gas phase layer can be formed rapidly in the irradiation region. Further, it is possible to curb a temperature drop of the substrate in a non-irradiation region (particularly, a region opposite to the irradiation region with respect to a rotation center position of the upper surface of the substrate) on the upper surface of the substrate which is not irradiated. Therefore, it is possible to curb movement of the formed gas phase layer out of the irradiation region and thus disappearance thereof due to the rotation of the substrate.

As described above, the processing liquid can be satisfactorily excluded from the upper surface of the substrate. As a result, it is possible to curb collapse of the pattern due to a surface tension of the processing liquid and generation of particles due to poor drying.

In the embodiment of the disclosure, the opening expanding step may include a step of moving the irradiation region according to expansion of the opening so that the irradiation region is disposed to straddle a liquid film forming region in which the liquid film is formed on the upper surface of the substrate and an opening forming region in which the opening is formed in the upper surface of the substrate.

When the substrate is heated in a state in which the opening is formed in the liquid film, a temperature of the substrate increases rapidly because the processing liquid is not present in a region on the upper surface of the substrate in which the opening is formed. Thus, a temperature difference occurs between the inside of the inner circumferential edge of the liquid film (an opening forming region) and the outside of the inner circumferential edge of the liquid film (a liquid film forming region). Specifically, the temperature of the substrate is high in the opening forming region, and the temperature of the substrate is low in the liquid film forming region. Due to the temperature difference, since heat convection in which the processing liquid moves to the low temperature side is generated, the opening is expanded, and thus the processing liquid is excluded to the outside of the substrate.

Therefore, in the configuration in which the irradiation region is moved according to the expansion of the opening so that the irradiation region is disposed to straddle the liquid film forming region and the opening forming region, a sufficient temperature difference can be generated between the liquid film forming region and the opening forming region, and heat convection can be generated in the liquid film.

On the other hand, the inner circumferential edge of the liquid film can be heated with a sufficient amount of heat. Therefore, it is possible to curb occurrence of a situation in which the gas phase layer is not formed on the inner circumferential edge of the liquid film due to an insufficient amount of heat and a situation in which the gas phase layer temporarily formed disappears and the processing liquid comes into contact with the upper surface of the substrate. That is, the gas phase layer can be stably formed on the inner circumferential edge of the liquid film.

In the embodiment of the disclosure, the liquid film heat retaining step may include a heater heating step of keeping the liquid film warm by heating the substrate with a heater unit which faces a lower surface of the substrate at a position at which the heater unit is separated from the lower surface of the substrate.

According to the method, the substrate is heated by a heater unit disposed at a position at which it is separated from the lower surface of the substrate. Therefore, regardless of the configuration of the heater unit, for example, even if the heater unit cannot rotate with the substrate, the substrate can be easily rotated when the opening is expanded. Further, as compared with a configuration in which the heater unit is brought into contact with the substrate, the entire substrate can be appropriately heated. Further, it is possible to curb transferring of dirt adhering to the heater unit to the substrate.

In the embodiment of the disclosure, the liquid film heat retaining step may include a fluid heating step of keeping the liquid film warm by supplying a heating fluid to a center portion of the lower surface of the substrate and heating the substrate.

When the opening is expanded, the heating fluid supplied to the center portion of the lower surface of the substrate spreads toward the circumferential edge portion of the lower surface of the substrate by an action of centrifugal force caused by the rotation of the substrate. Therefore, the entire substrate can be heated simply by supplying the heating fluid to the center portion of the lower surface of the substrate.

In the embodiment of the disclosure, the opening expanding step may include a step of forming the opening in the center portion of the liquid film by maintaining the irradiation region on the center portion of the upper surface of the substrate after the gas phase layer is formed.

According to the method, the irradiation region is maintained on the center portion of the upper surface of the substrate even after the gas phase layer is formed. Therefore, even after the gas phase layer is formed, the center portion of the upper surface of the substrate is heated, and thus the evaporation of the processing liquid held in the gas phase layer is promoted. Further, on the upper surface of the substrate, a large temperature difference occurs between the irradiation region and the region outside the irradiation region. Due to the temperature difference, heat convection flowing from the center portion to the circumferential edge portion is formed on the upper surface of the substrate. Due to the evaporation of the processing liquid and the generation of heat convection, the opening can be rapidly formed in the center portion of the liquid film of the processing liquid.

In the embodiment of the disclosure, the substrate processing method may further include an opening formation promoting step of promoting formation of the opening by spraying a gas toward the center portion of the liquid film on which the gas phase layer is formed.

In the state in which the gas phase layer is formed, frictional resistance acting on the liquid film on the substrate is small enough that it can be regarded as zero. In the method in which the gas is sprayed toward the center portion of the liquid film on which the gas phase layer is formed, the processing liquid in the center portion of the substrate can be rapidly pushed away. Thus, the formation of the opening can be promoted.

In the embodiment of the disclosure, the substrate processing method may further include an expansion promoting step of promoting expansion of the opening by spraying a gas onto an inside of the inner circumferential edge of the liquid film on the upper surface of the substrate when the inner circumferential edge of the liquid film reaches the circumferential edge portion of the upper surface of the substrate.

In the movement of the processing liquid using the heat convection, the opening can be expanded to some extent, but when the outer circumferential edge of the opening reaches the circumferential edge portion of the upper surface of the substrate, the movement of the processing liquid may stop. More specifically, in a state in which the outer circumferential edge of the opening reaches the circumferential edge portion of the upper surface of the substrate, a total amount of the processing liquid on the substrate is small, and thus the temperature difference between the opening forming region and the liquid film forming region is small. Therefore, the processing liquid is in an equilibrium state in which it repeatedly moves to the inside and the outside of the substrate. In this case, when the processing liquid returns to the inside of the substrate, the processing liquid may come into direct contact with the upper surface of the substrate on which the gas phase layer has disappeared. Therefore, there is a possibility that the pattern may collapse due to the surface tension of the processing liquid and particles be generated due to poor drying.

The substrate is rotating when the opening is expanded. Therefore, the equilibrium state can be released when the centrifugal force acting on the liquid film is sufficiently large. However, when the centrifugal force is not sufficiently large, the equilibrium state cannot be released.

Therefore, in the configuration in which, when the inner circumferential edge of the liquid film reaches the circumferential edge portion of the upper surface of the substrate, the gas is sprayed onto the inside of the inner circumferential edge of the liquid film on the upper surface of the substrate, a gas force can push the processing liquid to the outside of the substrate to expand the opening. Thus, the processing liquid is excluded from the upper surface of the substrate without stopping. It is thus possible to curb or prevent collapse of the pattern and generation of particles.

In the embodiment of the disclosure, in the opening forming step, the opening may be formed in a state in which a height position of the radiation unit is set to a separation position. The substrate processing method may further include a radiation unit proximity step of changing the height position of the radiation unit to a proximity position closer to the upper surface of the substrate than the separation position is after the opening is formed, and a proximity movement step of moving the irradiation region toward the circumferential edge portion of the substrate by moving the radiation unit toward the circumferential edge portion of the substrate, while the height position of the radiation unit is maintained at the proximity position, in the opening expanding step.

According to the method, after the opening is formed, the height position of the radiation unit is changed from the separation position to the proximity position. Therefore, the temperature of the opening forming region can be rapidly increased. Thus, the opening can be expanded using the temperature difference. After that, when the opening is expanded, the radiation unit in which the height position is maintained at the proximity position is moved to the circumferential edge portion. Therefore, the opening can be expanded while a sufficient amount of heat is provided to the inner circumferential edge of the liquid film.

In the embodiment of the disclosure, the light radiated from the radiation unit may have a wavelength which is transmitted through the processing liquid. Therefore, the light can satisfactorily reach the upper surface of the substrate. When the processing liquid is IPA, the wavelength transmitted through the processing liquid is 200 nm to 1100 nm.

Another embodiment of the disclosure provides a substrate processing apparatus including a substrate holding unit which holds the substrate horizontally, a processing liquid supply unit which supplies a processing liquid to an upper surface of the substrate held horizontally, a substrate heating unit which heats the entire substrate horizontally held to a temperature lower than a boiling point of the processing liquid, a radiation unit which faces the upper surface of the substrate held horizontally and radiates light toward a center portion of the upper surface of the substrate, a moving unit which moves the radiation unit in a horizontal direction, a substrate rotating unit which rotates the substrate around a rotation axis which passes through the center portion of the upper surface of the substrate held horizontally and extends in a vertical direction, and a controller which controls the processing liquid supply unit, the substrate heating unit, the radiation unit, the moving unit, and the substrate rotating unit.

Additionally, the controller is programmed to perform a liquid film forming step of forming a liquid film of the processing liquid on the upper surface of the substrate by supplying the processing liquid from the processing liquid supply unit to the upper surface of the substrate held by the substrate holding unit, a liquid film heat retaining step of keeping the liquid film warm by heating the entire substrate with the substrate heating unit, a gas phase layer forming step of evaporating the processing liquid in contact with the center portion of the upper surface of the substrate and forming a gas phase layer which is in contact with the upper surface of the substrate and holds the processing liquid on a center portion of the liquid film by irradiating an irradiation region set on the upper surface of the substrate with light from the radiation unit while the liquid film heat retaining step is performed, an opening forming step of forming an opening in the center portion of the liquid film by excluding the processing liquid held by the gas phase layer, a substrate rotating step of rotating the substrate with the substrate rotating unit, and an opening expanding step of expanding the opening, while a state in which the gas phase layer is formed on an inner circumferential edge of the liquid film is maintained, by moving the radiation unit with the moving unit and thus moving the irradiation region toward a circumferential edge portion of the substrate while the liquid film heat retaining step and the substrate rotating step are performed.

According to this apparatus, the same effects as those in the above-described substrate processing method are obtained.

Yet another embodiment of the disclosure provides a substrate processing method including a liquid film forming step of supplying a processing liquid to an upper surface of a substrate which is horizontally held and has a pattern formed on the upper surface and forming a liquid film of the processing liquid on the upper surface of the substrate, a vapor layer forming part forming step of forming a vapor layer between the processing liquid and the upper surface of the substrate at a center portion of the upper surface of the substrate and forming a vapor layer forming part, in which the liquid film is held, on the vapor layer by radiating light to the center portion of the upper surface of the substrate from above the liquid film and heating a heating region which is set on the center portion of the upper surface of the substrate and is not set at an outer circumferential portion of the upper surface of the substrate, a substrate rotating step of forming the vapor layer forming part in an annular shape having a hole formed in the liquid film inside by rotating the substrate, in which the vapor layer forming part is formed on the center portion of the upper surface, around a vertical rotation axis passing through the center portion of the substrate, and a vapor layer forming part moving step of moving the annular vapor layer forming part toward an outer circumference of the substrate by moving the heating region toward the outer circumference of the substrate to expand an outer circumference of the vapor layer forming part and to expand the hole in parallel with the substrate rotating step.

According to the method, the heating region set on the center portion of the upper surface of the substrate and not set at the outer circumferential portion of the upper surface of the substrate is heated by irradiating the center portion of the upper surface of the substrate with light from above the liquid film. Thus, the processing liquid in contact with the heating region is evaporated to form the vapor layer, and the liquid film is held on the vapor layer. That is, the vapor layer forming part in which the vapor layer is formed between the processing liquid and the upper surface of the substrate and the liquid film is held on the vapor layer is formed on the center portion of the upper surface of the substrate. In the vapor layer forming part, the liquid film floats from the upper surface of the substrate.

The hole is formed by rotating the substrate in that state, and a gas-liquid interface is formed between the liquid film of the vapor layer forming part and the hole, that is, on the inner circumference of the liquid film of the vapor layer forming part. Further, the rotation of the substrate causes the vapor layer forming part to have an annular shape. Then, due to the expansion of the outer circumference of the annular vapor layer forming part and the hole, the annular vapor layer forming part moves toward the outer circumference of the substrate. The liquid film of the vapor layer forming part can be moved without bringing the gas-liquid interface on the inner circumference of the liquid film of the vapor layer forming part into contact with the pattern by the movement of the annular vapor layer forming part. Due to the expansion of the inner circumference of the vapor layer forming part to the outer circumference of the substrate, the liquid film can be satisfactorily excluded from the entire upper surface of the substrate. Since the liquid film can be excluded from the substrate while the surface tension of the processing liquid applied to the pattern on the substrate is curbed, it is possible to curb or prevent the collapse of the pattern.

Further, since the vapor layer forming part is moved while the substrate is rotated, it is possible to exert a centrifugal force due to the rotation of the substrate on the vapor layer forming part which has reached the outer circumferential portion of the substrate. Since the centrifugal force acting on the outer peripheral portion of the substrate can curb or prevent the residual processing liquid remaining on the outer circumferential portion of the substrate, occurrence of defects on the outer circumferential portion of the substrate can be curbed or prevented.

Further, since the heating of the substrate is started by the start of the radiation of light, the substrate is not heated during a period other than the radiation of light. Therefore, it is possible to exclude or reduce a thermal effect in the processing which does not require heating of the substrate.

Further, the vapor layer forming part is formed in the center portion of the upper surface of the substrate and the vapor layer forming part is moved toward the outer circumference of the substrate by providing the heating region in the center portion of the upper surface of the substrate. Since the heating region is set only on a part of the upper surface of the substrate, a small area of the heating region is sufficient as compared with a case in which the entire upper surface of the substrate is heated. Therefore, it is possible to satisfactorily heat the entire heating region. Thus, the liquid film can satisfactorily float over the entire region of the vapor layer forming part.

In the embodiment of the disclosure, the vapor layer forming part forming step may include a step of forming the vapor layer forming part by radiating light to the center portion of the upper surface of the substrate and heating a first heating region which is set on the center portion of the upper surface of the substrate and is not set at the outer circumferential portion of the upper surface of the substrate. Additionally, the substrate processing method may further include an auxiliary heating step of assisting heating of the vapor layer forming part by radiating light to the upper surface of the substrate and heating a second heating region on the upper surface of the substrate of which at least a part does not overlap the first heating region in a rotation direction of the substrate in parallel with the vapor layer forming part moving step.

According to the method, the vapor layer forming part is formed on the center portion of the upper surface of the substrate by heating the first heating region. Since a circumferential speed of the substrate is high at the outer circumferential portion of the substrate, when the first heating region is disposed on the outer circumferential portion of the substrate, the amount of heat per unit area applied to the substrate by the radiation of light decreases. When the first heating region is moved toward the outer circumference of the substrate to move the vapor layer forming part toward the outer circumference of the substrate, the amount of heat applied to the substrate per unit area may decrease, and the liquid film may not float over the entire region of the vapor layer forming part. When the liquid film does not float over at least the entire inner circumference of the vapor layer forming part, the gas-liquid interface on the inner circumference of the liquid film of the vapor layer forming part may come into contact with the pattern and the pattern may collapse.

In this method, the first heating region and the second heating region in which at least a part thereof in the rotation direction of the substrate does not overlap are heated by the radiation of light. That is, the total area of the heating region can be increased. Thus, the amount of heat applied to the substrate per unit area can be maintained to be high. Therefore, even when the vapor layer forming part moves toward the outer circumference of the substrate, it is possible to maintain the state in which the liquid film floats over the entire region of the vapor layer forming part. Since the vapor layer forming part is moved while the liquid film floats over the entire inner circumference of the vapor layer forming part, it is possible to reliably prevent the gas-liquid interface from coming into contact with the pattern and causing the pattern to collapse.

In the embodiment of the disclosure, the vapor layer forming part moving step may include a step of moving at least one of the first heating region and the second heating region toward the outer circumference of the substrate.

According to the method, the outer circumference of the vapor layer forming part is expanded by moving at least one of the first heating region and the second heating region toward the outer circumference of the substrate. Thus, the outer circumference of the vapor layer forming part can be satisfactorily expanded.

In the embodiment of the disclosure, the vapor layer forming part moving step may include a step of moving both the first heating region and the second heating region toward the outer circumference of the substrate.

According to the method, the outer circumference of the vapor layer forming part is expanded by moving both the first heating region and the second heating region toward the outer circumference of the substrate. In this case, the vapor layer forming part can be heated and the vapor layer forming part can be moved toward the outer circumference of the substrate by heating both the first heating region and the second heating region. Thus, the outer circumference of the vapor layer forming part can be expanded while the state in which the liquid film floats over the entire region of the vapor layer forming part is maintained.

In the embodiment of the disclosure, the vapor layer forming part moving step may include a spraying step of spraying a gas toward a spraying region set inside an inner circumference of the vapor layer forming part.

According to the method, the inner circumference of the vapor layer forming part is pushed toward the outer circumference of the substrate by spraying the gas onto the spraying region set inside the inner circumference of the vapor layer forming part. In the vapor layer forming part, since frictional resistance acting on the liquid film on the substrate is small enough that it can be regarded as zero, the inner circumference of the vapor layer forming part, that is, the outer edge of the hole can be smoothly moved toward the outer circumference of the substrate by a small pushing force due to a flow of the gas. Thus, the hole can be expanded smoothly.

In the embodiment of the disclosure, the spraying region may be set on an upstream side in a rotation direction of the substrate with respect to the heating region.

According to the method, since the spraying region is set on the upstream side in the rotation direction of the substrate with respect to the heating region, the gas can be sprayed to the inner circumference of the vapor layer forming part while an influence of the generated air flow is minimized. Thus, the inner circumference of the vapor layer forming part can be satisfactorily expanded.

In the embodiment of the disclosure, the spraying region may be smaller than the heating region, and the entire spraying region may be disposed inside an outer edge of the heating region.

According to the method, since the entire spraying region is located inside the outer edge of the heating region, the gas can be reliably sprayed onto the vapor layer forming part formed by heating the heating region.

In the embodiment of the disclosure, the substrate processing method may further include a spraying region moving step of moving the spraying region toward the outer circumference of the substrate in parallel with the spraying step.

According to the method, the inner circumference of the vapor layer forming part is pushed toward the outer circumference of the substrate by moving the spraying region. Since the spraying region is moved while the spraying on the spraying region is performed, an inner circumferential position of the vapor layer forming part, that is, an outer edge position of the hole can be controlled with high accuracy. Thus, the hole can be expanded while the outer edge of the hole is controlled with high accuracy.

In the embodiment of the disclosure, the spraying step may include a first spraying step of spraying a gas toward a first spraying region set inside the inner circumference of the vapor layer forming part, and a second spraying step of spraying a gas toward a second spraying region set inside the inner circumference of the vapor layer forming part and separated from the first spraying region in a rotation direction of the substrate in parallel with the first spraying step. Additionally, the spraying region moving step may include a first spraying region moving step of moving the first spraying region toward the outer circumference of the substrate in parallel with the first spraying step, and a second spraying region moving step of moving the second spraying region toward the outer circumference of the substrate in parallel with the second spraying step.

According to the method, in the movement of the vapor layer forming part, both the first spraying region and the second spraying region are moved toward the outer circumference of the substrate. Since the holes are expanded by spraying a gas in multiple regions separated in the rotation direction of the substrate, the hole can be expanded while the inner circumferential position of the vapor layer forming part, that is, the outer edge position of the hole is controlled with higher accuracy.

In the embodiment of the disclosure, the substrate processing method may further include a step of forming the hole in the liquid film of the vapor layer forming part by spraying a gas onto the liquid film of the vapor layer forming part and partially excluding the processing liquid in parallel with the substrate rotating step.

According to the method, the processing liquid is partially excluded from the liquid film of the vapor layer forming part to form the hole by spraying the gas onto the liquid film of the vapor layer forming part. The hole thus can be reliably formed by spraying a gas.

In the embodiment of the disclosure, the light radiated to the heating region may have a wavelength which is able to be transmitted through the processing liquid. In this case, the light can satisfactorily reach on the upper surface of the substrate. When the processing liquid is an organic solvent (for example, IPA), an example of such a wavelength is 200 nm to 1100 nm.

Still another embodiment of the disclosure provides a substrate processing apparatus including a substrate holding unit which horizontally holds a substrate having a pattern formed on a surface thereof, a substrate rotating unit which rotates the substrate held by the substrate holding unit around a vertical rotation axis which passes through a center portion of the substrate, a processing liquid supply unit which has a processing liquid nozzle and supplies a processing liquid from the processing liquid nozzle to an upper surface of the substrate held by the substrate holding unit, a lamp heater which has a light emitting part, is provided to be smaller than the substrate held by the substrate holding unit when seen from above, and radiates light from the light emitting part toward the upper surface of the substrate held by the substrate holding unit, a heating region moving unit which moves a heating region heated by radiation of light by the lamp heater on the upper surface of the substrate held by the substrate holding unit within the upper surface of the substrate, a spraying unit which has a gas nozzle having a gas discharge port and sprays a gas from the gas nozzle onto the upper surface of the substrate held by the substrate holding unit, and a controller which controls the substrate rotating unit, the processing liquid supply unit, the lamp heater, the heating region moving unit, and the spraying unit. The controller is programmed to perform a liquid film forming step of supplying the processing liquid to the upper surface of the substrate, which is the surface, with the processing liquid supply unit and forming a liquid film of the processing liquid on the upper surface of the substrate, a vapor layer forming part forming step of forming a vapor layer between the processing liquid and the upper surface of the substrate at a center portion of the upper surface of the substrate and forming a vapor layer forming part, in which the liquid film is held, on the vapor layer by radiating light to the center portion of the upper surface of the substrate from above the liquid film with the lamp heater and heating a heating region which is set on the center portion of the upper surface of the substrate and is not set at an outer circumferential portion of the upper surface of the substrate, a substrate rotating step of forming the vapor layer forming part in an annular shape having a hole formed in the liquid film inside by rotating the substrate, in which the vapor layer forming part is formed on the center portion of the upper surface, around the rotation axis with the substrate rotating unit, and a vapor layer forming part moving step of moving the annular vapor layer forming part toward an outer circumference of the substrate by moving the heating region toward the outer circumference of the substrate with the heating region moving unit to expand an outer circumference of the vapor layer forming part and to expand the hole with at least one of the spraying unit and the substrate rotating unit in parallel with the substrate rotating step.

The above-described or still other objects, features and effects in the disclosure will be clarified by the description of the embodiments described below with reference to the accompanying drawings.

DETAILED DESCRIPTION OF THE PREFERRED EMBODIMENTS

First Embodiment

Figure 1:
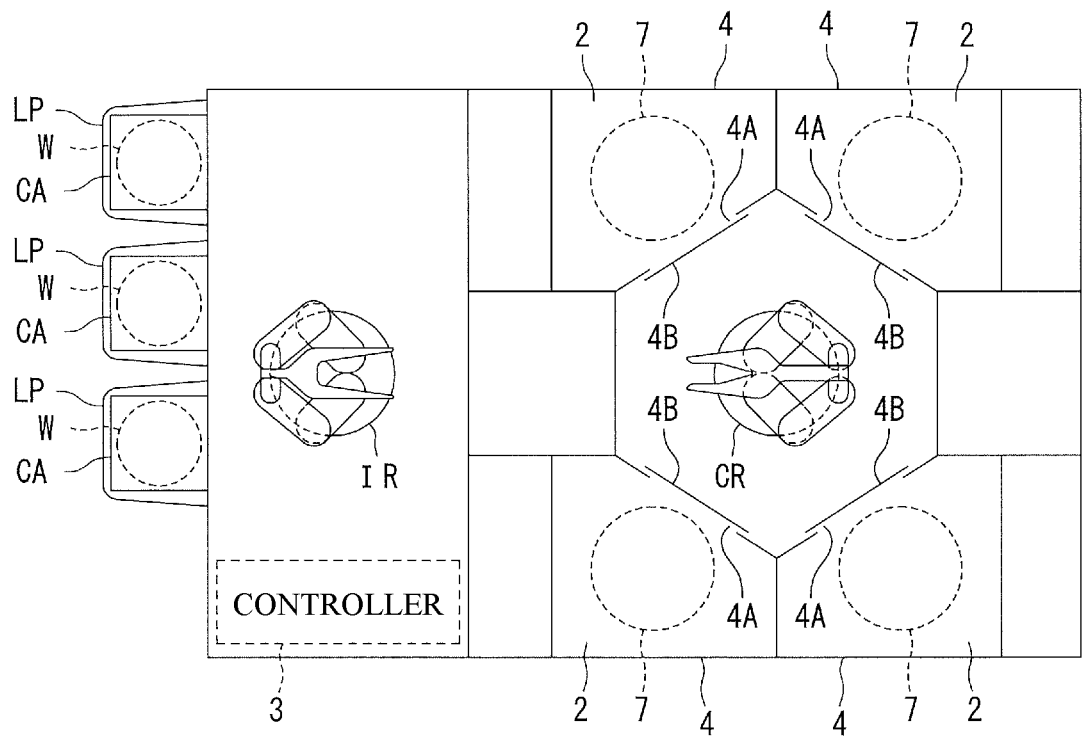
FIG. 1 is a schematic plan view showing a layout of a substrate processing apparatus according to a first embodiment of the disclosure.

FIG. 1 is a schematic plan view showing a layout of a substrate processing apparatus 1 according to an embodiment of the disclosure.

The substrate processing apparatus 1 is a single-wafer type apparatus which processes substrates W such as silicon wafers one by one. In this embodiment, the substrate W is a disc-shaped substrate.

The substrate processing apparatus 1 includes a plurality of processing units 2 which processes the substrate W with a fluid, a load port LP on which a carrier CA for accommodating a plurality of the substrates W processed by the processing unit 2 is placed, transfer robots IR and CR which transfer the substrate W between the load port LP and the processing unit 2, and a controller 3 which controls the substrate processing apparatus 1.

The transfer robot IR transfers the substrate W between the carrier CA and the transfer robot CR. The transfer robot CR transfers the substrate W between the transfer robot IR and the processing unit 2. The plurality of processing units 2 has, for example, the same configuration.

Each of the processing units 2 includes a chamber 4 and a processing cup 7 disposed in the chamber 4, and performs processing of the substrate W in the processing cup 7. An entrance 4A for loading the substrate W and unloading the substrate W by the transfer robot CR is formed in the chamber 4. A shutter unit 4B which opens and closes the entrance 4A is provided at the chamber 4.

Figure 2:
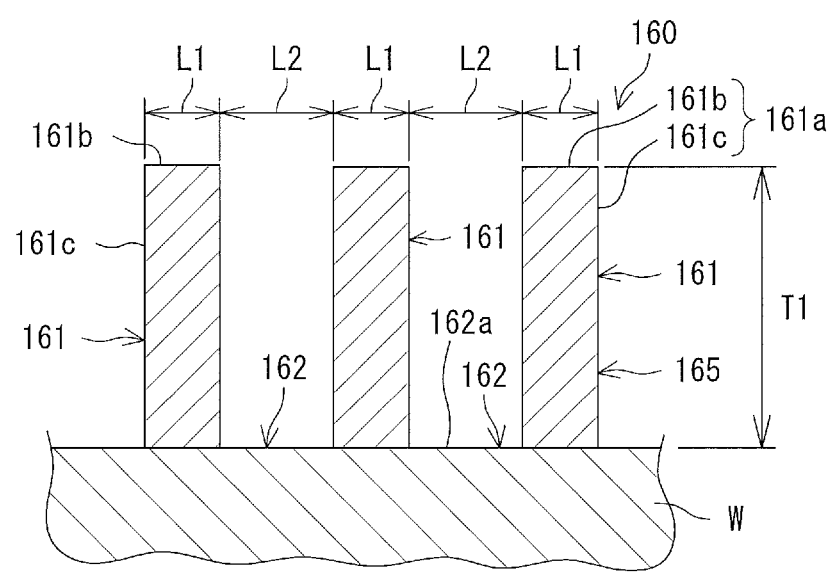
FIG. 2 is an enlarged view of a cross section of a surface of a substrate to be processed.

As shown in FIG. 2, a fine uneven pattern 160 is formed on a surface layer of the substrate W which will be processed by the substrate processing apparatus 1. The uneven pattern 160 includes a fine convex structure 161 formed on the surface of the substrate W and a concave portion (a groove) 162 formed between adjacent structures 161.

A surface of the uneven pattern 160, that is, a surface of the structure 161 (the convex portion) and a surface of the concave portion 162 form an uneven pattern surface 165. The pattern surface 165 is included in the surface of the substrate W. A surface 161a of the structure 161 is configured of a tip end surface 161b (a top portion) and a side surface 161c, and a surface of the concave portion 162 is configured of a bottom surface 162a (a bottom portion). When the structure 161 has a tubular shape, a concave portion is formed therein.

The structure 161 may include an insulator film or a conductor film. Further, the structure 161 may be a laminated film in which a plurality of films is laminated.

The uneven pattern 160 is a fine pattern having an aspect ratio of 3 or more. The aspect ratio of the uneven pattern 160 is, for example, 10 to 50. A width L1 of the structure 161 may be about 5 nm to 45 nm, and a distance L2 between the structures 161 may be about 5 nm to several μm. A height of the structure 161 (a pattern height T1) may be, for example, about 50 nm to 5 μm. The pattern height T1 is a distance between the tip end surface 161b of the structure 161 and the bottom surface 162a (the bottom portion) of the concave portion 162.

Figure 3:
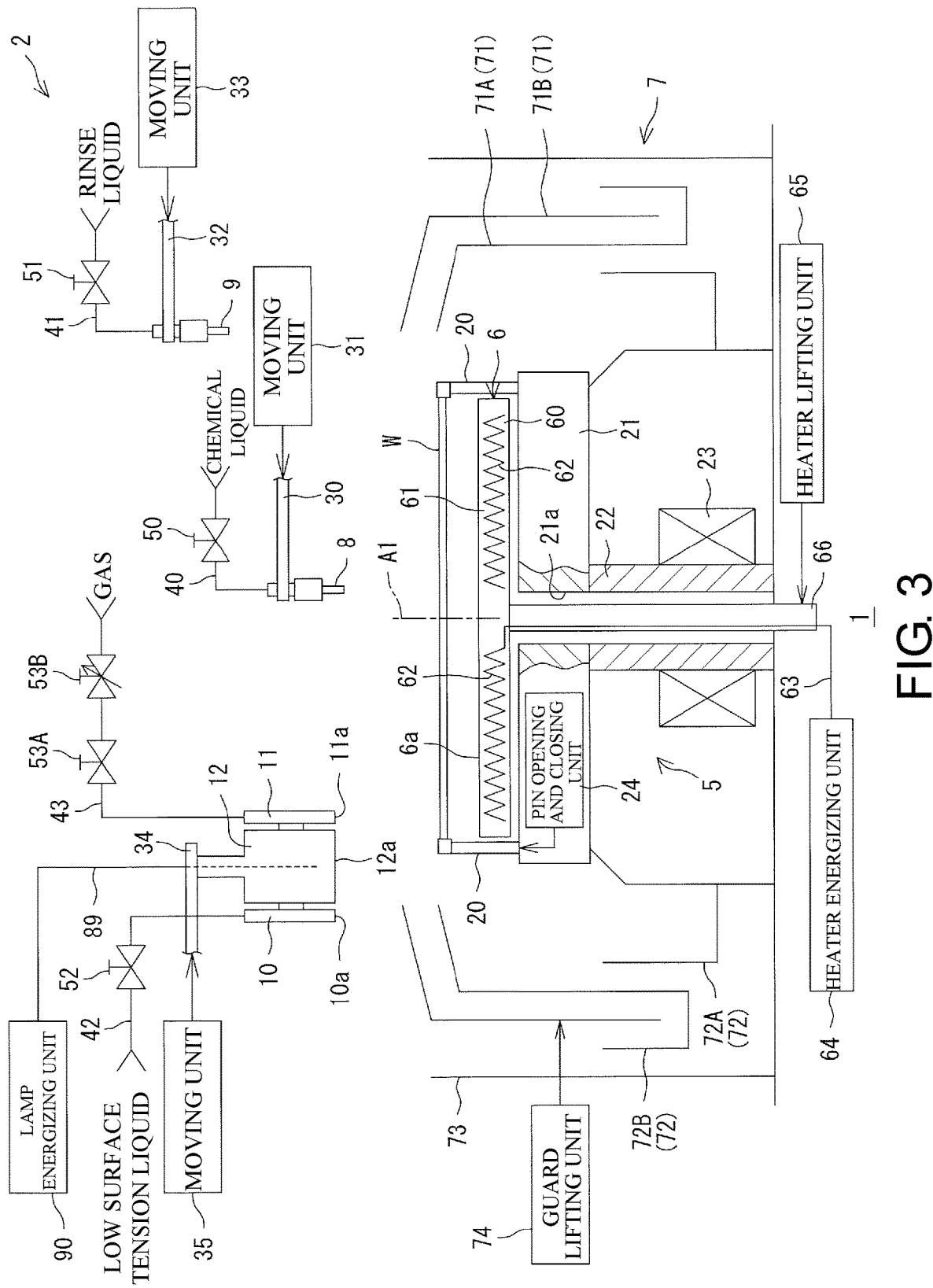
FIG. 3 is a schematic partial cross-sectional view showing a schematic configuration of a processing unit provided in the substrate processing apparatus.

FIG. 3 is a schematic view for explaining a configuration example of the processing unit 2. The processing unit 2 includes a spin chuck 5, a heater unit 6, a processing cup 7, a chemical liquid nozzle 8, a rinse liquid nozzle 9, a low surface tension liquid nozzle 10, a gas nozzle 11, and a lamp unit 12.

The spin chuck 5 rotates the substrate W around a rotation axis A1 while the substrate W is held horizontally. The rotation axis A1 passes through a center position of an upper surface of the substrate W and extends in a vertical direction. The spin chuck 5 includes a plurality of chuck pins 20, a spin base 21, a rotating shaft 22, and a spin motor 23 which applies a rotational force to the rotating shaft 22. The spin chuck 5 is an example of a substrate holding rotation unit.

The spin base 21 has a disc shape following a horizontal direction. The plurality of chuck pins 20 which holds a circumferential edge portion of the substrate W is disposed on an upper surface of the spin base 21 at intervals in a circumferential direction of the spin base 21.

The plurality of chuck pins 20 is opened and closed by a pin opening and closing unit 24. The plurality of chuck pins 20 holds the substrate W horizontally by being in a closed state due to the pin opening and closing unit 24. The plurality of chuck pins 20 releases the substrate W by being in an open state due to the pin opening and closing unit 24. The plurality of chuck pins 20 supports the substrate W from below in the open state.

The spin base 21 and the plurality of chuck pins 20 form a substrate holding unit which holds the substrate W horizontally. The substrate holding unit is also called a substrate holder.

The rotating shaft 22 extends along the rotation axis A1 in a vertical direction. An upper end portion of the rotating shaft 22 is coupled to a center of a lower surface of the spin base 21. The spin motor 23 applies a rotational force to the rotating shaft 22. The spin base 21 is rotated by the spin motor 23 rotating the rotating shaft 22. Thus, the substrate W is rotated around the rotation axis A1. The spin motor 23 is an example of a substrate rotating unit which rotates the substrate W around the rotation axis A1.

The heater unit 6 is an example of a substrate heating unit which heats the entire substrate W. The heater unit 6 has the form of a disc-shaped hot plate. The heater unit 6 is disposed between an upper surface of the spin base 21 and a lower surface of the substrate W. The heater unit 6 has a facing surface 6a which faces the lower surface of the substrate W from below.

The heater unit 6 includes a plate body 61 and a heater 62. The plate body 61 is slightly smaller than the substrate W in a plan view. An upper surface of the plate body 61 constitutes the facing surface 6a. The heater 62 may be a resistor built into the plate body 61. The facing surface 6a is heated by energizing the heater 62. The facing surface 6a is heated to, for example, 195° C. Additionally, electric power is supplied to the heater 62 from a heater energizing unit 64 via a power supply line 63.

The processing unit 2 includes a heater lifting unit 65 which lifts the heater unit 6 up and down relative to the spin base 21. The heater lifting unit 65 includes, for example, a ball screw mechanism (not shown) and an electric motor (not shown) which applies a driving force to the ball screw mechanism. The heater lifting unit 65 is also referred to as a heater lifter.

A lifting shaft 66 which extends along the rotation axis A1 in the vertical direction is coupled to a lower surface of the heater unit 6. The lifting shaft 66 is inserted through a through hole 21a formed in a center portion of the spin base 21 and the hollow rotating shaft 22. The power supply line 63 is passed through the lifting shaft 66.

The heater lifting unit 65 moves the heater unit 6 up and down via the lifting shaft 66. The heater unit 6 can be moved up and down by the heater lifting unit 65 to be located in a lower position and an upper position. The heater lifting unit 65 can be disposed not only in the lower position and the upper position but also in any position between the lower position and the upper position.

The processing cup 7 is a member which receives a liquid scattered outward from the substrate W held by the spin chuck 5 and collects or discards the liquid. The processing cup 7 includes a plurality of guards 71 which receives the liquid scattered outward from the substrate W held by the spin chuck 5, a plurality of cups 72 which receives the liquid guided downward by the plurality of guards 71, and a cylindrical outer wall member 73 which surrounds the plurality of guards 71 and the plurality of cups 72.

In this embodiment, an example in which two guards 71 (a first guard 71A and a second guard 71B) and two cups 72 (a first cup 72A and a second cup 72B) are provided is shown.

Each of the first cup 72A and the second cup 72B has the form of an annular groove which is open upward.

The first guard 71A is disposed to surround the spin base 21. The second guard 71B is disposed to surround the spin base 21 on the outer side with respect to the first guard 71A.

Each of the first guard 71A and the second guard 71B has a substantially cylindrical shape. An upper end portion of each of the guards 71 is inclined inward to face the spin base 21 side.

The first cup 72A receives the liquid guided downward by the first guard 71A. The second cup 72B is integrally formed with the first guard 71A. The second cup 72B receives the liquid guided downward by the second guard 71B.

The processing unit 2 further includes a guard lifting unit 74 which moves the first guard 71A and the second guard 71B up and down separately. The guard lifting unit 74 moves the first guard 71A up and down between the lower position and the upper position. The guard lifting unit 74 moves the second guard 71B up and down between the lower position and the upper position.

When both the first guard 71A and the second guard 71B are located in the upper position, the liquid scattered from the substrate W is received by the first guard 71A. When the first guard 71A is located in the lower position and the second guard 71B is located in the upper position, the liquid scattered from the substrate W is received by the second guard 71B.

When both the first guard 71A and the second guard 71B are located at the lower position, the transfer robot CR can load the substrate W into the chamber 4 and can unload the substrate W from the chamber 4.

The guard lifting unit 74 includes, for example, a first ball screw mechanism (not shown) coupled to the first guard 71A, a first motor (not shown) which applies a driving force to the first ball screw mechanism, a second ball screw mechanism (not shown) coupled to the second guard 71B, and a second motor (not shown) which applies a driving force to the second ball screw mechanism. The guard lifting unit 74 is an example of a guard moving unit. The guard lifting unit 74 is also referred to as a guard lifter.

The chemical liquid nozzle 8 is a nozzle which discharges a chemical liquid toward the upper surface of the substrate W. The chemical liquid nozzle 8 is connected to a chemical liquid pipe 40 which guides the chemical liquid to the chemical liquid nozzle 8. When a chemical liquid valve 50 interposed in the chemical liquid pipe 40 is opened, the chemical liquid is discharged downward in a continuous flow from a discharge port of the chemical liquid nozzle 8.

For example, a liquid containing at least one of sulfuric acid, nitric acid, hydrochloric acid, hydrofluoric acid (HF, DHF), phosphoric acid, acetic acid, ammonia water, a hydrogen peroxide solution, an organic acid (for example, citric acid, oxalic acid, or the like), an organic alkali (for example, TMAH: tetramethylammonium hydroxide, or the like), a surfactant, and a corrosion inhibitor can be used as the chemical liquid.

The chemical liquid nozzle 8 is, for example, a movable scan nozzle. The processing unit 2 further includes a first arm 30 in which the chemical liquid nozzle 8 is attached to a tip end portion thereof, and a first moving unit 31 which moves the chemical liquid nozzle 8 by moving the first arm 30.

The first moving unit 31 horizontally moves the chemical liquid nozzle 8 along a trajectory passing through a center portion of the upper surface of the substrate W in a plan view by rotating the first arm 30. The first moving unit 31 horizontally moves the chemical liquid nozzle 8 between a center position and a retracted position. When the chemical liquid nozzle 8 is located at the center position, the chemical liquid nozzle 8 faces the center portion of the upper surface of the substrate W.

The center portion of the upper surface of the substrate W is a region including a rotation center position on the upper surface of the substrate W and a position around the rotation center position on the upper surface of the substrate W.

When the chemical liquid nozzle 8 is located at the retracted position, the chemical liquid nozzle 8 retracts around the spin chuck 5 in a plan view. The first moving unit 31 includes, for example, a rotating shaft (not shown) which is connected to the first arm 30 and extends in the vertical direction, and an electric motor (not shown) which rotates the rotating shaft.

The rinse liquid nozzle 9 is a nozzle which discharges a rinse liquid for washing away the chemical liquid toward the upper surface of the substrate W. The rinse liquid nozzle 9 is connected to a rinse liquid pipe 41 which guides the rinse liquid to the rinse liquid nozzle 9. When a rinse liquid valve 51 interposed in the rinse liquid pipe 41 is opened, the rinse liquid is discharged downward in a continuous flow from a discharge port of the rinse liquid nozzle 9.

The rinse liquid is, for example, pure water (deionized water (DIW)). The rinse liquid may be any one of carbonated water, electrolytic ionized water, hydrogen water, ozone water, hydrochloric acid water having a diluted concentration (for example, about 10 ppm to 100 ppm), and ammonia water having a diluted concentration (for example, about 10 ppm to 100 ppm).

The rinse liquid nozzle 9 is, for example, a movable scan nozzle. The processing unit 2 further includes a second arm 32 in which the rinse liquid nozzle 9 is mounted on a tip end portion thereof, and a second moving unit 33 which moves the rinse liquid nozzle 9 by moving the second arm 32.

The second moving unit 33 horizontally moves the rinse liquid nozzle 9 along a trajectory passing through the center portion of the upper surface of the substrate W in a plan view by rotating the second arm 32. The second moving unit 33 horizontally moves the rinse liquid nozzle 9 between the center position and the retracted position. When the rinse liquid nozzle 9 is located at the center position, the rinse liquid nozzle 9 faces the center portion of the upper surface of the substrate W. When the rinse liquid nozzle 9 is located at the retracted position, the rinse liquid nozzle 9 retracts around the spin chuck 5 in a plan view. The second moving unit 33 includes, for example, a rotating shaft (not shown) which is connected to the second arm 32 and extends in the vertical direction, and an electric motor (not shown) which rotates the rotating shaft.

The low surface tension liquid nozzle 10 is a nozzle which discharges a low surface tension liquid having a lower surface tension than that of the rinse liquid toward the upper surface of the substrate W. The low surface tension liquid nozzle 10 is connected to a low surface tension liquid pipe 42 which guides the low surface tension liquid to the low surface tension liquid nozzle 10. When a low surface tension liquid valve 52 interposed in the low surface tension liquid pipe 42 is opened, the low surface tension liquid is discharged downward in a continuous flow from a discharge port 10*a* of the low surface tension liquid nozzle 10.

The low surface tension liquid is an organic solvent such as IPA. A surface tension of the IPA is lower than that of water. Organic solvents other than the IPA can also be used as the low surface tension liquid. In addition to IPA, for example, organic solvents such as methanol, ethanol, acetone, ethylene glycol (EG), hydrofluoroether (HFE), n-butanol, t-butanol, isobutyl alcohol and 2-butanol can also be used as the low surface tension liquid.

Not only those consisting of simple components but also organic solvents mixed with other components can be used as the low surface tension liquids. The low surface tension liquid is an example of a processing liquid, and the low surface tension liquid nozzle 10 is an example of a processing liquid supply unit.

The gas nozzle 11 is a nozzle which discharges a gas toward the upper surface of the substrate W. The gas nozzle 11 is connected to a gas pipe 43 which guides the gas to the gas nozzle 11. A gas valve 53A and a gas flow rate adjusting valve 53B are interposed in the gas pipe 43. When the gas valve 53A is opened, the gas is continuously discharged downward from a discharge port 11*a* of the gas nozzle 11 at a flow rate corresponding to an opening degree of the gas flow rate adjusting valve 53B.

The gas supplied to the gas nozzle 11 is an inert gas such as nitrogen gas. The inert gas is not limited to nitrogen gas, and rare gases such as helium gas and argon gas can be used as the inert gas.

The lamp unit 12 is a unit which heats the substrate W by radiating (emitting) light toward the upper surface of the substrate W. The lamp unit 12 is an example of a radiation unit. The lamp unit 12 irradiates the substrate W with light containing at least one of near infrared light, visible light, and ultraviolet light, and heats the substrate W by radiation. That is, the lamp unit 12 is a radiant heating heater. Electric power is supplied to the lamp unit 12 from a lamp energizing unit 90 via a power supply line 89.

The low surface tension liquid nozzle 10 and the gas nozzle 11 are mounted on the lamp unit 12. The processing unit 2 further includes a third arm 34 in which the lamp unit 12 is mounted on a tip end portion thereof, and a third moving unit 35 (moving unit) which moves the lamp unit 12 by moving the third arm 34.

The low surface tension liquid nozzle 10 and the gas nozzle 11 move together with the lamp unit 12 by moving the third arm 34. The low surface tension liquid nozzle 10 and the gas nozzle 11 are movable scan nozzles.

The third moving unit 35 horizontally moves the low surface tension liquid nozzle 10, the gas nozzle 11, and the lamp unit 12 along a trajectory passing through the center portion of the upper surface of the substrate W in a plan view by rotating the third arm 34.

The third moving unit 35 can dispose the low surface tension liquid nozzle 10, the gas nozzle 11, and the lamp unit 12 at the retracted position and the center position. The low surface tension liquid nozzle 10, the gas nozzle 11, and the lamp unit 12 retract around the spin chuck 5 in a plan view when they are located at the retracted position.

When the low surface tension liquid nozzle 10 is located at the center position, the discharge port 10a of the low surface tension liquid nozzle 10 faces the center portion of the upper surface of the substrate W. When the gas nozzle 11 is located at the center position, the discharge port 11a of the gas nozzle 11 faces the center portion of the upper surface of the substrate W. When the lamp unit 12 is located at the center position, the lamp unit 12 faces the center portion of the upper surface of the substrate W.

The third moving unit 35 includes, for example, a rotating shaft (not shown) which is connected to the third arm 34 and extends in the vertical direction, and an electric motor (not shown) which rotates the rotating shaft.

Figure 4:
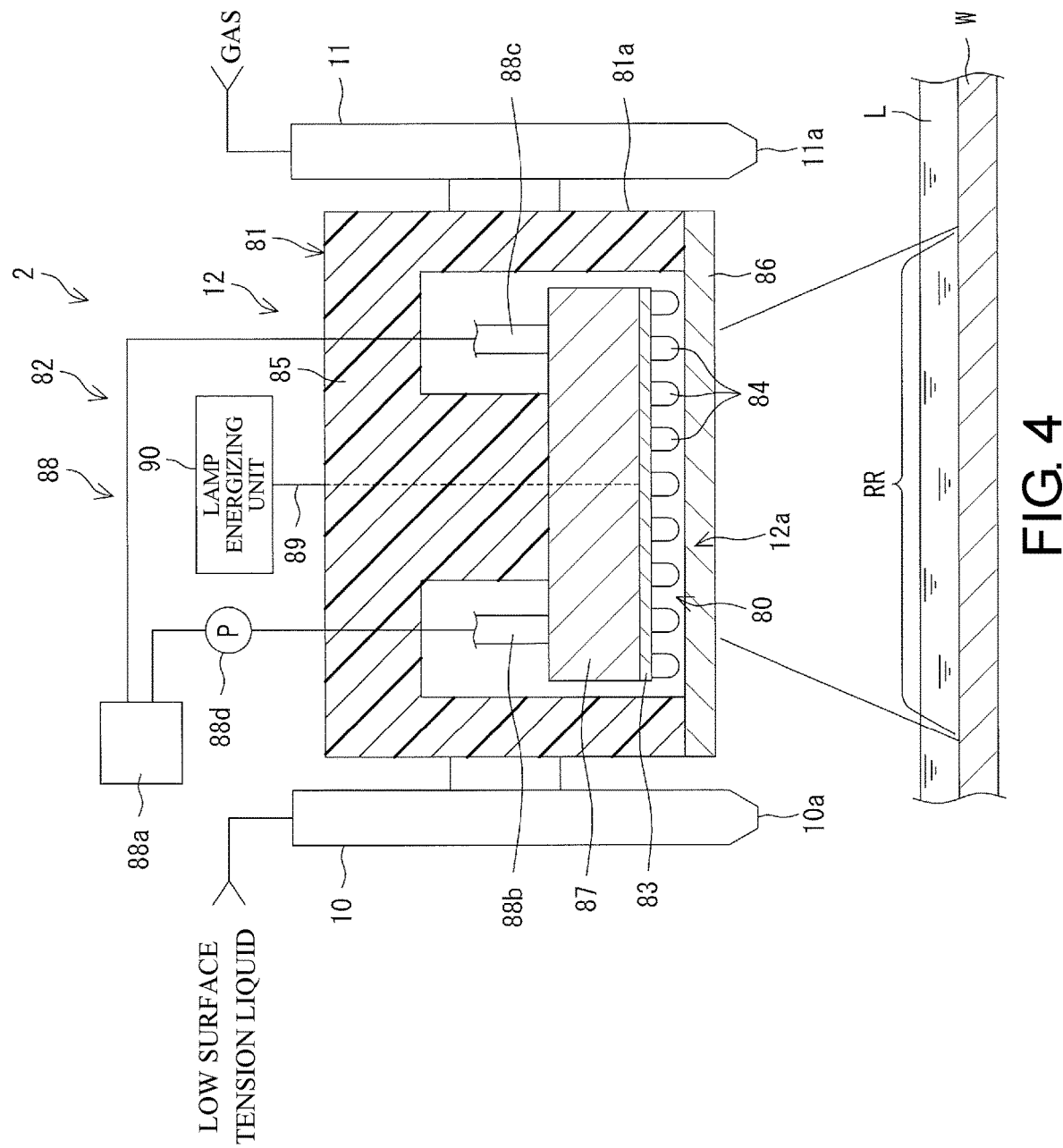
FIG. 4 is a longitudinal cross-sectional view of a lamp unit provided in the processing unit.
Figure 5:
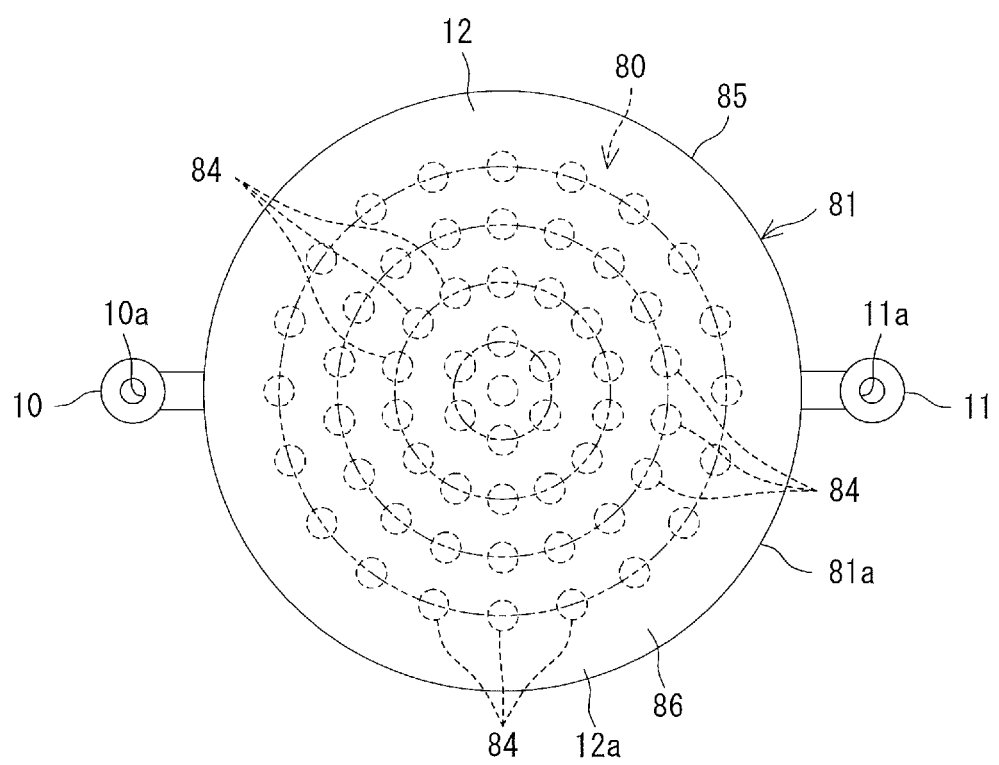
FIG. 5 is a view of the lamp unit when seen from below.

FIG. 4 is a longitudinal cross-sectional view of the lamp unit 12. FIG. 5 is a view of the lamp unit 12 when seen from below. The lamp unit 12 includes a lamp 80, a lamp housing 81 which accommodates the lamp 80, and a heat sink 82 which cools the inside of the lamp housing 81.

The lamp 80 includes a disc-shaped lamp substrate 83 and a plurality of (59 in the example of FIG. 5) light sources 84 mounted on a lower surface of the lamp substrate 83. Each of the light sources 84 is, for example, a light emitting diode (LED). The plurality of light sources 84 is turned on by electric power supplied from the lamp energizing unit 90.

As shown in FIG. 5, the plurality of light sources 84 is dispersedly disposed over the entire lower surface of the lamp substrate 83. In the example of FIG. 5, one light source 84 is disposed at the center of the lower surface of the lamp substrate 83, and the remaining 58 light sources 84 are disposed in a quadruple annular shape to surround the center of the lower surface of the lamp substrate 83. An arrangement density of the light sources 84 on the lamp substrate 83 is substantially uniform. The plurality of light sources 84 constitutes a circular light emitting part 12a which expands in the horizontal direction.

Light emitted from each of the light sources 84 includes at least one of near infrared light, visible light, and ultraviolet light. A wavelength of the light emitted from each of the light sources 84 is 200 nm or more and 1100 nm or less. The light emitted from each of the light sources 84 preferably has a wavelength of 390 nm or more and 800 nm or less.

As shown in FIG. 4, the lamp housing 81 includes a cylindrical housing body 85 and a disc-shaped bottom wall 86. The housing body 85 is made of a material having chemical resistance such as polytetrafluoroethylene (PTFE). The bottom wall 86 is made of a material allowing light transmission and having heat resistance such as quartz. The lamp housing 81 is smaller than the substrate W in a plan view. A lower surface of the bottom wall 86 constitutes a lower surface of the lamp unit 12.

The heat sink 82 includes a heat sink body 87 and a cooling unit 88 which supplies a cooling fluid to the heat sink body 87 to cool the heat sink body 87. The heat sink body 87 is formed in a container shape using a metal having excellent heat transfer characteristics (for example, aluminum, iron, copper, or the like). The cooling unit 88 includes a refrigerant supply source 88a, a refrigerant supply pipe 88b which supplies a refrigerant from the refrigerant supply source 88a to the heat sink body 87, a refrigerant return pipe 88c which returns the refrigerant supplied to the heat sink body 87 to the refrigerant supply source 88a, and a pump 88d which sends out the refrigerant in the refrigerant supply pipe 88b.

The cooling unit 88 supplies a refrigerant such as cooling water to the heat sink body 87. That is, the heat sink 82 is a water-cooled heat sink. The lamp 80 and surroundings thereof are heated when the plurality of light sources 84 emits light. However, since the inside of the lamp housing 81 is cooled by the heat sink 82, it is possible to prevent the inside of the lamp housing 81 from being excessively heated. In the heat sink 82, a cooling gas may be used as the refrigerant.

The lamp unit 12 is used in a state in which a liquid film L of a low surface tension liquid which covers the upper surface of the substrate W is formed on the upper surface of the substrate W. The low surface tension liquid nozzle 10 and the gas nozzle 11 are mounted on an outer wall surface 81a of the lamp housing 81 in the vertical direction.

As shown in FIG. 4, when the lamp 80 emits light, that is, when the plurality of light sources 84 emits light, the light (the light containing at least one of near infrared light, visible light, and ultraviolet light) emitted from the lamp 80 is transmitted through the bottom wall 86 of the lamp housing 81 and irradiates the upper surface of the substrate W.

IPA which is an example of the low surface tension liquid transmits light having a wavelength of 200 nm or more and 1100 nm or less. The wavelength of the light emitted from the lamp 80 is 200 nm or more and 1100 nm or less (more preferably, 390 nm or more and 800 nm or less). Therefore, the light emitted from the lamp 80 is not absorbed by the liquid film L and is transmitted through the liquid film L.

The light emitted from an outer surface of the lamp housing 81 (the lower surface of the bottom wall 86) is transmitted through the liquid film L and irradiates the upper surface of the substrate W. A region on the upper surface of the substrate W to which light is radiated from the lamp unit 12 is referred to as an irradiation region RR. Thus, the irradiation region RR is heated by radiation to raise a temperature thereof. The irradiation region RR coincides with a heating region heated by the light emitted from the lamp unit 12 in a plan view.

A temperature of the surface layer of the substrate W (specifically, the uneven pattern 160 shown in FIG. 2) increases due to the light emitted from the lamp unit 12. As the temperature of the surface layer of the substrate W is increased to a temperature equal to or higher than a boiling point of the low surface tension liquid by radiating light, the low surface tension liquid in contact with the irradiation region RR is warmed and evaporated. Thus, a gas phase layer of a low surface tension liquid is formed around the surface of the substrate W (the pattern surface 165 shown in FIG. 2). When the low surface tension liquid is IPA, the boiling point is 82.6° C.

The irradiation region RR moves within the upper surface of the substrate W by the third moving unit 35 moving the lamp unit 12 horizontally in a state in which the irradiation region RR is set on the upper surface of the substrate W.

Figure 6:
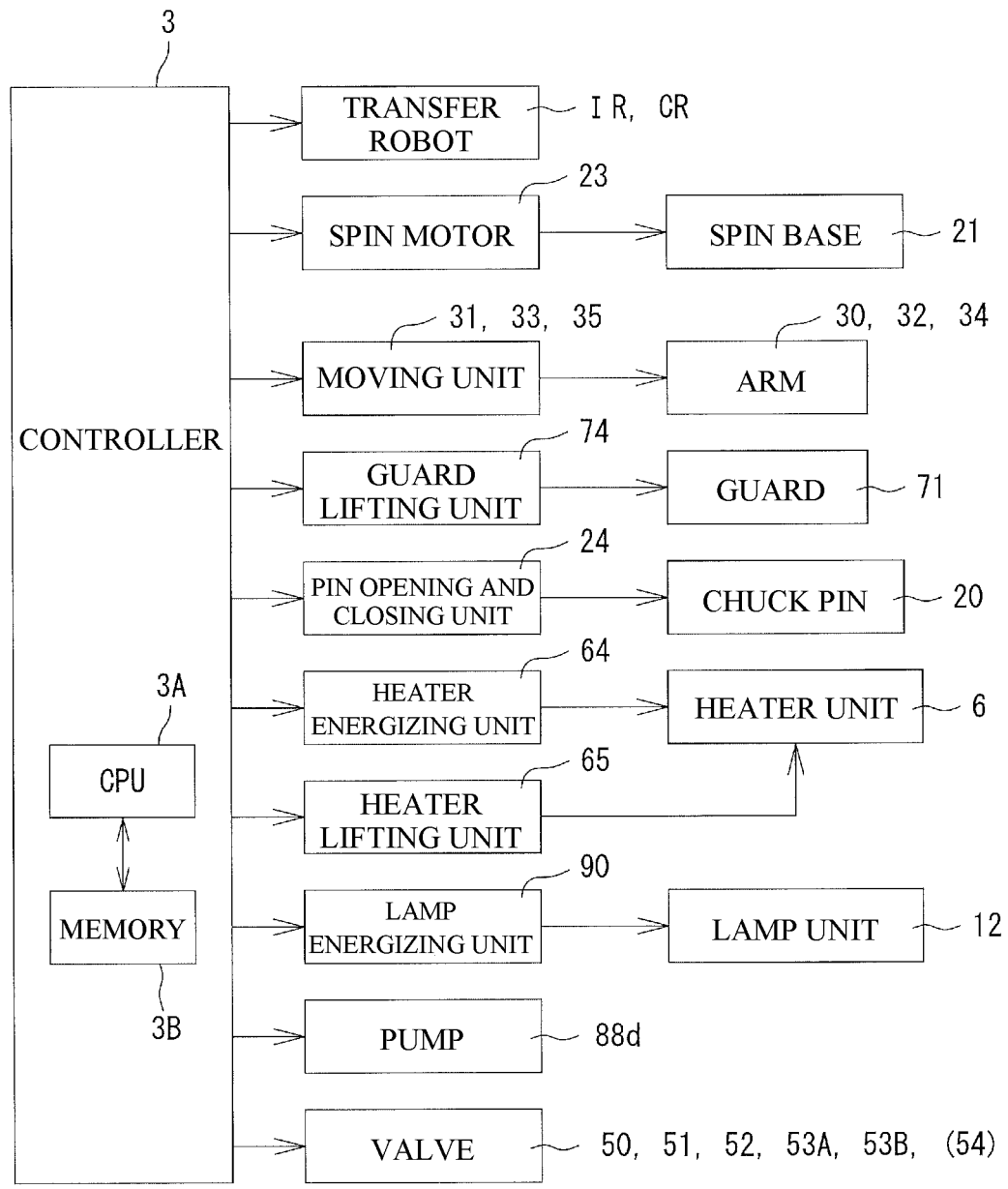
FIG. 6 is a block diagram showing an electrical configuration of a main part of the substrate processing apparatus.

FIG. 6 is a block diagram showing an electrical configuration of a main portion of the substrate processing apparatus 1. The controller 3 includes a microcomputer and controls a control target provided in the substrate processing apparatus 1 according to a predetermined control program.

Specifically, the controller 3 includes a processor (CPU) 3A and a memory 3B in which a control program is stored. The controller 3 is configured to perform various controls for substrate processing by the processor 3A executing a control program.

In particular, the controller 3 is programmed to control the transfer robots IR and CR, the spin motor 23, the first moving unit 31, the second moving unit 33, the third moving unit 35, the guard lifting unit 74, the pin opening and closing unit 24, the heater energizing unit 64, the heater lifting unit 65, the lamp energizing unit 90, the pump 88d, the chemical liquid valve 50, the rinse liquid valve 51, the low surface tension liquid valve 52, the gas valve 53A, and the gas flow rate adjusting valve 53B.

The presence or absence of liquid or gas discharging from the corresponding nozzle and a discharge flow rate of the gas from the corresponding nozzle are controlled by the controller 3 controlling the valves.

Figure 7:
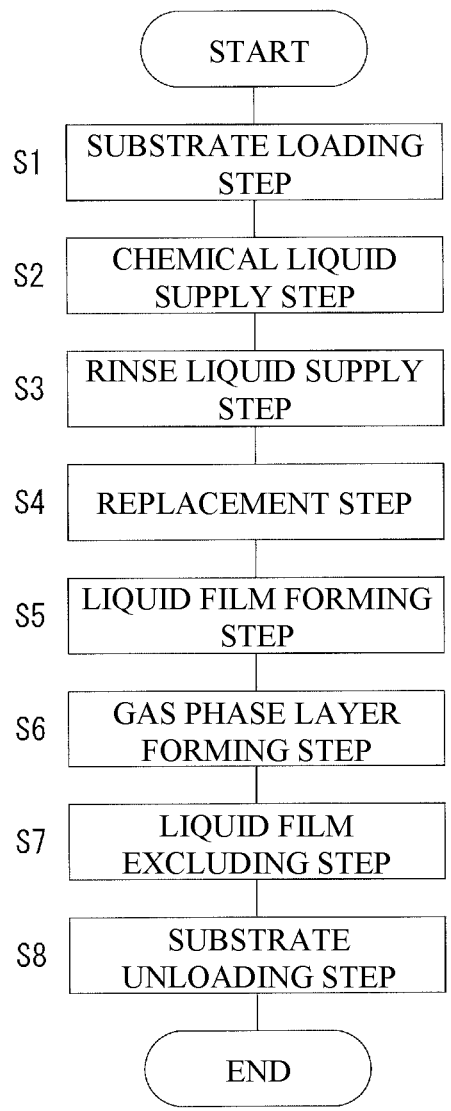
FIG. 7 is a flowchart for explaining an example of substrate processing by the substrate processing apparatus.

FIG. 7 is a flowchart for explaining an example of the substrate processing by the substrate processing apparatus 1. FIG. 7 mainly shows the processing realized by the controller 3 executing a program. FIGS. 8A to 8F are schematic views for explaining a status of the substrate processing. FIGS. 9A to 9D are schematic views for explaining a region formed on the upper surface of the substrate W during the substrate processing. In the following. FIGS. 3 and 7 will be mainly referred to, and FIGS. 8A to 9D will be referred to as appropriate.

In the substrate processing by the substrate processing apparatus 1, for example, as shown in FIG. 7, a substrate loading step (Step S1), a chemical liquid supply step (Step S2), a rinse liquid supply step (Step S3), a replacement step (Step S4), a liquid film forming step (Step S5), a gas phase layer forming step (Step S6), a liquid film excluding step (Step S7), and a substrate unloading step (Step S8) are performed.

First, an unprocessed substrate W is loaded into the processing unit 2 from the carrier CA by the transfer robot CR and delivered to the spin chuck 5 (Step S1). Thus, the substrate W is held horizontally by the spin chuck 5 (a substrate holding step). The substrate W is held in a posture in which the surface on which the uneven pattern 160 (refer to FIG. 2) is formed becomes the upper surface. When the substrate W is loaded, electric power is supplied to the heater unit 6, and the heater unit 6 is retracted to the lower position. When the substrate W is loaded, the plurality of guards 71 is retracted to the lower position. When the substrate W is loaded, electric power is not supplied to the lamp unit 12.

When the substrate W is held by the spin chuck 5, the spin motor 23 rotates the spin base 21. Thus, the horizontally held substrate W is rotated (a substrate rotating step). The holding of the substrate W by the spin chuck 5 and the rotation of the substrate W by the spin motor 23 are continued until the liquid film excluding step (Step S7) is completed. The guard lifting unit 74 adjusts height positions of the first guard 71A and the second guard 71B until the liquid film excluding step (Step S7) is completed after the start of the substrate holding step so that at least one guard 71 is located at the upper position.

Next, after the transfer robot CR is retracted to the outside of the processing unit 2, the chemical liquid supply step (Step S2) of supplying the chemical liquid to the upper surface of the substrate W is started to process the upper surface of the substrate W with the chemical liquid. Specifically, the first moving unit 31 moves the chemical liquid nozzle 8 to a chemical liquid processing position. The chemical processing position is, for example, a center position. The chemical liquid valve 50 is opened in a state in which the chemical liquid nozzle 8 is located at the chemical liquid processing position. Thus, the chemical liquid is supplied (discharged) from the chemical liquid nozzle 8 toward the center portion of the upper surface of the rotating substrate W (a chemical liquid supply step, a chemical liquid discharge step).

The chemical liquid discharged from the chemical liquid nozzle 8 lands on the center portion of the upper surface of the substrate W. A centrifugal force due to the rotation of the substrate W acts on the chemical liquid landed on the upper surface of the substrate W. Therefore, the chemical liquid evenly spreads over the entire upper surface of the substrate W by the centrifugal force, and thus the entire upper surface of the substrate W is processed by the chemical liquid.

The supply of the chemical liquid from the chemical liquid nozzle 8 is continued for a predetermined time, for example, 60 seconds. In the chemical liquid supply step, the substrate W is rotated at a predetermined chemical liquid rotation speed, for example, 1000 rpm.

After the chemical liquid processing for a predetermined time, rinse processing (Step S3) in which the upper surface of the substrate W is processed with the rinse liquid is started. Specifically, the chemical liquid valve 50 is closed, and the first moving unit 31 moves the chemical liquid nozzle 8 to the retracted position. After the movement of the chemical liquid nozzle 8 is started, the second moving unit 33 moves the rinse liquid nozzle 9 to a rinse processing position. The rinse processing position is, for example, the center position.

The rinse liquid valve 51 is opened in a state in which the rinse liquid nozzle 9 is located at the rinse processing position. Thus, the rinse liquid is supplied (discharged) from the rinse liquid nozzle 9 toward the center portion of the upper surface of the rotating substrate W (a rinse liquid supply step, a rinse liquid discharge step).

The rinse liquid discharged from the rinse liquid nozzle 9 lands on the center portion of the upper surface of the substrate W. A centrifugal force due to the rotation of the substrate W acts on the rinse liquid landed on the upper surface of the substrate W. Therefore, the rinse liquid evenly spreads over the entire upper surface of the substrate W by the centrifugal force, and thus the chemical liquid present on the upper surface of the substrate W is replaced with the rinse liquid. That is, the entire upper surface of the substrate W is processed with the rinse liquid.

The supply of the rinse liquid from the rinse liquid nozzle 9 is continued for a predetermined time, for example, 15 seconds. In the rinse liquid supply step, the substrate W is rotated at a predetermined rinse liquid rotation speed, for example, 1000 rpm.

After the rinse processing for a predetermined time, the replacement step (Step S4) of replacing the rinse liquid present on the upper surface of the substrate W with a low surface tension liquid is performed.

In the replacement step, first, the rinse liquid valve 51 is closed, and the second moving unit 33 moves the rinse liquid nozzle 9 to the retracted position. After the movement of the rinse liquid nozzle 9 is started, the third moving unit 35 moves the low surface tension liquid nozzle 10 to a low surface tension liquid processing position. The low surface tension liquid processing position is, for example, the center position.

Figure 8A:
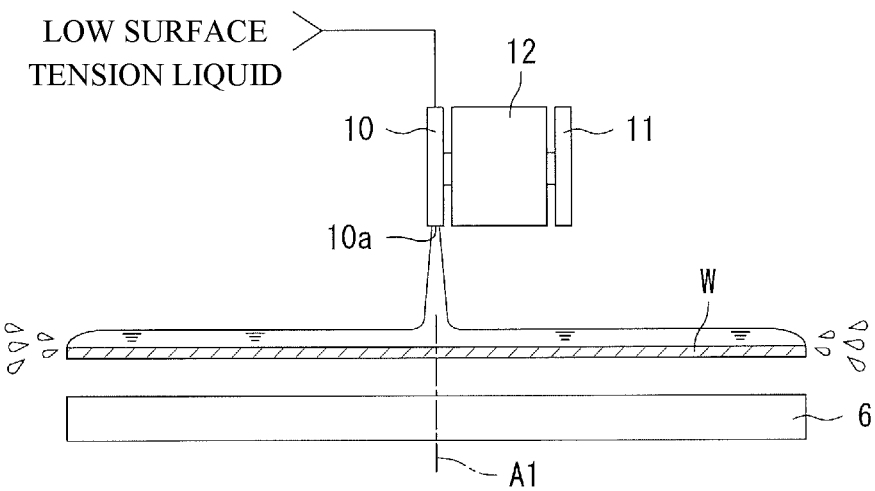
FIGS. 8A to 8F are schematic views for explaining a status of the substrate processing.

The low surface tension liquid valve 52 is opened in a state in which the low surface tension liquid nozzle 10 is located at the low surface tension liquid processing position. Thus, as shown in FIG. 8A, the supply (discharge) of the low surface tension liquid from the low surface tension liquid nozzle 10 is started, and the low surface tension liquid is supplied toward the center portion of the upper surface of the substrate W (a low surface tension liquid supply step, a low surface tension liquid discharge step).

The low surface tension liquid discharged from the low surface tension liquid nozzle 10 lands on the center portion of the upper surface of the substrate W. A centrifugal force due to the rotation of the substrate W acts on the low surface tension liquid landed on the upper surface of the substrate W. Therefore, the low surface tension liquid evenly spreads over the entire upper surface of the substrate W by the centrifugal force, thus the rinse liquid present on the upper surface of the substrate W is replaced with the low surface tension liquid, and the entire upper surface of the substrate W is covered with the low surface tension liquid.

The rotation of the substrate W is decelerated to a predetermined replacement speed at the same time as the start of the supply of the low surface tension liquid or during the supply of the low surface tension liquid (a first rotation deceleration step). The replacement speed is, for example, 300 rpm.

During the supply of the low surface tension liquid, the heater lifting unit 65 moves the heater unit 6 from the lower position to a first heating position. The first heating position is a position above the lower position and separated from the substrate W. When the heater unit 6 is located at the first heating position, the facing surface 6a of the heater unit 6 approaches the lower surface of the substrate W in a non-contact manner. The heating of the substrate W is started by disposing the heater unit 6 at the first heating position. When the heater unit 6 is located at the first heating position, a distance between the lower surface of the substrate W and the facing surface 6a of the heater unit 6 is, for example, 4 mm. In a state in which the heater unit 6 is disposed at the first heating position, the substrate W is heated to, for example, 30° C.

After the rinse liquid present on the upper surface of the substrate W is replaced with the low surface tension liquid, the liquid film forming step (Step S5) of continuing to supply the low surface tension liquid and forming a liquid film L (refer to FIG. 8B) of the low surface tension liquid on the upper surface of the substrate W is performed.

After the rinse liquid present on the upper surface of the substrate W is replaced with the low surface tension liquid, the rotation of the substrate W is decelerated to a predetermined liquid film forming speed (a second rotation deceleration step). The liquid film forming speed is greater than 0 rpm and equal to or less than 50 rpm and is, for example, 10 rpm. In the second rotation deceleration step, the rotation of the substrate W may be decelerated stepwise.

The low surface tension liquid valve 52 is closed after the rotation of the substrate W is decelerated to the liquid film forming speed. Thus, the supply of the low surface tension liquid from the low surface tension liquid nozzle 10 to the upper surface of the substrate W is stopped. The supply of the low surface tension liquid from the low surface tension liquid nozzle 10 is continued for a predetermined time, for example, 30 seconds.

Figure 8B:
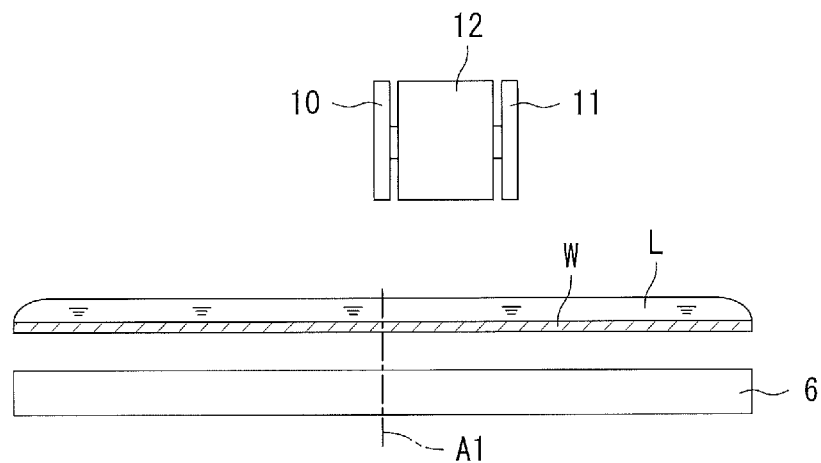

The centrifugal force acting on the low surface tension liquid on the substrate W becomes small by decelerating the rotation of the substrate W to the liquid film forming speed. Therefore, the discharge of the low surface tension liquid from the substrate W is stopped. Alternatively, only a very small amount of the low surface tension liquid is excluded from the substrate W. Therefore, even after the supply of the low surface tension liquid to the upper surface of the substrate W is stopped, the upper surface of the substrate W is maintained in a state in which it is covered with the low surface tension liquid. As shown in FIG. 8B, the low surface tension liquid on the substrate W is sufficiently thickened, and the liquid film L in a paddle state is formed by stopping the supply of the low surface tension liquid in a state in which the rotation of the substrate W is decelerated to the liquid film forming speed (a liquid film forming step, a paddle forming step).

Even when a small amount of the rinse liquid remains in a concave portion 162 of the uneven pattern 160 after the rinse liquid is replaced with the low surface tension liquid (refer to FIG. 2), the rinse liquid is dissolved in the low surface tension liquid and is diffused into the liquid film L. Thus, the rinse liquid remaining in the concave portion 162 of the uneven pattern 160 can be reduced.

After the liquid film L is formed on the upper surface of the substrate W, the gas phase layer forming step (Step S6) of heating the substrate W by radiating light from the lamp unit 12 to form a gas phase layer VL (refer to an enlarged view of FIG. 8C) at the center portion of the upper surface of the substrate W is performed.

Figure 8C:
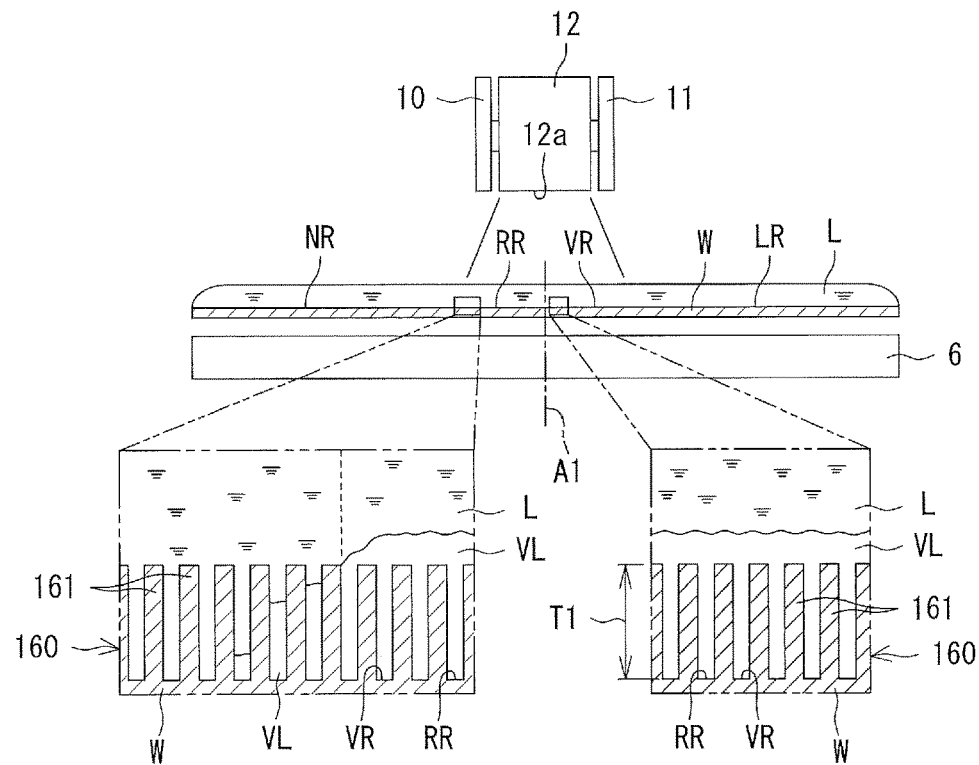

As shown in FIG. 8C, the heater lifting unit 65 moves the heater unit 6 upward and disposes it at a second heating position in a state in which the liquid film L is formed on the upper surface of the substrate W. The second heating position is a position above the first heating position and separated from the substrate W. When the heater unit 6 is located at the second heating position, the facing surface 6a of the heater unit 6 approaches the lower surface of the substrate W in a non-contact manner. When the heater unit 6 is located at the second heating position, the distance between the lower surface of the substrate W and the facing surface 6a of the heater unit 6 is, for example, 2 mm.

The entire substrate W is heated to a temperature higher than room temperature (for example, 25° C.) and lower than the boiling point of the low surface tension liquid by disposing the heater unit 6 at the second heating position (a heater heating step). Therefore, the liquid film L is maintained at a temperature higher than room temperature (for example, 25° C.) and lower than the boiling point of the low surface tension liquid (a liquid film heat retaining step). The substrate W is heated to a higher temperature when the heater unit 6 is located at the second heating position than when the heater unit 6 is located at the first heating position. When the facing surface 6a of the heater unit 6 is heated to 195° C. in a state in which the heater unit 6 is disposed at the second heating position, the substrate W is heated to 40° C.

In a state in which the liquid film L is formed on the upper surface of the substrate W, the third moving unit 35 moves the lamp unit 12 in the horizontal direction and disposes it at a light radiation position. The light radiation position is, for example, the center position. Further, the third moving unit 35 moves the lamp unit 12 in the vertical direction so that the height position of the lamp unit 12 becomes a separation position. When the lamp unit 12 is located at the separation position, the distance between the lower surface of the lamp unit 12 and the upper surface of the substrate W is, for example, 50 mm.

The lamp energizing unit 90 energizes the lamp unit 12 in a state in which the height position of the lamp unit 12 is the separation position. Thus, the radiation of light from the lamp unit 12 is started (a light radiation step). The radiation of light is started while the liquid film heat retaining step is performed. The radiation of light is started immediately after the liquid film L in the paddle state is formed (for example, after 1.5 seconds).

The light emitted from the lamp unit 12 is not absorbed by the liquid film L, and is transmitted through the liquid film L and is radiated to the irradiation region RR set on the center portion of the upper surface of the substrate W. Thus, the center portion of the upper surface of the substrate W is heated by radiation. Accordingly, the low surface tension liquid in contact with the irradiation region RR is warmed.

When a temperature of the irradiation region RR (that is, a temperature of the uneven pattern 160 in the irradiation region RR) is equal to or higher than the boiling point of the low surface tension liquid, the low surface tension liquid is evaporated at an interface between the liquid film L and the substrate W. The gas phase layer VL of the low surface tension liquid (refer to the enlarged view of FIG. 8C) is formed between the liquid film L and the substrate W by evaporating the low surface tension liquid in contact with the uneven pattern 160 in the irradiation region RR. Thus, in the irradiation region RR, the liquid film L is held by the gas phase layer VL and floats from the upper surface of the substrate W.

When the temperature of the surface layer of the substrate W in the irradiation region RR is being heated to a gas phase formation temperature equal to or higher than the boiling point of the low surface tension liquid, a gas phase layer VL having a sufficient thickness is formed in the irradiation region RR. When the low surface tension liquid is IPA, the boiling point is 82.6° C. and the gas phase layer formation temperature is, for example, 100° ° C. The "sufficient thickness" is a thickness larger than the pattern height T1. When the gas phase layer having a sufficient thickness is formed, the liquid film L can be maintained at a sufficient height position by the gas phase layer. The "sufficient height position" is a position at which an interface between the liquid film L and the gas phase layer VL is located above the tip end surface 161*b* (refer to also FIG. 2) of the structure 161 of the uneven pattern 160.

A region on the upper surface of the substrate W in which the liquid film L is formed is referred to as a liquid film forming region LR. A region on the upper surface of the substrate W which is in contact with the gas phase layer VL having a sufficient thickness is referred to as a gas phase layer forming region VR.

Figure 9A:
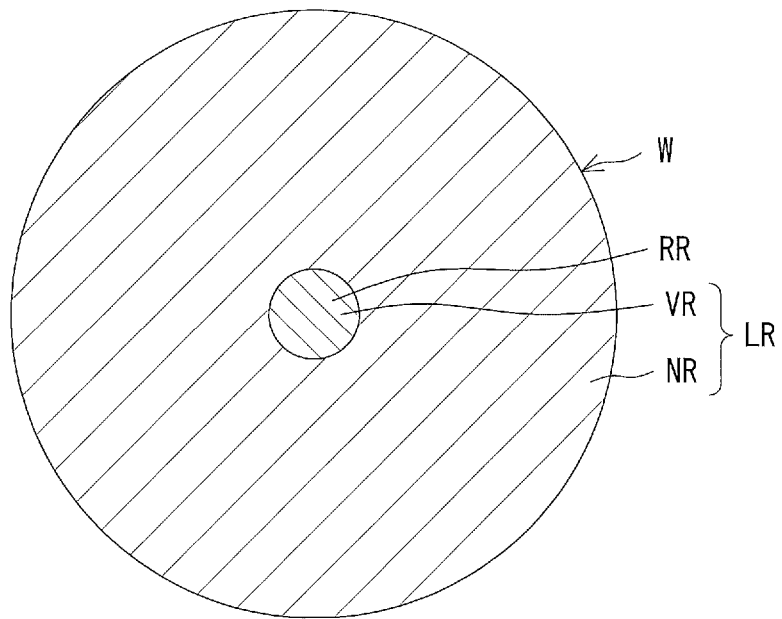
FIGS. 9A to 9D are schematic views for explaining a region formed on an upper surface of the substrate during the substrate processing.

In a state in which the gas phase layer VL having a sufficient thickness is formed, frictional resistance acting on the liquid film L on the substrate W is small enough that it can be regarded as zero. As shown in FIG. 9A, the gas phase layer forming region VR is a substantially circular region which covers the center portion of the upper surface of the substrate W. The gas phase layer forming region VR substantially coincides with the irradiation region RR. The liquid film forming region LR includes the gas phase layer forming region VR and a region on the upper surface of the substrate W outside the gas phase layer forming region VR.

When the irradiation region RR is located at the center portion of the upper surface of the substrate W, a non-irradiation region NR outside the irradiation region RR on the upper surface of the substrate W does not reach the heating temperature. Therefore, the gas phase layer VL is not formed at all, or an amount of the gas phase layer VL formed is insufficient, and the gas phase layer VL cannot be maintained in a sufficient thickness. Therefore, the gas phase layer forming region VR is not formed in the non-irradiation region NR on the upper surface of the substrate W.

After the gas phase layer forming region VR is formed, a liquid film excluding step of excluding the liquid film L from the upper surface of the substrate W while maintaining the state in which the gas phase layer forming region VR is formed is performed (Step S7).

Specifically, even after the gas phase layer forming region VR is formed, the irradiation region RR is maintained on the center portion of the upper surface of the substrate W by disposing the lamp unit 12 at the light radiation position. Therefore, even after the gas phase layer forming region VR is formed, the heating of the center portion of the upper surface of the substrate W by the lamp unit 12 is maintained. Evaporation of the processing liquid held in the gas phase layer VL at the center portion of the upper surface of the substrate W is promoted by maintaining the heating of the center portion of the upper surface of the substrate W.

Further, a large temperature difference is generated between the irradiation region RR and the non-irradiation region NR on the upper surface of the substrate W by maintaining the heating of the center portion of the upper surface of the substrate W. Due to such a temperature difference, heat convection flowing from the center portion to a circumferential edge portion is formed on the upper surface of the substrate W. Since the substrate W is rotating, a centrifugal force acts on the liquid film L.

Figure 8D:
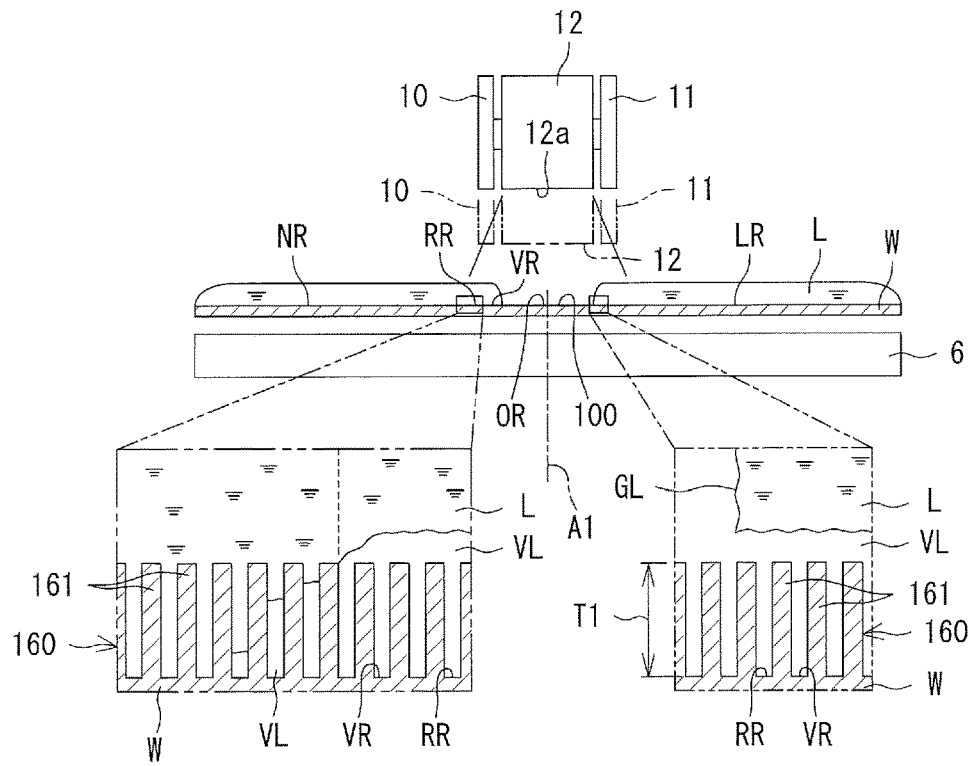

Since a rotation speed of the substrate W is a paddle speed, the centrifugal force applied to the liquid film L is relatively weak. Further, the heat convection generated on the upper surface of the substrate W is also relatively weak. However, as described above, the frictional resistance acting on the liquid film L in the gas phase layer forming region VR is small enough that it can be regarded as zero. Therefore, the low surface tension liquid is pushed outward by these centrifugal forces and heat convection. Thus, a thickness of a center portion of the liquid film L is reduced, and as shown in FIG. 8D, a substantially circular opening 100 is formed in the center portion of the liquid film L. The opening 100 is an exposing hole which exposes the upper surface of the substrate W.

Figure 9B:
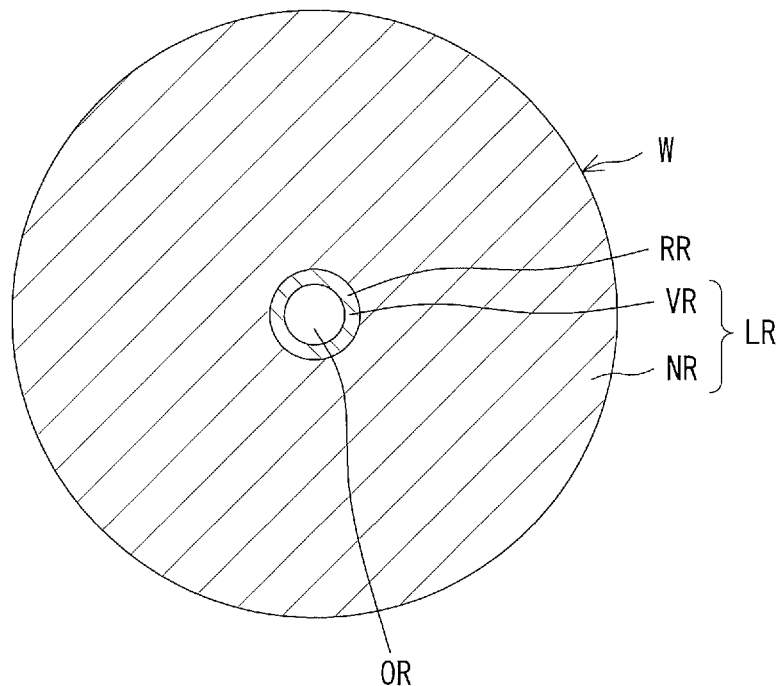

As the liquid film L is partially removed by the formation of the opening 100, as shown in FIG. 9B, the gas phase layer forming region VR has an annular shape. The irradiation region RR has a circular shape. As shown in the enlarged view of FIG. 8D, a gas-liquid interface GL is formed between the liquid film L of the gas phase layer forming region VR and the opening 100, that is, on an inner circumferential edge of the liquid film L of the gas phase layer forming region VR by forming the opening 100.

In this way, as shown in the enlarged view of FIG. 8D, due to the evaporation of the processing liquid, the generation of heat convection, and the action of the centrifugal force, the low surface tension liquid held by the gas phase layer VL is excluded, and the opening 100 is rapidly formed in the center portion of the liquid film L (an opening forming step). The liquid film L has an annular shape due to the formation of the opening 100. As shown in FIG. 9B, the liquid film forming region LR also has an annular shape due to the formation of the opening 100.

Even after the gas phase layer VL is formed, the heating of the substrate W by the heater unit 6 is continued, and the entire liquid film L is kept warm (a liquid film heat retaining step). Therefore, it is possible to curb disappearance of the gas phase layer VL when the opening 100 is formed.

Figure 8E:
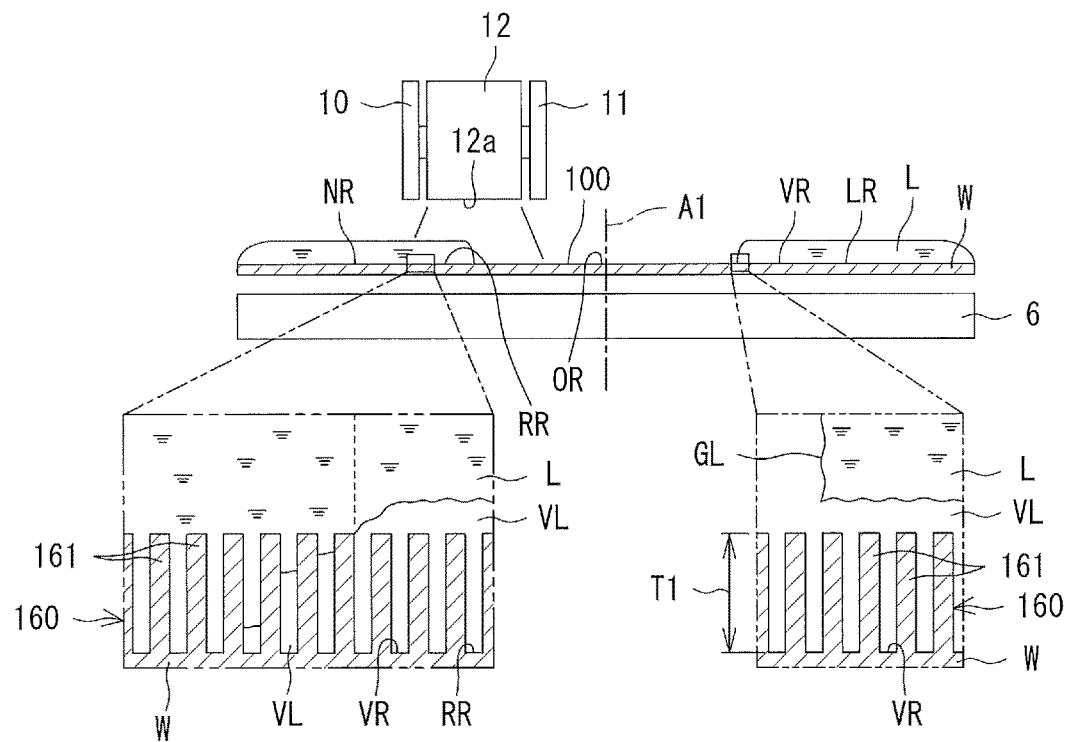

The substrate W is heated by the heater unit 6 and the lamp unit 12 even after the opening 100 is formed in the liquid film L. Since the low surface tension liquid is not present in a region (an opening forming region OR) on the upper surface of the substrate W in which the opening 100 is formed, the temperature of the substrate W is rapidly increased by the heater unit 6 and the lamp unit 12. Thus, a temperature difference occurs at the inside of the inner circumferential edge of the liquid film L (the opening forming region OR) and the outside of the inner circumferential edge of the liquid film L (the liquid film forming region LR). Specifically, the temperature of the substrate W is high in the opening forming region OR, and the temperature of the substrate W is low in the liquid film forming region LR. Due to such a temperature difference, the generation of heat convection continues near the inner circumferential edge of the liquid film L. Further, since the substrate W is rotating, a centrifugal force acts on the liquid film L. Therefore, as shown in FIGS. 8D and 8E, the opening 100 is expanded by the action of centrifugal force and the generation of heat convection (an opening expanding step).

After the opening 100 is formed, as shown by an alternate long and two short dashes line in FIG. 8D, the third moving unit 35 changes the height position of the lamp unit 12 to a proximity position closer to the upper surface of the substrate W than the separation position (a radiation unit proximity step). Thus, the temperature of the opening forming region OR on the upper surface of the substrate W can be rapidly increased. When the lamp unit 12 is located at the proximity position, the distance between the lower surface of the lamp unit 12 and the upper surface of the substrate W is, for example, 4 mm.

When the expansion of the opening 100 is started, the third moving unit 35 moves the low surface tension liquid nozzle 10, the gas nozzle 11, and the lamp unit 12 toward the circumferential edge portion of the substrate W while the height position of the lamp unit 12 is maintained at the proximity position (a proximity movement step). At this time, the low surface tension liquid nozzle 10, the gas nozzle 11 and the lamp unit 12 are moved so that the gas nozzle 11 is located inside the substrate W with respect to the lamp unit 12, that is, the gas nozzle 11 faces the opening forming region OR. As the lamp unit 12 moves toward the circumferential edge portion of the upper surface of the substrate W, the irradiation region RR moves toward the circumferential edge portion of the upper surface of the substrate W.

Figure 9C:
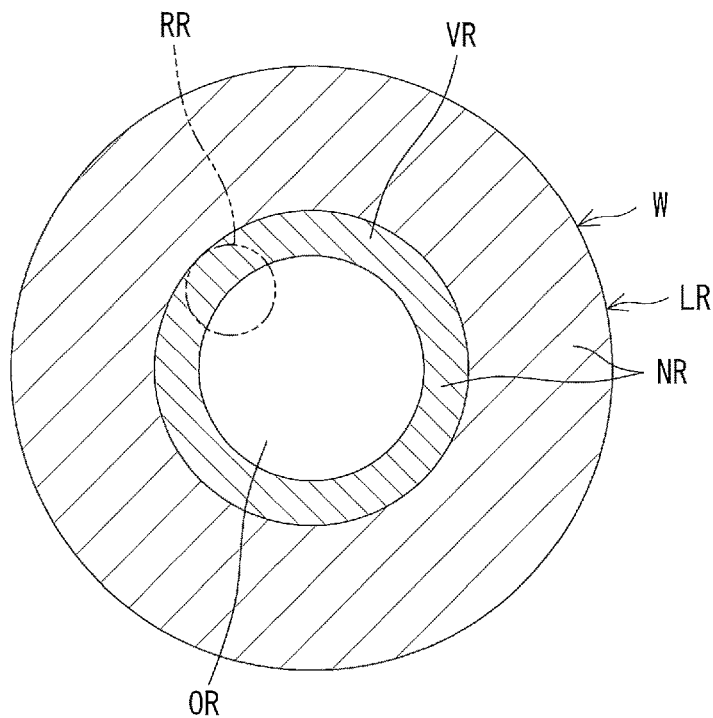

The substrate W is rotated even while the opening 100 is being expanded. Therefore, the irradiation region RR moves relative to the upstream side in a rotation direction of the substrate W. Thus, the entire inner circumferential edge of the liquid film L is heated, and the gas phase layer VL having a sufficient thickness is formed on the entire inner circumferential edge of the liquid film L. That is, as shown in FIG. 9C, the gas phase layer forming region VR becomes an annular shape while the opening 100 is being expanded. During the expansion of the opening 100, the gas phase layer VL is also formed in the non-irradiation region NR.

In this way, in the opening expanding step, the irradiation region RR is moved toward the circumferential edge portion of the upper surface of the substrate W while the substrate W is rotated. Therefore, the opening 100 is expanded while the state in which the gas phase layer VL is formed on the inner circumferential edge of the liquid film L is maintained.

As shown in FIG. 9C, the irradiation region RR is moved according to the expansion of the opening 100 to be disposed to straddle the liquid film forming region LR and the opening forming region OR. Therefore, the inner circumferential edge of the liquid film L can be heated with a sufficient amount of heat. Therefore, it is possible to curb occurrence of a situation in which the gas phase layer VL is not formed on the inner circumferential edge of the liquid film L due to the insufficient amount of heat, or a situation in which the temporarily formed gas phase layer VL disappears and the low surface tension liquid comes into contact with the upper surface of the substrate W. That is, the gas phase layer VL can be stably formed on the inner circumferential edge of the liquid film L.

Figure 8F:
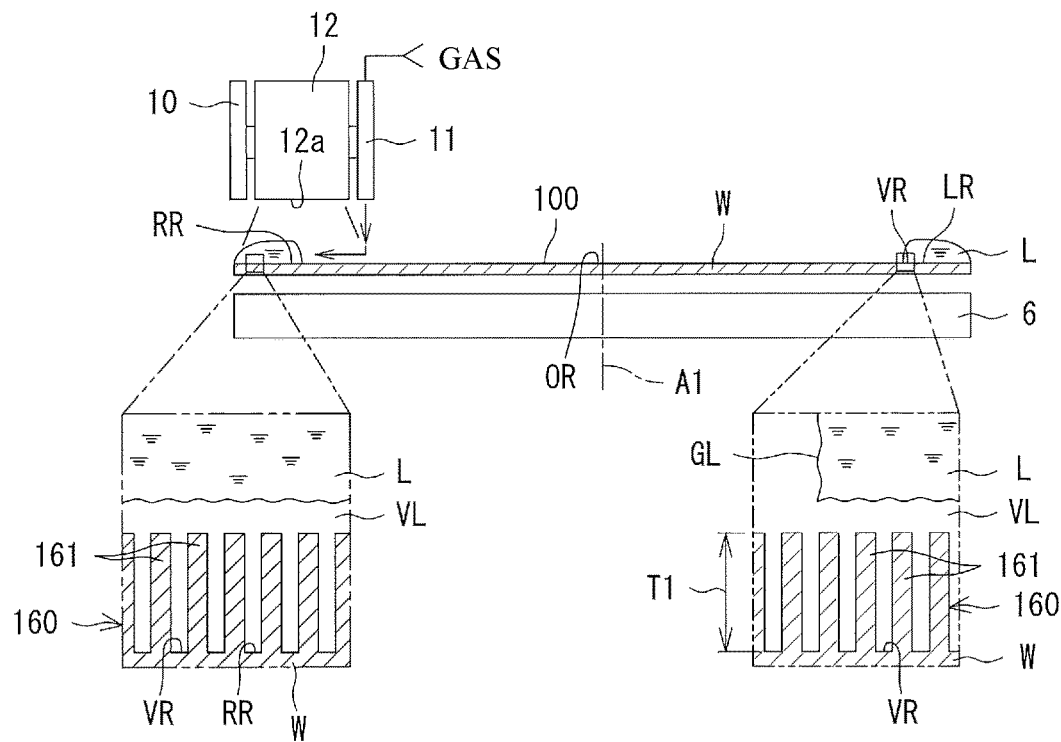
Figure 9D:
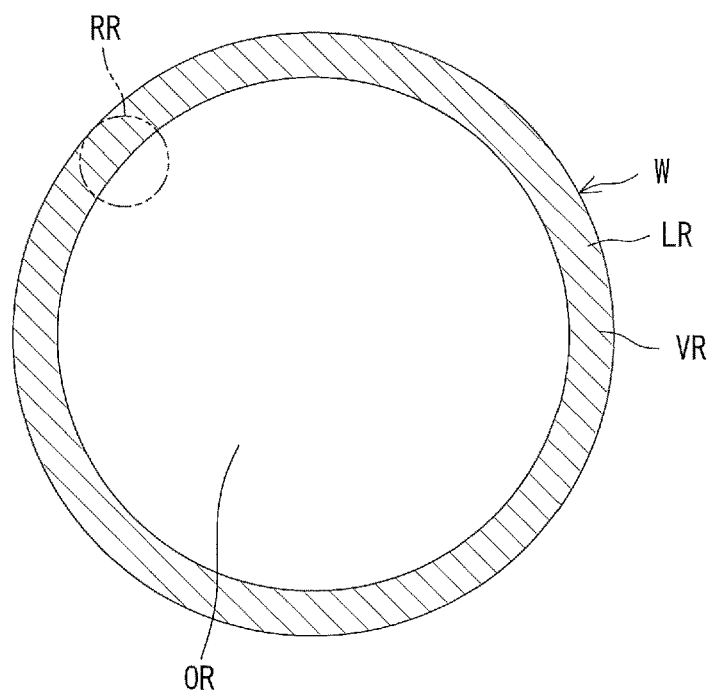

Although the opening 100 can be expanded to some extent by the movement of the low surface tension liquid due to the heat convection, when an outer circumferential edge of the opening 100 reaches the circumferential edge portion of the upper surface of the substrate W as shown in FIGS. 8F and 9D, the movement of the low surface tension liquid may stop.

More specifically, in a state in which the outer circumferential edge of the opening 100 reaches the circumferential edge portion of the upper surface of the substrate W, since the total amount of the processing liquid on the substrate W is small, a temperature difference between the substrate W inside the opening 100 and the substrate W outside the opening 100 becomes small. Therefore, the low surface tension liquid is in an equilibrium state in which the low surface tension liquid repeatedly moves to the inside and the outside of the substrate W. In this case, when the low surface tension liquid returns to the inside of the substrate W, the low surface tension liquid may come into direct contact with the upper surface of the substrate W on which the gas phase layer VL has disappeared. Therefore, there is a possibility that collapse of the pattern due to a surface tension of the low surface tension liquid or particles due to poor drying may be generated.

When the opening 100 is expanded, the substrate W is rotating. Therefore, the equilibrium state can be released when the centrifugal force acting on the liquid film L is sufficiently large. However, when the centrifugal force is not sufficiently large, the equilibrium state cannot be released. In particular, the equilibrium state may not be released at a low rotation speed of about 10 rpm.

Therefore, when the inner circumferential edge of the liquid film L reaches the circumferential edge portion of the upper surface of the substrate W, the gas valve 53A is opened. Thus, as shown in FIG. 8F, a gas is sprayed toward the opening forming region OR. The gas which collides with the upper surface of the substrate W flows along the upper surface of the substrate W and pushes the low surface tension liquid to the outside of the substrate W to promote the expansion of the opening 100 (an expansion promoting step). Thus, the low surface tension liquid is excluded from the upper surface of the substrate W without stopping. It is possible to curb or prevent the collapse of the pattern and the generation of particles.

The liquid film L is finally completely excluded from the upper surface of the substrate W by the expansion of the opening 100. After that, the supply of electric power from the lamp energizing unit 90 to the lamp unit 12 is stopped, and the gas valve 53A is closed. Then, the third moving unit 35 moves the low surface tension liquid nozzle 10, the gas nozzle 11, and the lamp unit 12 to the retracted position.

Then, the spin motor 23 stops the rotation of the substrate W. The guard lifting unit 74 moves the first guard 71A and the second guard 71B to the lower position. Then, the heater lifting unit 65 moves the heater unit 6 to the lower position.

The transfer robot CR enters the processing unit 2, scoops the processed substrate W from the chuck pin 20 of the spin chuck 5, and unloads it out of the processing unit 2 (Step S8). The substrate W is passed from the transfer robot CR to the transfer robot IR, and is accommodated in the carrier CA by the transfer robot IR.

According to the first embodiment, the irradiation region RR set on the center portion of the upper surface of the substrate W is irradiated with light to heat the center portion of the upper surface of the substrate W. Thus, the low surface tension liquid in contact with the center portion of the upper surface of the substrate W is evaporated, and the gas phase layer VL is formed on the center portion of the upper surface of the substrate W. The liquid film L floats from the center portion of the upper surface of the substrate W by forming the gas phase layer VL. The opening 100 is formed in the center portion of the liquid film L by excluding the low surface tension liquid held by the gas phase layer VL formed on the center portion of the upper surface of the substrate W.

After the opening 100 is formed, the opening 100 is expanded while the state in which the gas phase layer VL is formed on the inner circumferential edge of the liquid film L is maintained by moving the irradiation region RR toward the circumferential edge portion of the upper surface of the substrate W while the substrate W is rotated. In other words, when the liquid film L is excluded from the upper surface of the substrate W, the annular region (the gas phase layer forming region VR) on which the gas phase layer VL is formed moves toward the circumferential edge portion of the upper surface of the substrate W as the opening 100 expands. The gas phase layer forming region VR moves on the substrate W so that an inner circumferential edge and an outer circumferential edge thereof become large.

As a method of forming and expanding the opening 100 in the liquid film L to exclude the liquid film L from the upper surface of the substrate W, unlike the embodiment, a method of excluding the liquid film L from the substrate W in a state in which the heater unit 6 is in contact with the lower surface of the substrate W, or a method of excluding the liquid film L from the substrate W while the entire upper surface of the substrate W is heated by a lamp unit (a lamp unit different from that of the first embodiment) which faces the entire upper surface of the substrate W can be assumed. When these methods are adopted, it is necessary to maintain the state in which the gas phase layer VL is formed for a long period of time from the start to the end of the exclusion of the liquid film L at a position on the upper surface of the substrate W at which the liquid film L is removed lastly.

On the other hand, in the first embodiment, the annular gas phase layer forming region VR is expanded together with the opening 100. Therefore, the time from the formation of the gas phase layer VL to the exclusion of the low surface tension liquid held by the gas phase layer VL can be shortened at an arbitrary position on the upper surface of the substrate W, as compared with a method in which the liquid film L held in the gas phase layer VL is excluded after the gas phase layer VL is formed over the entire upper surface of the substrate W. Thus, it is possible to curb excessive (long-term) heating of the entire substrate W during the formation and expansion of the opening 100. Therefore, it is possible to curb local evaporation of the low surface tension liquid and thus splitting of the liquid film L.

As the heating time for maintaining the gas phase layer VL becomes longer, the possibility that the gas phase layer VL disappears due to a local decrease in the temperature of the liquid film L or the substrate W increases. Therefore, in the first embodiment, the time from the formation of the gas phase layer VL to the exclusion of the low surface tension liquid held by the gas phase layer VL is shortened at the arbitrary position on the upper surface of the substrate W. Therefore, the collapse of the pattern due to the heating for maintaining the gas phase layer VL for a long period of time can be curbed.

Further, the formation and expansion of the opening 100 is performed while the low surface tension liquid is kept warm by the heater unit 6. Therefore, the gas phase layer VL can be rapidly formed in the irradiation region RR. Further, it is possible to curb a temperature drop of the substrate W in the non-irradiation region NR (particularly, the region opposite to the irradiation region RR with respect to a rotation center position of the upper surface of the substrate W). Therefore, it is possible to curb the movement of the formed gas phase layer VL to the outside of the irradiation region RR (the downstream side in the rotation direction with respect to the irradiation region RR) and the disappearance thereof.

As described above, the low surface tension liquid can be satisfactorily excluded from the upper surface of the substrate W. As a result, it is possible to curb the collapse of the pattern due to the surface tension of the low surface tension liquid and the generation of particles due to poor drying.

Further, according to the first embodiment, in the liquid film heat retaining step, the substrate W is heated by the heater unit 6 disposed at a position (the second heating position) separated from the lower surface of the substrate W. Therefore, regardless of the configuration of the heater unit 6, that is, even in the case of a configuration in which the heater unit 6 cannot rotate together with the substrate, the substrate W can be easily rotated when the opening 100 is expanded. Further, as compared with a configuration in which the heater unit 6 is brought into contact with the substrate W, the entire substrate W can be appropriately heated. Further, it is possible to curb transferring of dirt adhering to the heater unit 6 to the substrate W. Further, since it is not necessary to accurately adjust parallelism between the facing surface 6a and the lower surface of the substrate W as in the configuration in which the heater unit 6 is brought into contact with the substrate W, the substrate processing apparatus 1 can be avoided from being complicated.

Further, the opening forming region OR may be cooled by spaying a gas onto the opening forming region OR on the upper surface of the substrate W during the expansion of the opening 100. When the opening forming region OR is cooled, the temperature difference between the liquid film forming region LR and the opening forming region OR on the upper surface of the substrate W may be insufficient, and the heat convection may not be sufficiently formed in the liquid film L. This may hinder the expansion of the opening 100. Therefore, in the first embodiment, in the opening expanding step, the gas is not sprayed onto the upper surface of the substrate W until the inner circumferential edge of the liquid film L reaches the circumferential edge portion of the upper surface of the substrate W. Therefore, it is possible to avoid cooling of the opening forming region OR on the upper surface of the substrate W due to the spraying of a gas.

Second Embodiment

Figure 10:
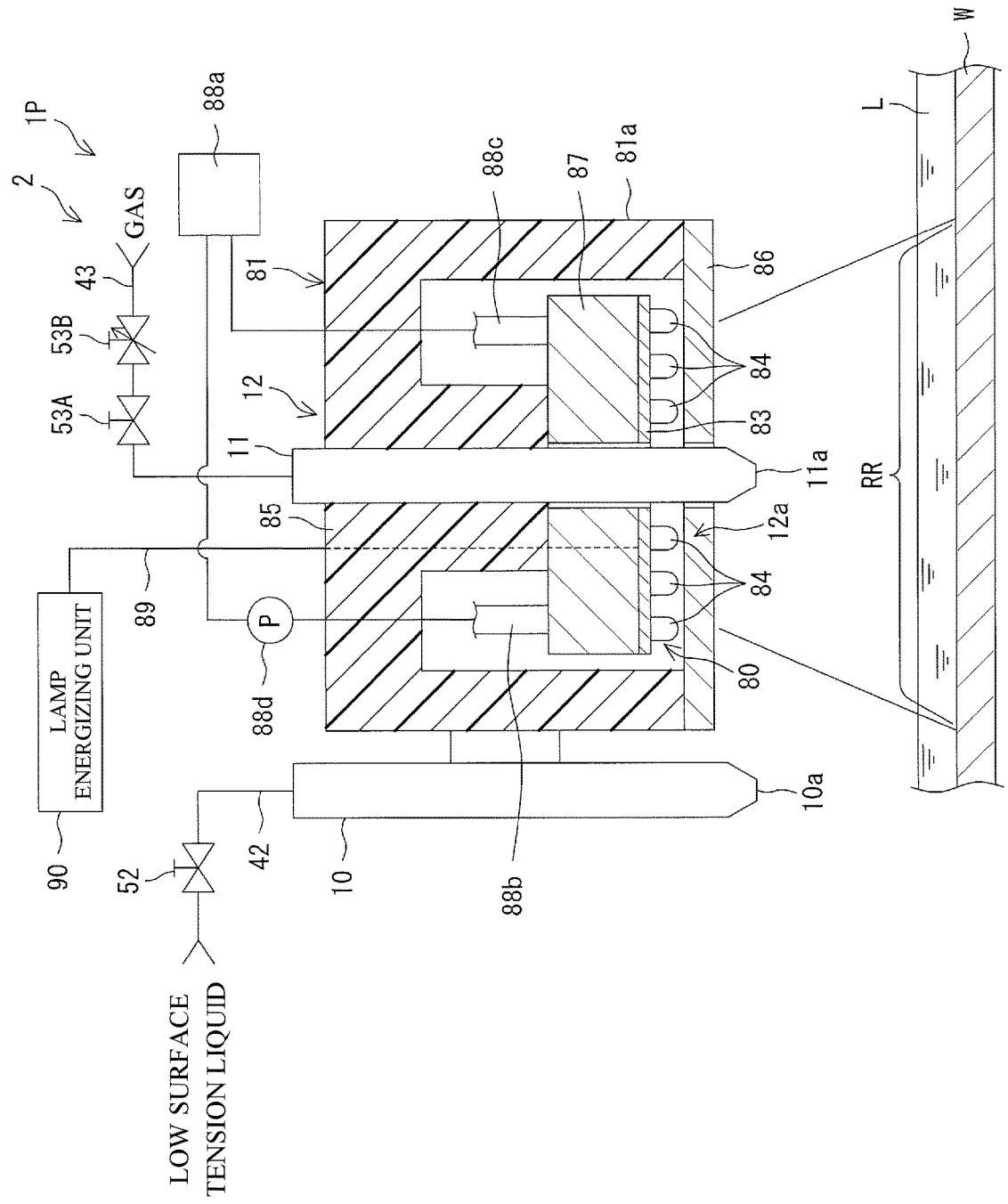
FIG. 10 is a longitudinal cross-sectional view of a radiation unit provided in a substrate processing apparatus according to a second embodiment of the disclosure.
Figure 11:
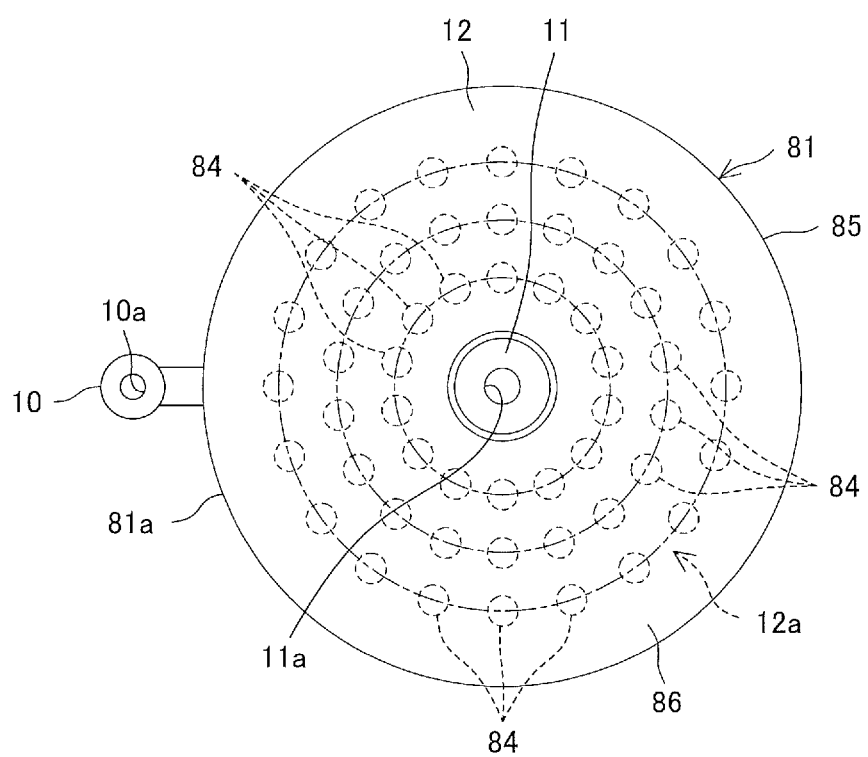
FIG. 11 is a view of the radiation unit provided in the substrate processing apparatus according to the second embodiment when seen from below.

FIG. 10 is a longitudinal cross-sectional view of the lamp unit 12 provided in a substrate processing apparatus 1P according to a second embodiment. FIG. 11 is a view of the lamp unit 12 provided in the substrate processing apparatus 1P when seen from below. In FIGS. 10 and 11, the same reference numerals as those in FIG. 1 and the like are provided to the same components as those shown in FIGS. 1 to 9D, and the description thereof will be omitted. Similarly, in FIGS. 12A to 12D described later, the same reference numerals as those in FIG. 1 and the like are provided, and the description thereof will be omitted.

A main difference between the substrate processing apparatus 1P according to the second embodiment and the substrate processing apparatus 1 according to the first embodiment (refer to FIG. 3) is that the gas nozzle 11 is inserted through the inside of the lamp housing 81 of the lamp unit 12 in the vertical direction, as shown in FIG. 10.

In the lamp unit 12 of the second embodiment, as shown in FIG. 11, a plurality of (for example, 52) light sources 84 is provided, and the plurality of light sources 84 are disposed in a triple annular shape. Each of the light sources 84 is, for example, a light emitting diode (LED). The plurality of light sources 84 is dispersedly disposed over the entire lower surface of the lamp substrate 83. The arrangement density of the light source 84 on the lamp substrate 83 is substantially uniform. The plurality of light sources 84 constitutes an annular light emitting part 12a which expands in the horizontal direction. The light emitting part 12a surrounds the discharge port 11a in an annular shape when seen from below.

The low surface tension liquid nozzle 10 is mounted on the outer wall surface 81a of the lamp housing 81 of the lamp unit 12 and is disposed outside the lamp unit 12, as in the first embodiment.

The same substrate processing as that in the substrate processing apparatus 1 according to the first embodiment (refer to FIG. 7) can be performed using the substrate processing apparatus 1P according to the second embodiment. However, the substrate processing according to the second embodiment is different from the substrate processing according to the first embodiment in the liquid film excluding step (Step S7). Specifically, in the substrate processing according to the second embodiment, in the opening forming step, an opening formation promoting step of promoting the formation of the opening 100 is performed by spraying a gas onto the center portion of the liquid film L. Hereinafter, the liquid film excluding step of the substrate processing according to the second embodiment will be described in more detail.

FIGS. 12A to 12D are schematic views for explaining a status of the substrate processing by the substrate processing apparatus 1P.

Figure 12A:
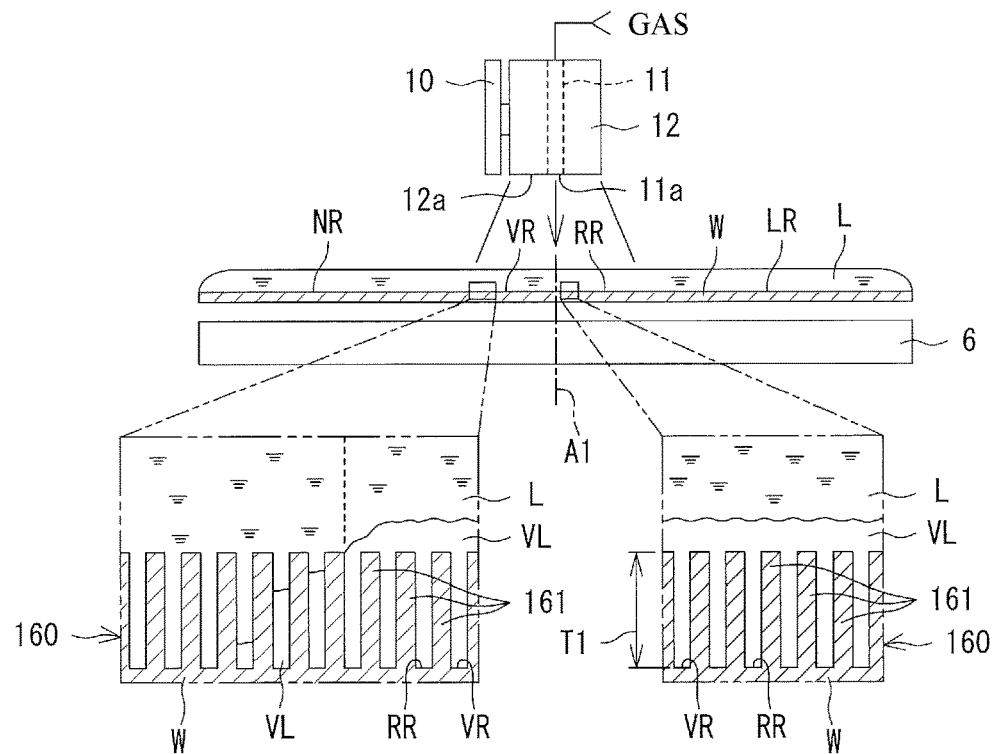
FIGS. 12A to 12D are schematic views for explaining a status of the substrate processing by the substrate processing apparatus according to the second embodiment.

In the substrate processing according to the second embodiment, the liquid film excluding step (Step S7) is performed after the gas phase layer forming step (Step S6) as in the substrate processing according to the first embodiment. As shown in FIG. 12A, in the gas phase layer forming step, the third moving unit 35 moves the lamp unit 12 in the horizontal direction and disposes it at the light radiation position. The light radiation position is, for example, the center position. When the lamp unit 12 is disposed at the light radiation position, the discharge port 11a of the gas nozzle 11 faces the rotation center position on the upper surface of the substrate W.

The irradiation region RR is maintained at the center portion of the upper surface of the substrate W by disposing the lamp unit 12 at the light radiation position even after the gas phase layer forming region VR is formed. Therefore, even after the gas phase layer forming region VR is formed, the heating of the center portion of the upper surface of the substrate W by the lamp unit 12 is maintained. The evaporation of the processing liquid held in the gas phase layer VL is promoted at the center portion of the upper surface of the substrate W by maintaining the heating of the center portion of the upper surface of the substrate W.

Further, a large temperature difference is generated between the irradiation region RR and the non-irradiation region NR on the upper surface of the substrate W by maintaining the heating of the center portion of the upper surface of the substrate W. Due to this temperature difference, the heat convection flowing from the center portion to the circumferential edge portion is formed on the upper surface of the substrate W. Since the substrate W is rotating, a centrifugal force acts on the liquid film L.

Figure 12B:
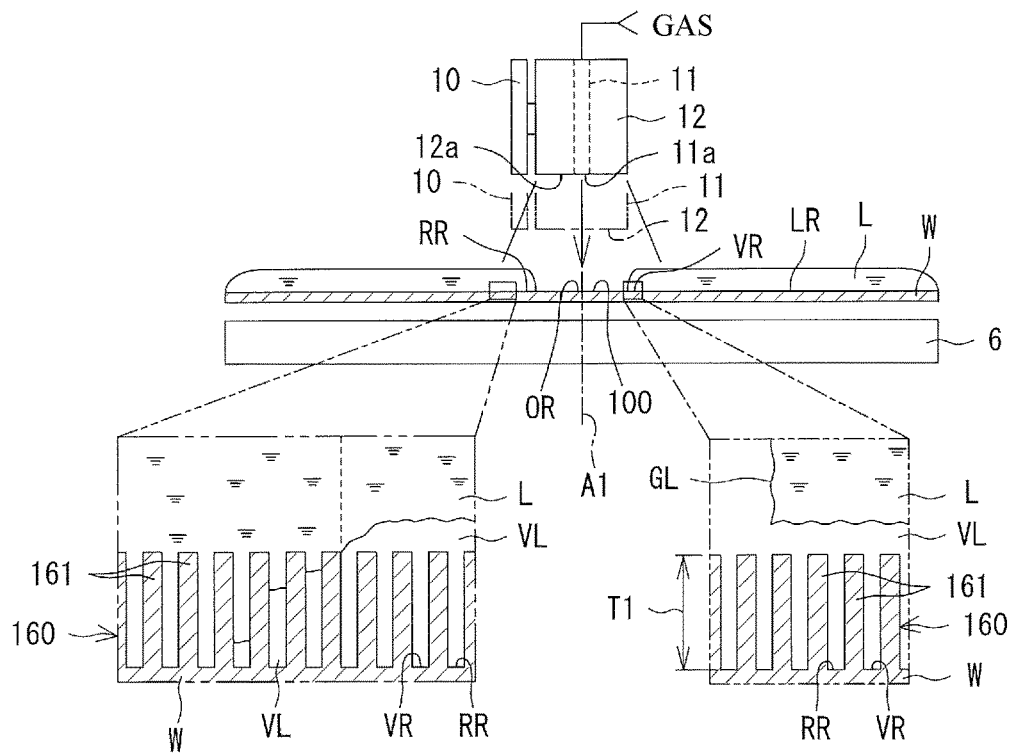

Since the rotation speed of the substrate W is the paddle speed, the centrifugal force applied to the liquid film L is relatively weak. Further, the heat convection generated on the upper surface of the substrate W is also relatively weak. However, as described above, the frictional resistance acting on the liquid film L in the gas phase layer forming region VR is small enough that it can be regarded as zero. Therefore, the low surface tension liquid is pushed outward by the centrifugal force and the heat convection. Thus, the thickness of the center portion of the liquid film L is reduced, and as shown in FIG. 12B, the substantially circular opening 100 is formed in the center portion of the liquid film L. The opening 100 is an exposing hole which exposes the upper surface of the substrate W.

The gas valve 53A is opened at the same time as the start of the radiation of the light from the lamp unit 12, or from the start of the radiation of the light from the lamp unit 12 to the formation of the opening 100. Therefore, a gas is sprayed toward the center portion of the liquid film L. The low surface tension liquid on the center portion of the upper surface of the substrate W is pushed away toward the circumferential edge portion of the substrate W by spraying the gas. In the state in which the gas phase layer forming region VR is formed, the frictional resistance acting on the liquid film L on the substrate W is small enough that it can be regarded as zero. Therefore, the low surface tension liquid on the center portion of the substrate W can be rapidly pushes away by spraying the gas. Thus, the formation of the opening 100 can be promoted (an opening formation promoting step).

As the liquid film L is partially removed by the formation of the opening 100, the gas phase layer forming region VR has an annular shape as shown in FIG. 9B. As shown in the enlarged view of FIG. 12B, a gas-liquid interface GL is formed between the liquid film L of the gas phase layer forming region VR and the opening 100, that is, on the inner circumferential edge of the liquid film L of the gas phase layer forming region VR by forming the opening 100.

In this way, as shown in FIG. 12B, the opening 100 is rapidly formed in the center portion of the liquid film L of the processing liquid due to the evaporation of the processing liquid, the generation of heat convection, and the action of the centrifugal force (an opening forming step). The liquid film L has an annular shape by forming the opening 100. As the opening 100 is formed, the liquid film forming region LR also has an annular shape as shown in FIG. 9B. After the opening 100 is formed, the gas valve 53A is closed temporarily. Thus, the discharge of the gas from the gas nozzle 11 is stopped.

Even after the gas phase layer VL is formed, the heating of the substrate W by the heater unit 6 is continued, and the entire liquid film L is kept warm (a liquid film heat retaining step). Therefore, it is possible to curb the disappearance of the gas phase layer VL when the opening 100 is formed.

The substrate W is heated by the heater unit 6 and the lamp unit 12 even after the opening 100 is formed in the liquid film L. Since the low surface tension liquid is not present in a region on the upper surface of the substrate W in which the opening 100 is formed (the opening forming region OR), the temperature of the substrate W is rapidly increased by the heater unit 6 and the lamp unit 12. Thus, a temperature difference occurs between the inside with respect to the inner circumferential edge of the liquid film L (the opening forming region OR) and the outside of the inner circumferential edge of the liquid film L (the liquid film forming region LR).

Figure 12C:
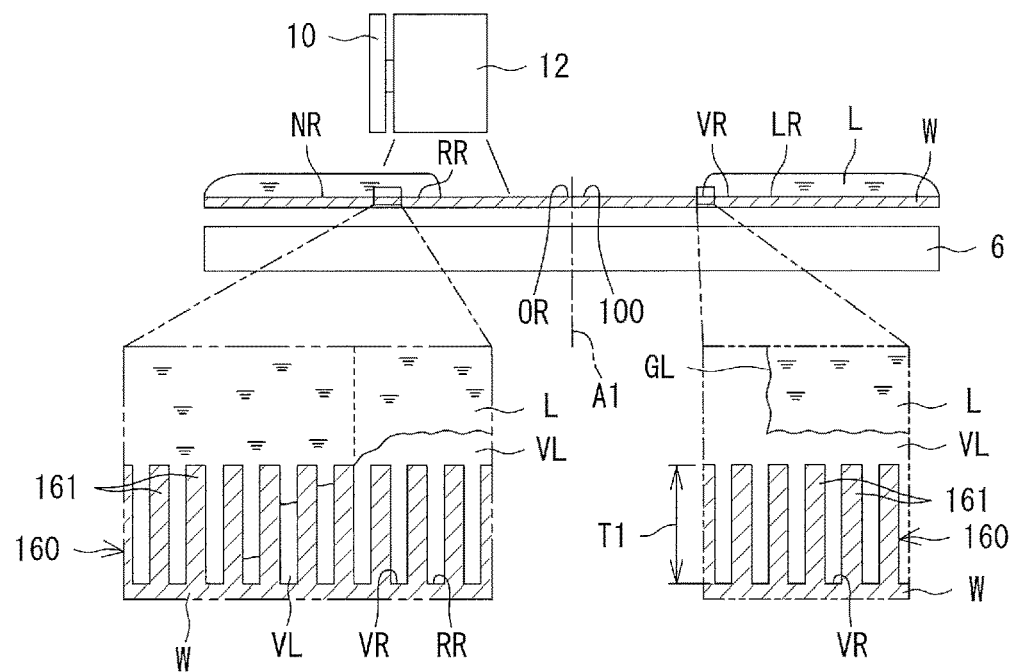

Specifically, the temperature of the substrate W is high in the opening forming region OR, and the temperature of the substrate W is low in the liquid film forming region LR. Due to the temperature difference, the generation of the heat convection continues near the inner circumferential edge of the liquid film L. Further, since the substrate W is rotating, a centrifugal force acts on the liquid film L. Therefore, as shown in FIGS. 12B and 12C, the opening 100 is expanded by the action of the centrifugal force and the generation of the heat convection (an opening expanding step).

After the opening 100 is formed, as shown by an alternate long and two short dashes line in FIG. 12B, the third moving unit 35 changes the height position of the lamp unit 12 to the proximity position closer to the upper surface of the substrate W than the separation position (a radiation unit proximity step). Thus, the temperature of the opening forming region OR on the upper surface of the substrate W can be rapidly increased.

When the expansion of the opening 100 is started, the third moving unit 35 moves the low surface tension liquid nozzle 10, the gas nozzle 11, and the lamp unit 12 toward the circumferential edge portion of the substrate W while the height position of the lamp unit 12 is maintained at the proximity position (a proximity movement step). At this time, the low surface tension liquid nozzle 10, the gas nozzle 11 and the lamp unit 12 are moved so that the gas nozzle 11 is located inside the substrate W with respect to the lamp unit 12. As the lamp unit 12 moves toward the circumferential edge portion of the upper surface of the substrate W, the irradiation region RR moves toward the circumferential edge portion of the upper surface of the substrate W.

The substrate W is rotated even while the opening 100 is being expanded. Therefore, the irradiation region RR moves relative to the upstream side in the rotation direction of the substrate W. Thus, the entire inner circumferential edge of the liquid film L is heated, and the gas phase layer VL having a sufficient thickness is formed on the entire inner circumferential edge of the liquid film L. That is, as shown in FIG. 9C, the gas phase layer forming region VR becomes an annular shape while the opening 100 is being expanded. During the expansion of the opening 100, the gas phase layer VL is also formed in the non-irradiation region NR.

In the opening expanding step, as shown in FIG. 9C, the lamp unit 12 is moved so that the irradiation region RR is disposed across the liquid film forming region LR and the opening forming region OR. Therefore, the opening 100 is expanded while the state in which the gas phase layer VL is formed on the inner circumferential edge of the liquid film L is maintained.

As shown in FIG. 9C, the irradiation region RR is moved according to the expansion of the opening 100 to be disposed across the liquid film forming region LR and the opening forming region OR. Therefore, the inner circumferential edge of the liquid film L can be heated with a sufficient amount of heat. Therefore, it is possible to curb occurrence of a situation in which the gas phase layer VL is not formed on the inner circumferential edge of the liquid film L due to insufficient heat, or a situation in which the once formed gas phase layer VL disappears and the low surface tension liquid comes into contact with the upper surface of the substrate W. That is, the gas phase layer VL can be stably formed on the inner circumferential edge of the liquid film L.

Figure 12D:
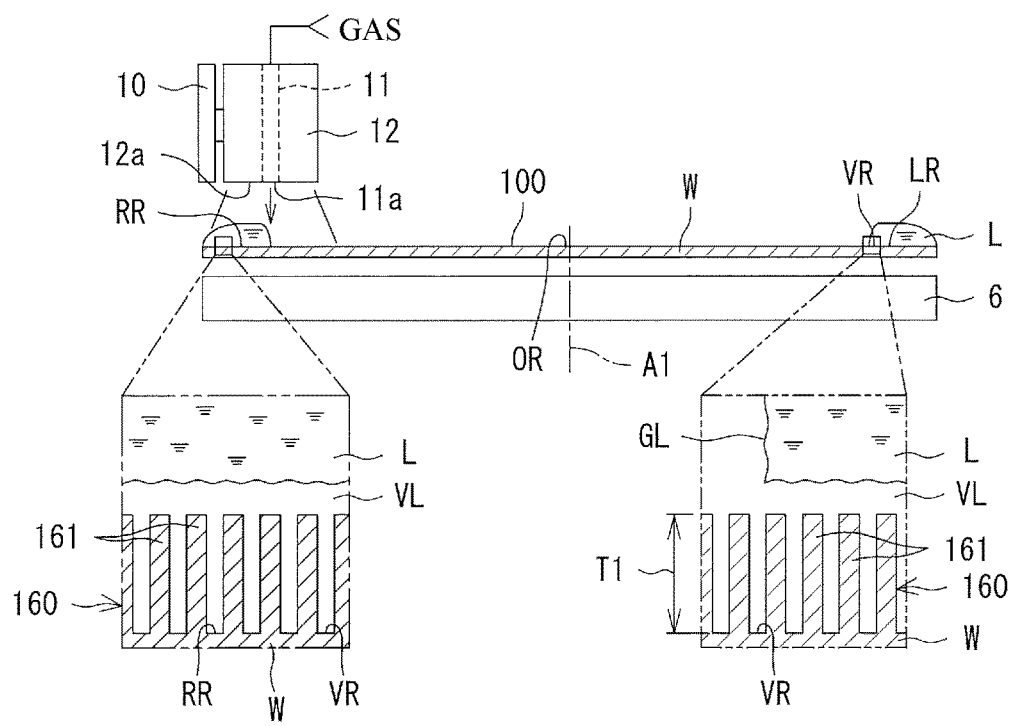

As described in the first embodiment, although the opening 100 can be expanded to some extent by the movement of the low surface tension liquid due to the centrifugal force caused by the low rotation speed and the generation of the heat convection, when the outer circumferential edge of the opening 100 reaches the circumferential edge portion of the upper surface of the substrate W as shown in FIGS. 12D and 9D, the movement of the low surface tension liquid may stop. Therefore, also in the second embodiment, the gas valve 53A is opened when the inner circumferential edge of the liquid film L reaches the circumferential edge portion of the upper surface of the substrate W. Thus, the gas is sprayed on the upper surface of the substrate W toward the inside (the opening forming region OR) with respect to the inner circumferential edge of the liquid film L. The gas which collides with the upper surface of the substrate W flows along the upper surface of the substrate W and pushes the low surface tension liquid to the outside of the substrate W to expand the opening 100. Accordingly, the low surface tension liquid is excluded from the upper surface of the substrate W without stopping. It is possible to curb or prevent the collapse of the pattern and the generation of particles.

However, the discharge port 11a of the gas nozzle 11 according to the second embodiment is located at the center of the light emitting part 12a. Therefore, the gas discharged from the discharge port 11a of the gas nozzle 11 is sprayed to the center of the irradiation region RR. That is, the gas is sprayed to a position on the opening forming region OR near the inner circumferential edge of the liquid film L. Thus, as compared with the configuration in which the discharge port 11a of the gas nozzle 11 is located outside the light emitting part 12a (the configuration of the first embodiment), a large spraying force can be applied to the liquid film L.

According to the second embodiment, the low surface tension liquid can be satisfactorily excluded from the upper surface of the substrate W as in the first embodiment. As a result, it is possible to curb the collapse of the pattern due to the surface tension of the low surface tension liquid and the generation of particles due to poor drying.

Third Embodiment

Figure 13:
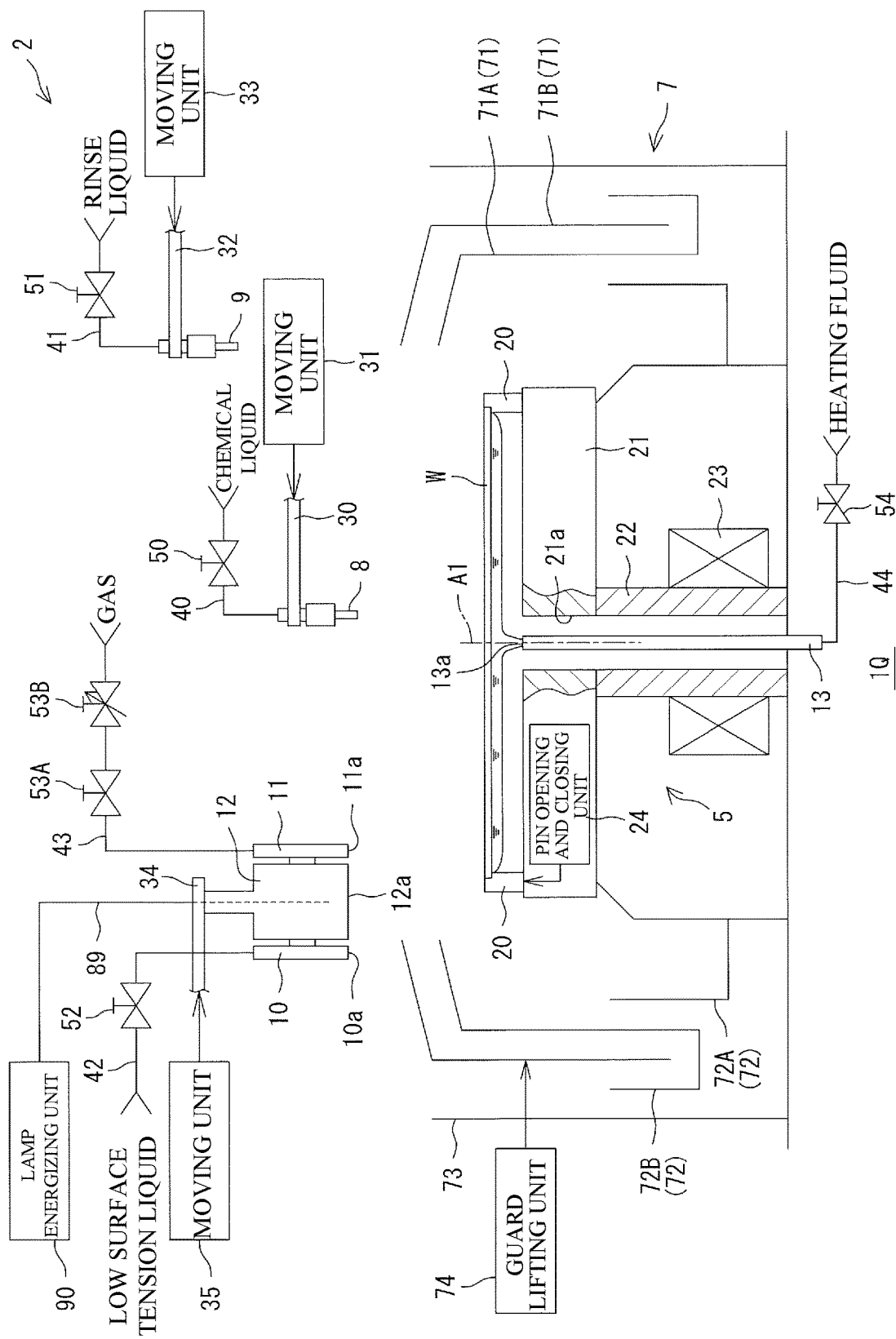
FIG. 13 is a schematic partial cross-sectional view showing a schematic configuration of a processing unit provided in a substrate processing apparatus according to a third embodiment of the disclosure.

FIG. 13 is a schematic partial cross-sectional view showing a schematic configuration of the processing unit 2 provided in a substrate processing apparatus 1Q according to a third embodiment. In FIG. 13, the same reference numerals as those in FIG. 1 and the like are provided to the same components as those shown in FIGS. 1 to 12D, and the description thereof will be omitted.

A main difference between the substrate processing apparatus 1Q according to the third embodiment and the substrate processing apparatus 1 according to the first embodiment (refer to FIG. 3) is that the processing unit 2 includes a heating fluid nozzle 13 which supplies a heating fluid to the lower surface of the substrate W, instead of the heater unit 6, as shown in FIG. 13.

The heating fluid nozzle 13 is inserted into the through hole 21a which is open at the center portion of the upper surface of the spin base 21 and the hollow rotating shaft 22. A discharge port 13a of the heating fluid nozzle 13 is exposed from the upper surface of the spin base 21. The discharge port 13a of the heating fluid nozzle 13 faces the center portion of the lower surface of the substrate W from below. The center portion of the lower surface of the substrate W is a region including a rotation center position on the lower surface of the substrate W and a position around the rotation center position on the lower surface of the substrate W.

The heating fluid nozzle 13 is connected to a heating fluid pipe 44 which guides the heating fluid to the heating fluid nozzle 13. When a heating fluid valve 54 interposed in the heating fluid pipe 44 is opened, the heating fluid is discharged upward in a continuous flow from the discharge port 13a of the heating fluid nozzle 13.

The heating fluid is, for example, hot water. The heating fluid is a fluid of which a temperature is higher than room temperature and lower than the boiling point of the low surface tension liquid. The heating fluid is not limited to hot water, and may be a gas such as high-temperature nitrogen gas, and may be any fluid which can heat the substrate W.

The same substrate processing as that in the substrate processing apparatus 1 according to the first embodiment (refer to FIG. 7) can be performed using the substrate processing apparatus 1Q according to the third embodiment.

Figure 14A:
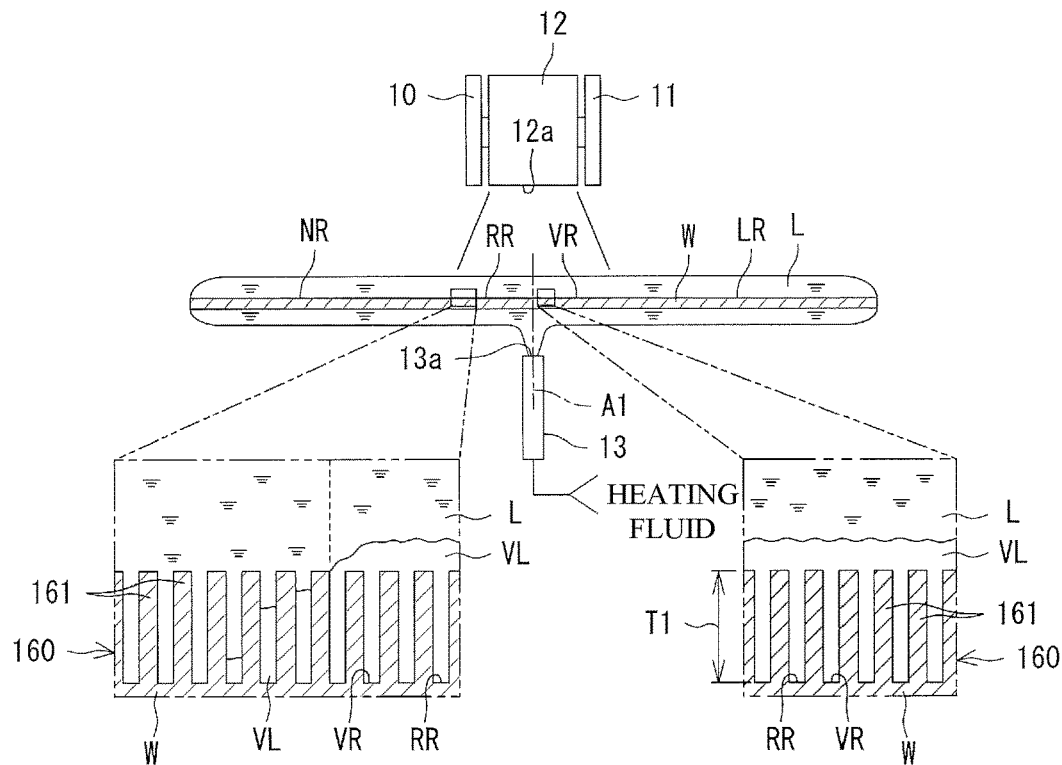
FIG. 14A to 14D are schematic views for explaining a status of the substrate processing by the substrate processing apparatus according to the third embodiment.

However, as shown in FIG. 14A, in the substrate processing according to the third embodiment, the heating fluid valve 54 is opened after the liquid film L of the low surface tension liquid is formed on the upper surface of the substrate W and before the radiation of light on the upper surface of the substrate W is started.

When the heating fluid valve 54 is opened, the heating fluid is discharged from the heating fluid nozzle 13 toward the center portion of the lower surface of the substrate W. A centrifugal force due to the rotation of the substrate W acts on the heating fluid supplied to the center portion of the lower surface of the substrate W. Therefore, the heating fluid evenly spreads over the entire lower surface of the substrate W by the centrifugal force, and the entire substrate W is heated by the heating fluid (a fluid heating step). The heating fluid nozzle 13 is an example of the substrate heating unit.

The heating fluid has a temperature higher than room temperature (for example, 25° C.) and lower than the boiling point of the low surface tension liquid. Therefore, the liquid film L is kept warm at a temperature higher than room temperature (for example, 25° C.) and lower than the boiling point of the low surface tension liquid (a liquid film heat retaining step). When the low surface tension liquid is IPA, the heating fluid is, for example, water having a temperature of 60° C. If so, the liquid film L can be kept warm at a temperature higher than room temperature and lower than a boiling point of IPA (82.6)° ° C.

In the third embodiment, the entire substrate W can be heated simply by supplying the heating fluid to the center portion of the lower surface of the substrate W.

Figure 14B:
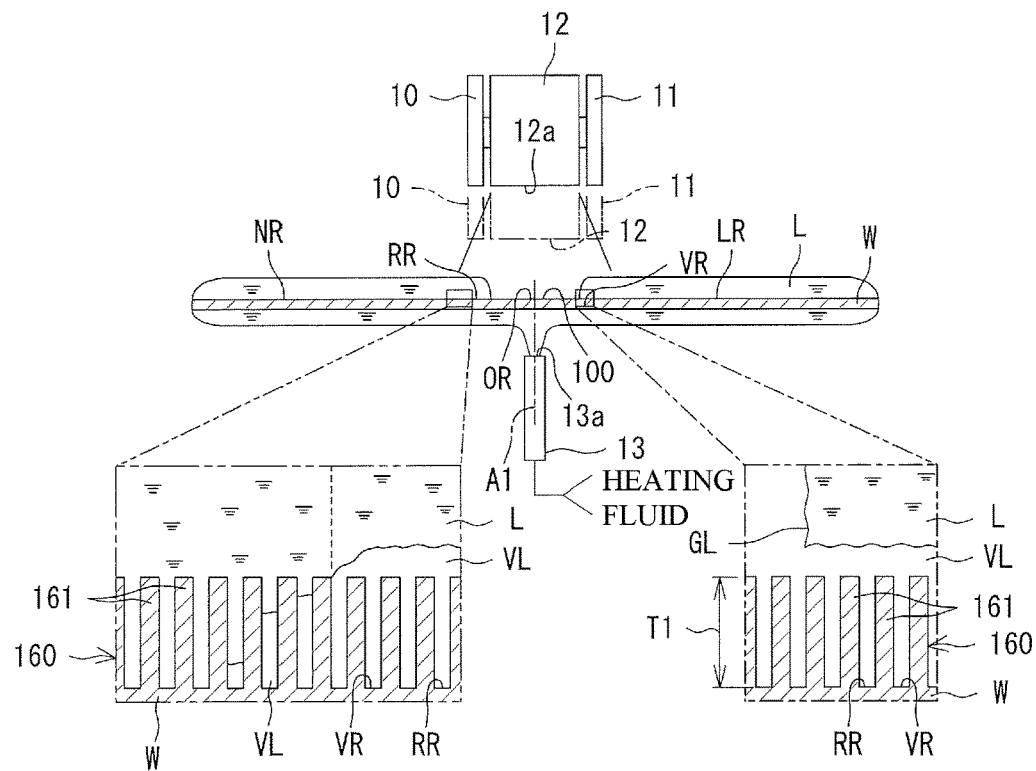
Figure 14C:
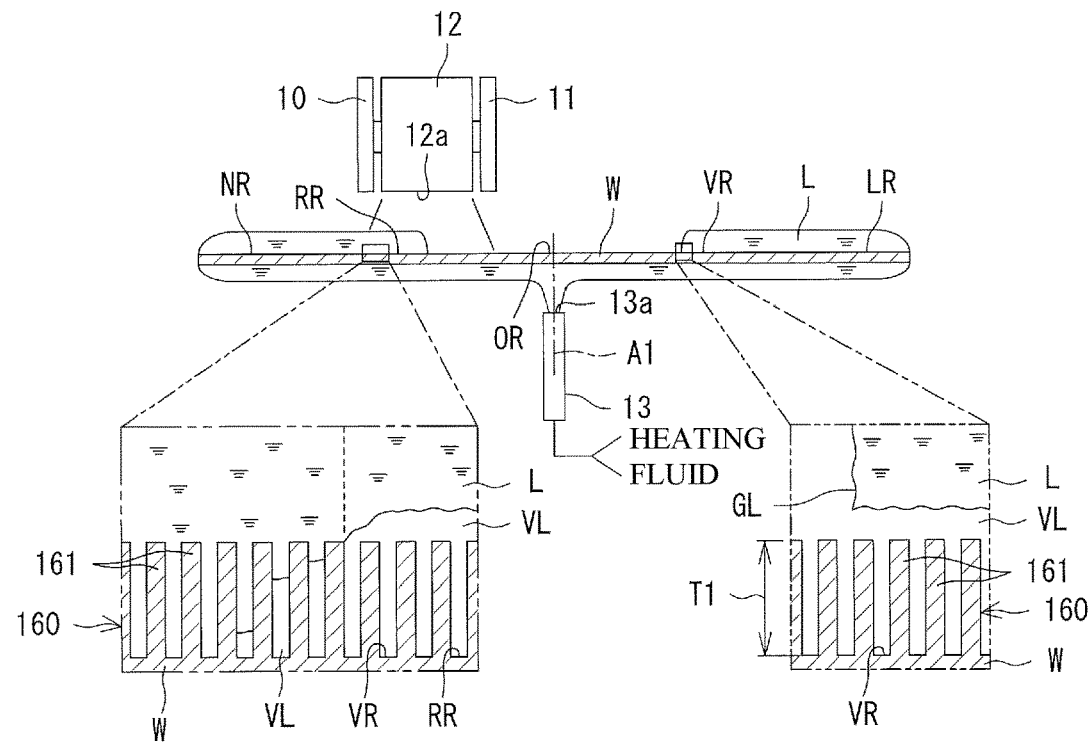
Figure 14D:
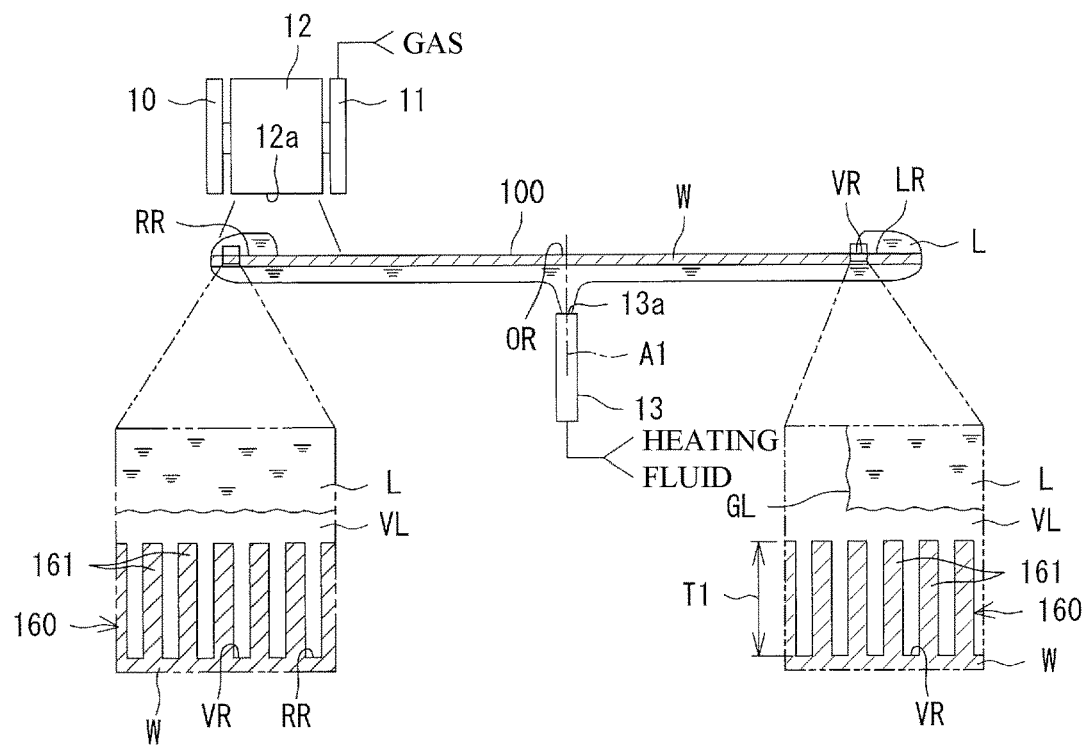

The supply of the heating fluid to the lower surface of the substrate W is continued even when the opening 100 is formed in the liquid film L (the opening forming step), as shown in FIG. 14B, and is continued even when the opening 100 is expanded (the opening expanding step), as shown in FIGS. 14C and 14D.

According to the third embodiment, the low surface tension liquid can be satisfactorily excluded from the upper surface of the substrate W as in the first embodiment. As a result, it is possible to curb the collapse of the pattern due to the surface tension of the low surface tension liquid and the generation of particles due to poor drying.

Fourth Embodiment

Figure 15A:
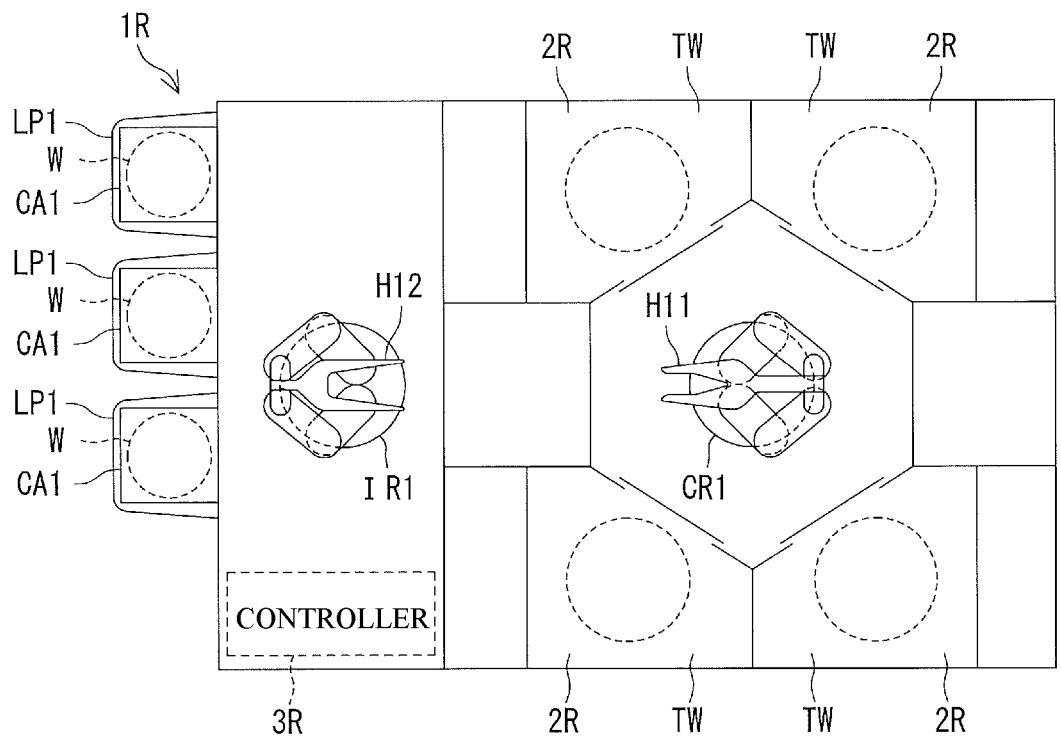
FIG. 15A is a schematic view of a substrate processing apparatus according to a fourth embodiment of the disclosure when seen from above.
Figure 15B:
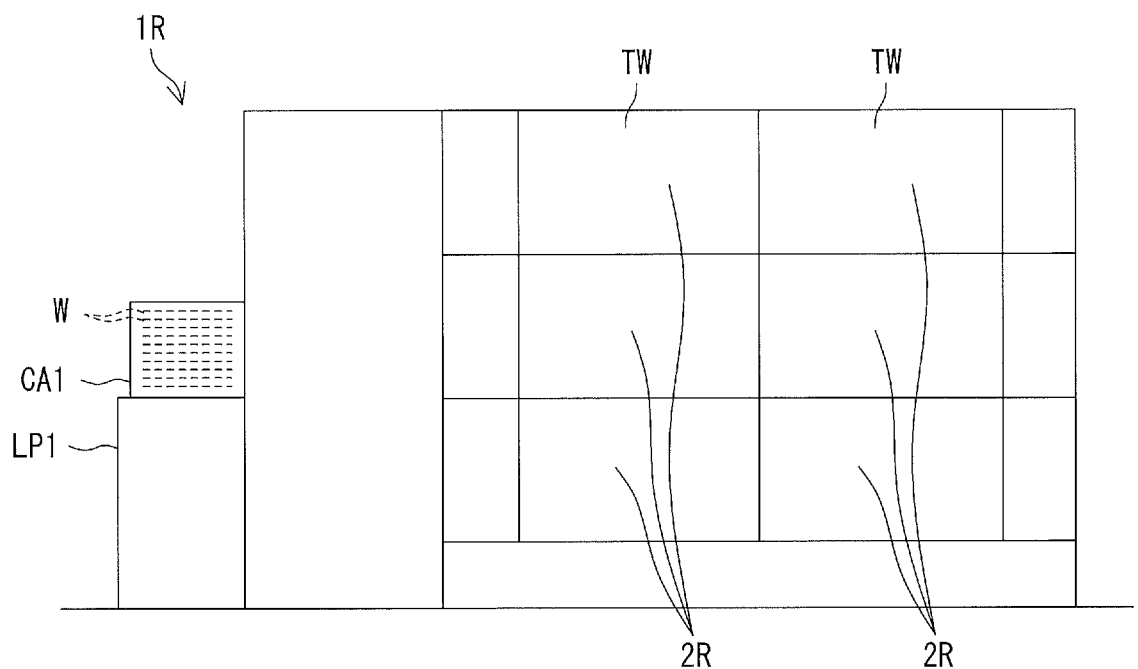
FIG. 15B is a schematic view of the substrate processing apparatus according to the fourth embodiment when seen laterally.

FIG. 15A is a schematic view of a substrate processing apparatus 1R according to a fourth embodiment of the disclosure when seen from above. FIG. 15B is a schematic view of the substrate processing apparatus 1R when seen laterally.

As shown in FIG. 15A, the substrate processing apparatus 1R is a single-wafer type apparatus which processes the disc-shaped substrates W such as semiconductor wafers one by one. The substrate processing apparatus 1R includes a load port LP1 which holds a carrier CA1 for accommodating the substrate W, a plurality of processing units 2R which processes the substrate W transferred from the carrier CA1 on the load port LP1 with a processing fluid such as a processing liquid or a processing gas, a plurality of transfer robots which transfers the substrate W between the carrier CA1 on the load port LP1 and the processing units 2R, and a controller 3R which controls the substrate processing apparatus 1R.

The plurality of transfer robots includes an indexer robot IR1 which loads and unloads the substrate W to/from the carrier CA1 on the load port LP1 and a center robot CR1 which loads and unloads the substrate W to/from the plurality of processing units 2R. The indexer robot IR1 transfers the substrate W between the load port LP1 and the center robot CR1, and the center robot CR1 transfers the substrate W between the indexer robot IR1 and the processing units 2R. The center robot CR1 includes a hand H11 which supports the substrate W, and the indexer robot IR1 includes a hand H12 which supports the substrate W.

The plurality of processing units 2R constitutes a plurality of towers TW disposed around the center robot CR1 in a plan view. FIG. 15A shows an example in which four towers TW are formed. The center robot CR1 can access any tower TW. As shown in FIG. 15B, each of the towers TW includes the plurality of (for example, three) processing units 2R stacked up and down.

Figure 16:
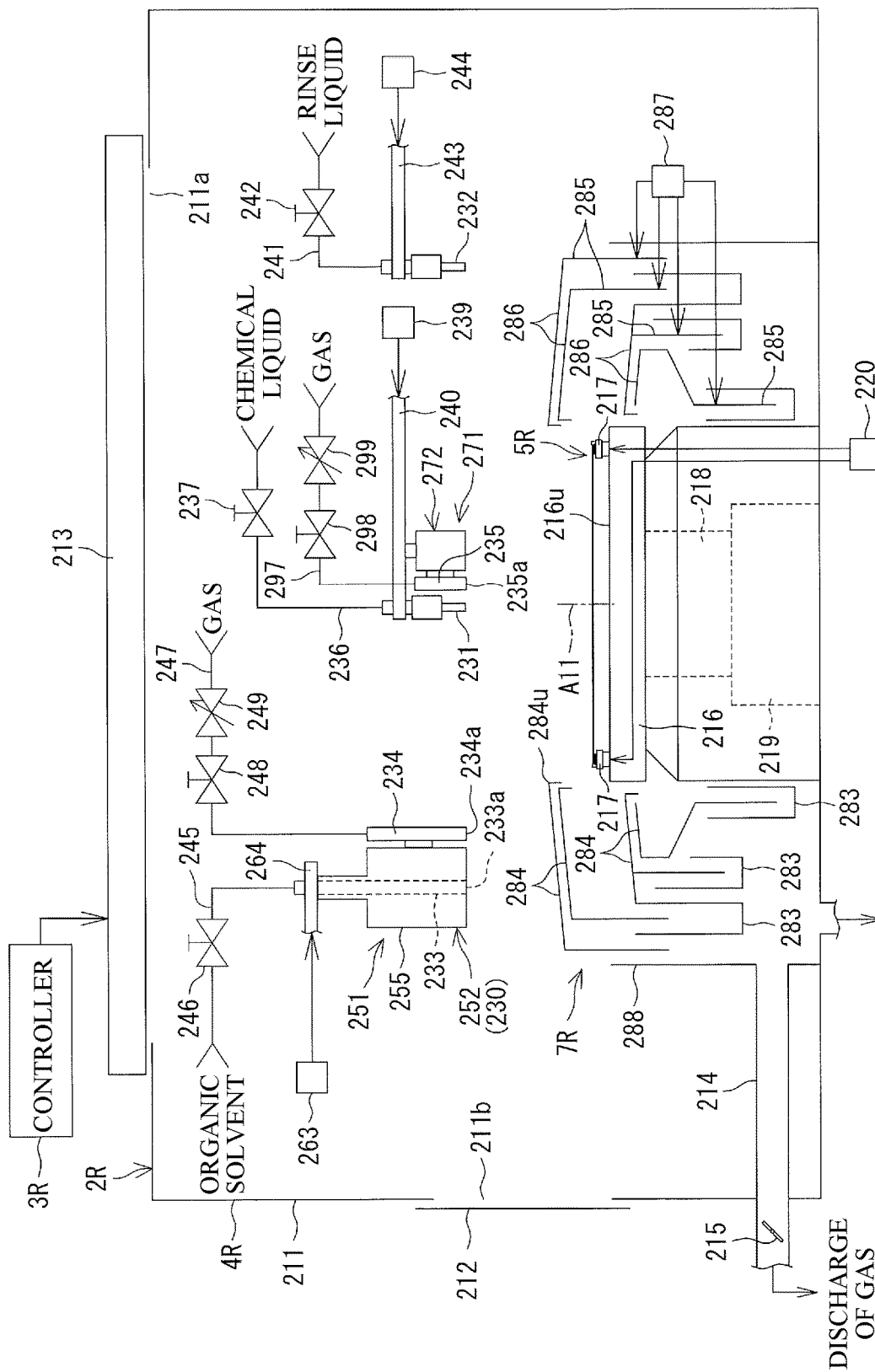
FIG. 16 is a schematic view of the inside of a processing unit provided in the substrate processing apparatus according to the fourth embodiment when seen horizontally.
Figure 17:
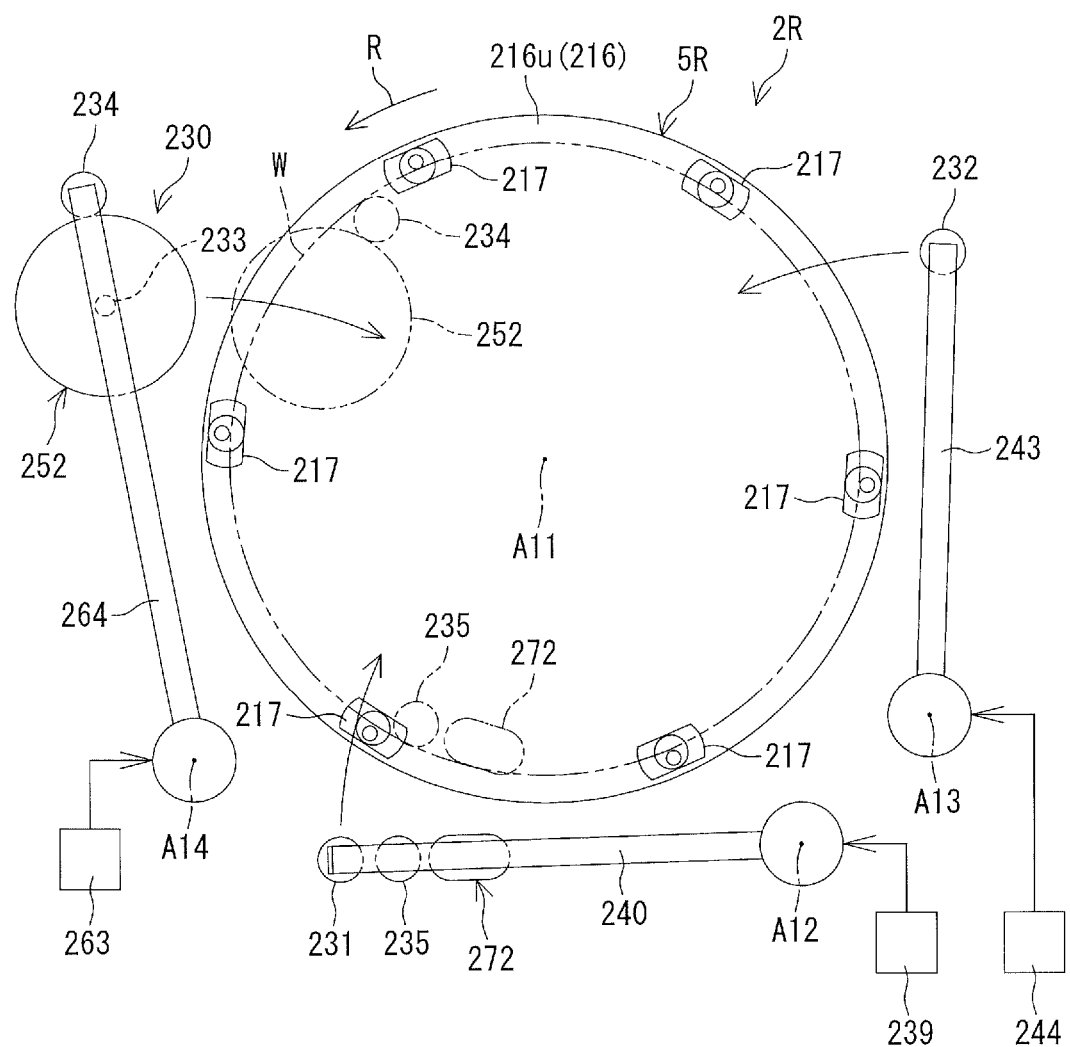
FIG. 17 is a schematic view of a spin base shown in FIG. 16 and related configurations thereof when seen from above.
Figure 18:
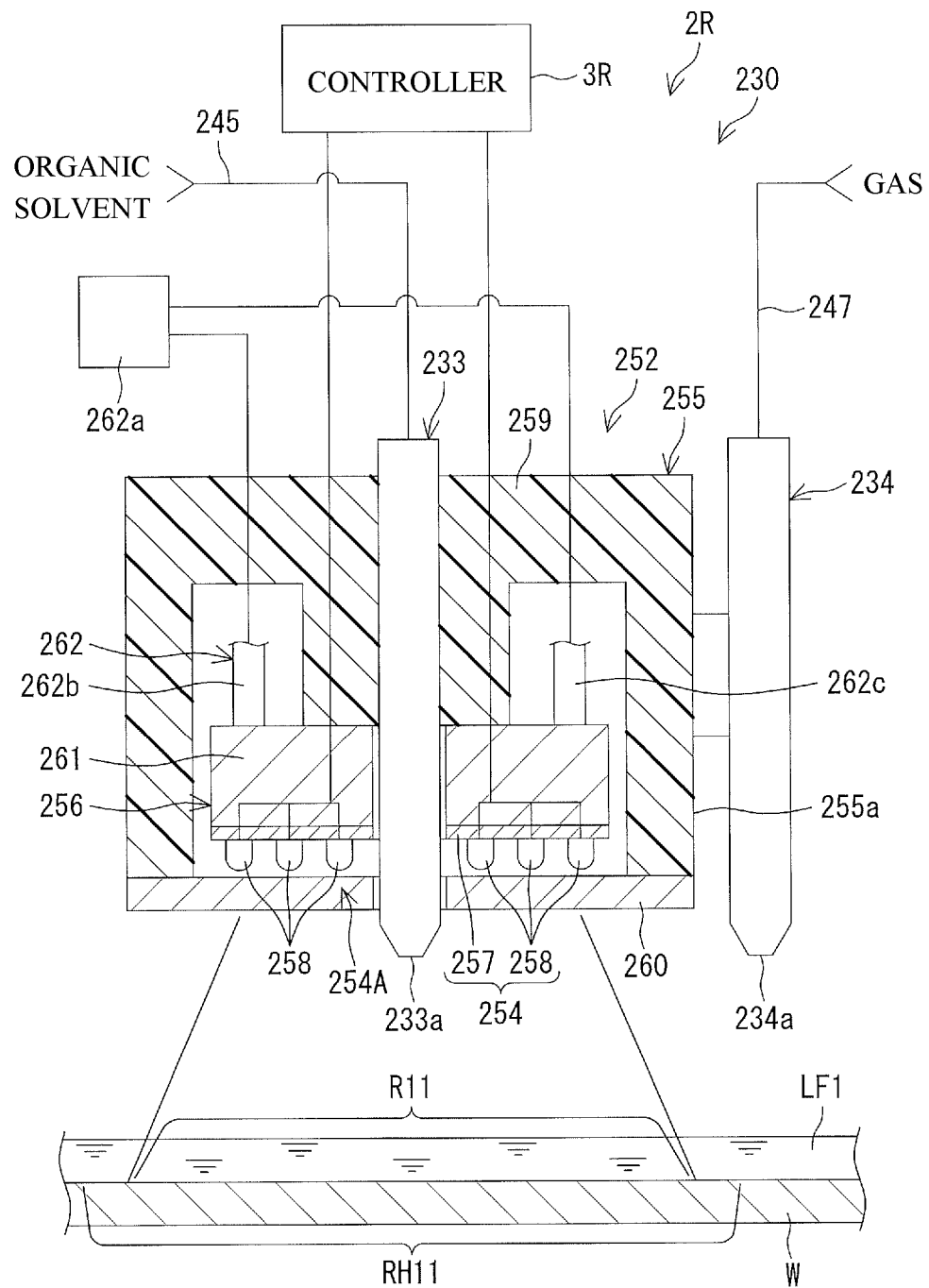
FIG. 18 is a schematic longitudinal cross-sectional view of an upper surface head shown in FIG. 16.
Figure 19:
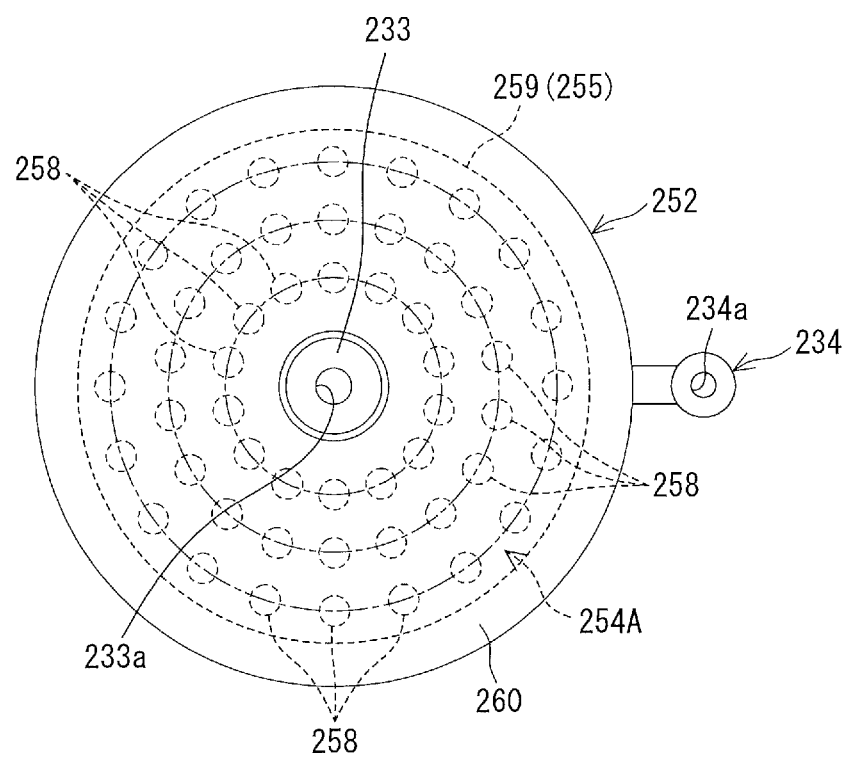
FIG. 19 is a schematic view of the upper surface head when seen from below.
Figure 20:
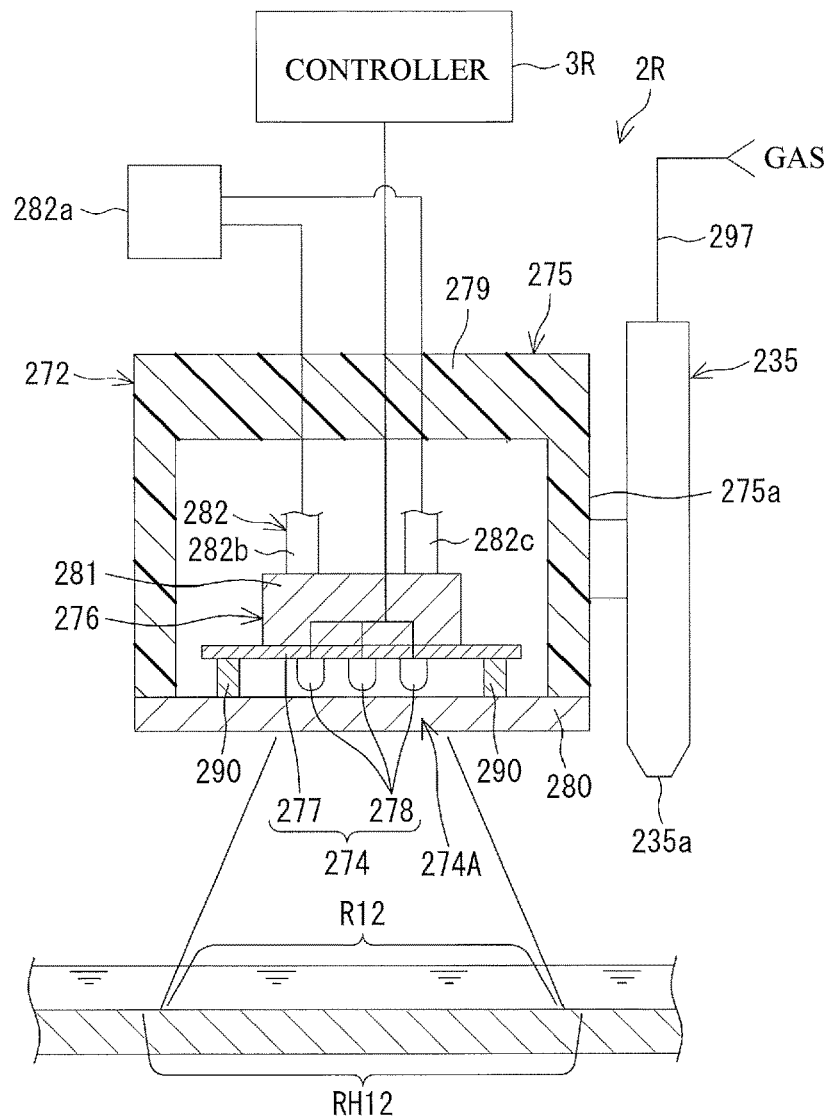
FIG. 20 is a schematic longitudinal cross-sectional view of a second lamp heater shown in FIG. 16.
Figure 21:
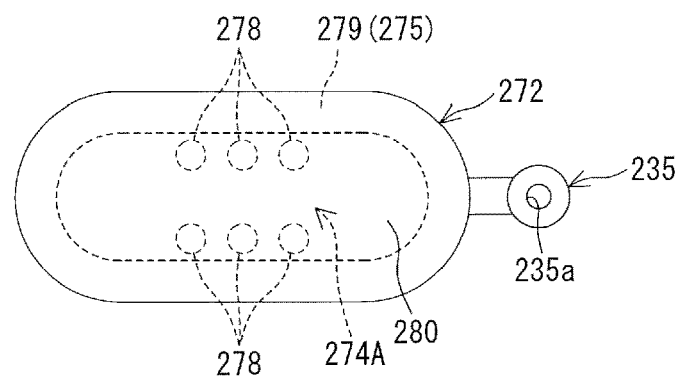
FIG. 21 is a schematic view of the second lamp heater when seen from below.

FIG. 16 is a schematic view of the inside of the processing unit 2R provided in the substrate processing apparatus 1R when seen horizontally. FIG. 17 is a schematic view of the spin base 216 shown in FIG. 16 and related configurations thereof when seen from above. FIG. 18 is a schematic longitudinal cross-sectional view of an upper surface head 230 shown in FIG. 16. FIG. 19 is a schematic view of the upper surface head 230 when seen from below. FIG. 20 is a schematic longitudinal cross-sectional view of a second lamp heater 272 shown in FIG. 16. FIG. 21 is a view of the second lamp heater 272 when seen from below.

As shown in FIG. 16, the processing unit 2R is a wet processing unit which supplies a processing liquid to the substrate W. The processing unit 2R includes a box-shaped chamber 4R with an internal space, a spin chuck (a substrate holding unit) 5R which rotates one substrate W around a vertical rotation axis A11 passing through the center portion of the substrate W while the substrate W is held horizontally in the chamber 4R, a plurality of nozzles which discharges a processing fluid (a processing liquid and a processing gas) toward the substrate W held by the spin chuck 5R, a heating unit which heats the substrate W by radiating light from above, and a tubular processing cup 7R which surrounds the spin chuck 5R around the rotation axis A11.

As shown in FIG. 16, the chamber 4R includes a box-shaped partition wall 211 having a loading and unloading port 211b through which the substrate W passes, and a shutter 212 which opens and closes the loading and unloading port 211b. An FFU (fan•filter•unit) 213 is disposed above a blowhole 211a provided at an upper portion of the partition wall 211. The FFU 213 constantly supplies clean air (air filtered by a filter) from the blowhole 211a to the inside of the chamber 4R. A gas in the chamber 4R is excluded from the chamber 4R through an exhaust duct 214 connected to a bottom portion of the processing cup 7R. Thus, a down flow of the clean air is constantly formed inside the chamber 4R. A flow rate of the exhaust gas excluded from the exhaust duct 214 is changed according to an opening degree of an exhaust valve 215 disposed in the exhaust duct 214.

As shown in FIG. 16, the spin chuck 5R includes a disc-shaped spin base 216 held in a horizontal posture, a plurality of chuck pins 217 which holds the substrate W in a horizontal posture above the spin base 216, and a spin shaft 218 which extends vertically downward along a rotation axis A11 from a center portion of the spin base 216. The spin shaft 218 is rotated around the rotation axis A11 by a spin motor (a substrate rotating unit) 219. Thus, when the spin base 216 and the plurality of chuck pins 217 are rotated, the plurality of chuck pins 217 rotates around the rotation axis A11. The plurality of chuck pins 217 is disposed on an outer circumferential portion of an upper surface 216u of the spin base 216 at intervals in a circumferential direction. The plurality of chuck pins 217 can be opened and closed between a closed state in which they come into contact with a circumferential end of the substrate W to grip the substrate W and an open state in which they are retracted from the circumferential end of the substrate W. In the open state, the plurality of chuck pins 217 comes into contact with the lower surface of the outer circumferential portion of the substrate W to support the substrate W from below.

A chuck pin drive unit 220 for driving the opening and closing of the chuck pins 217 is coupled to the chuck pins 217. The chuck pin drive unit 220 includes, for example, a link mechanism accommodated inside the spin base 216 and a drive source disposed outside the spin base 216. The drive source includes an electric motor. A specific configuration example of the chuck pin drive unit 220 is described in Japanese Patent Laid-Open No. 2008-0345553 and the like.

Further, the spin chuck 5R is not limited to the grip type, and for example, a vacuum suction type chuck (a vacuum chuck) in which the substrate W is held in a horizontal posture by vacuum-suctioning a back surface of the substrate W and the substrate W held by the spin chuck 5R is rotated by rotating around the vertical rotation axis in that state may also be adopted.

The plurality of nozzles includes a chemical liquid nozzle 231 which discharges a chemical liquid toward the upper surface of the substrate W, a rinse liquid nozzle 232 which discharges a rinse liquid toward the upper surface of the substrate W, an organic solvent nozzle (a processing liquid nozzle) 233 which discharges an organic solvent toward the upper surface of the substrate W, a first gas nozzle 234 which discharges a gas toward the upper surface of the substrate W, and a second gas nozzle 235 which discharges a gas toward the upper surface of the substrate W.

The chemical liquid nozzle 231 is connected to a chemical liquid pipe 236 which guides the chemical liquid to the chemical liquid nozzle 231. When a chemical liquid valve 237 interposed in the chemical liquid pipe 236 is opened, the chemical liquid is continuously discharged downward from a discharge port of the chemical liquid nozzle 231. The chemical liquid discharged from the chemical liquid nozzle 231 may be a liquid containing at least one of a sulfuric acid, a nitric acid, a hydrochloric acid, a hydrofluoric acid, a phosphoric acid, an acetic acid, ammonia water, a hydrogen peroxide solution, an organic acid (for example, a citric acid, an oxalic acid, or the like), an organic alkali (for example, TMAH: tetramethylammonium hydroxide, or the like), a surfactant, and a corrosion inhibitor, and may be a processing liquid other than the liquid.

In the examples of FIGS. 16 and 17, the chemical liquid nozzle 231 is a movable scan nozzle. The processing unit 2R includes a first arm 240 in which the chemical liquid nozzle 231 is mounted on a tip end portion thereof, and a first moving device 239 which moves the chemical liquid nozzle 231 by moving the first arm 240.

As shown in FIG. 17, the first moving device 239 horizontally moves the chemical liquid nozzle 231 along a trajectory passing through the center portion of the upper surface of the substrate W in a plan view by rotating the first arm 240 around a rotation axis A12 which extends in the vertical direction around the spin chuck 5R. The first moving device 239 moves the chemical liquid nozzle 231 between a processing position at which the chemical liquid discharged from the chemical liquid nozzle 231 lands on the upper surface of the substrate W, and a retracted position (a position shown in FIG. 17) at which the chemical liquid nozzle 231 retracts around the spin chuck 5R in a plan view. The first moving device 239 includes, for example, an electric motor.

As shown in FIG. 16, the rinse liquid nozzle 232 is connected to a rinse liquid pipe 241 which guides the rinse liquid to the rinse liquid nozzle 232. When a rinse liquid valve 242 interposed in the rinse liquid pipe 241 is opened, the rinse liquid is continuously discharged downward from a discharge port of the rinse liquid nozzle 232. The rinse liquid discharged from the rinse liquid nozzle 232 is, for example, pure water (deionized water). The rinse liquid discharged from the rinse liquid nozzle 232 may be any one of carbonated water, electrolytic ionized water, hydrogen water, ozone water, hydrochloric acid water having a diluted concentration (for example, about 10 ppm to 100 ppm), and ammonia water having a diluted concentration (for example, about 10 ppm to 100 ppm).

In the examples of FIGS. 16 and 17, the rinse liquid nozzle 232 is a movable scan nozzle. The processing unit 2R includes a second arm 243 in which the rinse liquid nozzle 232 is mounted on a tip end portion thereof, and a second moving device 244 which moves the rinse liquid nozzle 232 by moving the second arm 243.

As shown in FIG. 17, the second moving device 244 moves the rinse liquid nozzle 232 along a trajectory passing through the center portion of the upper surface of the substrate W in a plan view by rotating the second arm 243 around the rotation axis A13 which extends in the vertical direction around the spin chuck 5R. The second moving device 244 moves the rinse liquid nozzle 232 between a processing position at which the rinse liquid discharged from the rinse liquid nozzle 232 lands on the upper surface of the substrate W and a retracted position (a position shown in FIG. 17) at which the rinse liquid nozzle 232 retracts around the spin chuck 5R in a plan view. The second moving device 244 includes an electric motor.

As shown in FIG. 16, the organic solvent nozzle 233 is connected to an organic solvent pipe 245 which guides the organic solvent to the organic solvent nozzle 233. When an organic solvent valve 246 interposed in the organic solvent pipe 245 is opened, the organic solvent is continuously discharged downward from an organic solvent discharge port 233a of the organic solvent nozzle 233. The organic solvent discharged from the organic solvent nozzle 233 is, for example, IPA. Examples of organic solvents which can be used include methanol, ethanol, acetone, EG, HFE, n-butanol, t-butanol, isobutyl alcohol and 2-butanol, in addition to IPA. Further, as the organic solvent, not only a solvent composed of only a single component but also a liquid mixed with other components can be used. The organic solvent supply unit (the processing liquid supply unit) is configured of the organic solvent nozzle 233, the organic solvent pipe 245, and the organic solvent valve 246. In the embodiment, the organic solvent nozzle 233 is integrated with a first lamp heater 252 which will be described later.

The first gas nozzle 234 is connected to a first gas pipe 247 which guides a gas to the first gas nozzle 234. When a first gas valve 248 interposed in the first gas pipe 247 is opened, the gas is continuously discharged downward from a first gas discharge port 234a of the first gas nozzle 234 at a flow rate corresponding to an opening degree of the first flow rate adjusting valve 249 which changes a flow rate of the gas. The gas supplied to the first gas nozzle 234 is an inert gas such as nitrogen gas. The inert gas may be a gas other than nitrogen gas such as helium gas or argon gas. A first spraying unit for spraying a gas onto the upper surface of the substrate W held by the spin chuck 5R is configured of the first gas nozzle 234, the first gas pipe 247, the first gas valve 248 and the first flow rate adjusting valve 249. The first gas nozzle 234 is mounted on the first lamp heater 252 which will be described later, and is also supported by the first lamp heater 252.

The second gas nozzle 235 is connected to a second gas pipe 297 which guides a gas to the second gas nozzle 235. When a second gas valve 298 interposed in the second gas pipe 297 is opened, the gas is continuously discharged downward from a second gas discharge port 235a of the second gas nozzle 235 at a flow rate corresponding to an opening degree of the second flow rate adjusting valve 299 which changes a flow rate of the gas. The gas supplied to the second gas nozzle 235 is an inert gas such as nitrogen gas. The inert gas may be a gas other than nitrogen gas such as helium gas or argon gas. A second spraying unit for spraying a gas onto the upper surface of the substrate W held by the spin chuck 5R is configured of the second gas nozzle 235, the second gas pipe 297, the second gas valve 298 and the second flow rate adjusting valve 299. The second gas nozzle 235 is mounted on the second lamp heater 272 which will be described later, and is also supported by the second lamp heater 272.

The heating unit includes a first heating unit 251 and a second heating unit 271.

The first heating unit 251 includes a first lamp heater 252 and a first heater moving unit which moves the first lamp heater 252.

As shown in FIG. 18, the first lamp heater 252 is a radiant heating heater which irradiates the substrate W with light containing at least one of near infrared light, visible light, and ultraviolet light to heat the substrate W by radiation. The first lamp heater 252 includes a first lamp 254, a first lamp housing 255 which accommodates the first lamp 254, and a first heat sink 256 which cools the inside of the first lamp housing 255.

As shown in FIGS. 18 and 19, the first lamp 254 includes a disc-shaped first lamp substrate 257 and a plurality of (52 in the example of FIG. 19) first light sources 258 mounted on a lower surface of the first lamp substrate 257. Each of the first light sources 258 is, for example, a light emitting diode (LED). As shown in FIG. 19, the plurality of first light sources 258 is dispersedly disposed over the entire lower surface of the first lamp substrate 257. In the example of FIG. 19, 52 first light sources 258 are disposed in a triple annular shape. An arrangement density of the first light sources 258 on the first lamp substrate 257 is substantially uniform. The plurality of first light sources 258 constitutes an annular first light emitting part 254A which expands in the horizontal direction. The first light emitting part 254A surrounds the organic solvent discharge port 233a in an annular shape when seen from below.

The light emitted from each of the first light sources 258 includes at least one of near infrared light, visible light and ultraviolet light. A wavelength of the light emitted from each of the first light sources 258 is a wavelength in a range of 200 nm to 1100 nm, more preferably in a range of 390 nm to 800 nm.

As shown in FIG. 18, the first lamp housing 255 includes a cylindrical first housing body 259 and a disc-shaped first bottom wall 260. The first housing body 259 is made of a material having chemical resistance such as PTFE. The first bottom wall 260 is made of a material allowing light transmission and having heat resistance such as quartz. The first lamp housing 255 is smaller than the substrate W in a plan view.

The first heat sink 256 includes a first heat sink body 261 and a first cooling mechanism 262 which supplies a cooling fluid to the first heat sink body 261 to cool the first heat sink body 261. The first heat sink body 261 is formed in a container shape having a predetermined shape using a metal having excellent heat transfer characteristics (for example, aluminum, iron, copper, or the like). The first cooling mechanism 262 includes a cooling fluid supply source 262a, a cooling fluid supply pipe 262b which supplies a cooling fluid from the supply source 262a to the first heat sink body 261, and a cooling fluid return pipe 262c which returns the cooling fluid supplied to the first heat sink body 261 to the supply source 262a.

In the example of FIG. 18, as the first cooling mechanism 262, a cooling liquid such as cooling water is supplied as the cooling fluid to the first heat sink body 261. That is, the first heat sink 256 is a water-cooled heat sink. The first lamp 254 and surroundings thereof are heated according to the light emission of the plurality of first light sources 258. However, since the inside of the first lamp housing 255 is cooled by the first heat sink 256, it is possible to prevent the inside of the first lamp housing 255 from being excessively heated. In the first heat sink 256, a cooling gas may be used as the cooling fluid.

As shown in FIG. 17, the processing unit 2R further includes a third arm 264 in which the first lamp heater 252 is mounted on a tip end portion thereof. The first heater moving unit includes a third moving device (a first heating region moving unit, a first spraying region moving unit) 263 which moves the third arm 264 to move the first lamp heater 252. Specifically, the third moving device 263 rotates the third arm 264 around a rotation axis A14 which extends in the vertical direction around the spin chuck 5R. The third moving device 263 includes an electric motor.

The third moving device 263 holds the first lamp heater 252 at a predetermined height. The third moving device 263 moves the first lamp heater 252 horizontally by rotating the third arm 264 around the rotation axis A14. The third moving device 263 may have a configuration in which the first lamp heater 252 can be moved in the vertical direction. Specifically, the third moving device 263 may be coupled to the third arm 264 and may include an arm moving unit which moves the third arm 264 up and down.

The first lamp heater 252 is used in a state in which a liquid film LF1 (a liquid film of an organic solvent) of a processing liquid which covers the upper surface of the substrate W is formed on the upper surface of the substrate W.

As shown in FIG. 18, when the first lamp 254 emits light, that is, when the plurality of first light sources 258 emits light, the light emitted from the first lamp 254 (the light containing at least one of near infrared light, visible light, and ultraviolet light) is transmitted through the first lamp housing 255 and is radiated to a first irradiation region R11 on the upper surface of the substrate W held by the spin chuck 5R. As described above, IPA is adopted as the organic solvent. As described above, the IPA transmits almost all light having a wavelength of 200 nm to 1100 nm. Since the wavelength of the light emitted from the first lamp 254 is 200 nm to 1100 nm (more preferably, 390 nm to 800 nm), the light emitted from the first lamp 254 is not absorbed by the liquid film LF1 and is transmitted through the liquid film LF1. Therefore, the light radiated from an outer surface of the first lamp housing 255 is transmitted through the liquid film LF1 and is radiated to the first irradiation region R11. Thus, the first irradiation region R11 and surrounding portions thereof (hereinafter, referred to as "first heating region RH11") on the upper surface of the substrate W (a surface Wa of the substrate W) are heated by radiation, and temperature thereof is increased. Since a pattern P1 (refer to FIG. 23) is formed on the surface Wa of the substrate W (refer to FIG. 23), the pattern P1 is warmed by heat transfer from the surface Wa of the substrate W to be heated, and a temperature thereof is increased. The organic solvent in contact with the first heating region RH11 is warmed and the organic solvent is evaporated by the temperature of the pattern P1 formed in the first heating region RH11 being increased to a predetermined heating temperature equal to or higher than a boiling point of the organic solvent.

In this state, as shown in FIG. 17, the third moving device 263 moves the first lamp heater 252 horizontally by rotating the third arm 264 around the rotation axis A14. Thus, the first heating region RH11 moves within the upper surface of the substrate W.

As shown in FIG. 18, the organic solvent nozzle 233 is integrated with the first lamp heater 252. That is, the first lamp heater 252 and the organic solvent nozzle 233 are included in the upper surface head 230. The upper surface head 230 has a configuration in which the organic solvent nozzle 233 is integrated with the first lamp heater 252. The upper surface head 230 has both a function as a processing liquid nozzle which discharges the organic solvent as the processing liquid and a function as a lamp heater. Further, the first gas nozzle 234 is mounted on the upper surface head 230.

The upper surface head 230 includes the first lamp housing 255 as a housing. The organic solvent nozzle 233 is inserted through the inside of the first lamp housing 255 in the vertical direction. Further, the first gas nozzle 234 is mounted on an outer circumference 255a of the first lamp housing 255 in a vertical direction.

The organic solvent nozzle 233 and the first lamp 254 are insulated by the first heat sink 256, and thus, the organic solvent flowing through the organic solvent nozzle 233 is minimized from a heat effect from the first lamp 254.

As shown in FIG. 17, the first gas nozzle 234 is disposed on the tip end side of the third arm 264 with respect to the first lamp heater 252. As shown in FIG. 19, the first gas discharge port 234a of the first gas nozzle 234 is adjacent to the first light emitting part 254A of the first lamp heater 252 when seen from below.

As shown by an alternate long and two short dashes line in FIG. 17, when the first lamp heater 252 faces the outer circumferential portion of the upper surface of the substrate W, the first gas nozzle 234 is disposed on the upstream side in the rotation direction R of the substrate W with respect to the first lamp heater 252. That is, a first spraying region RB11 (refer to FIG. 25E, and the like) on the upper surface of the substrate W on which the gas from the first gas nozzle 234 is sprayed is set on the upstream side in the rotation direction R of the substrate W with respect to the first heating region RH11 which is heated by the radiation of light from the first lamp heater 252.

As shown in FIG. 16, the second heating unit 271 includes a second lamp heater 272 and a second heater moving unit which moves the second lamp heater 272.

As shown in FIG. 20, the second lamp heater 272 is a radiant heating heater which irradiates the substrate W with the light containing at least one of near infrared light, visible light, and ultraviolet light to heat the substrate W by radiation. The second lamp heater 272 includes a second lamp 274, a second lamp housing 275 which accommodates the second lamp 274, and a second heat sink 276 which cools the inside of the second lamp housing 275. Further, the second gas nozzle 235 is mounted on an outer circumference 275a of the second lamp housing 275 in the vertical direction.

The second lamp 274 includes a disc-shaped second lamp substrate 277 and a plurality of (six in the example of FIG. 21) second light sources 278 mounted on a lower surface of the second lamp substrate 277. Each of the second light sources 278 emits light having a wavelength in a range of 200 nm to 1100 nm (light containing at least one of near-infrared light, visible light, and ultraviolet light). Each of the second light source 278 is, for example, an LED. As shown in FIG. 21, the plurality of second light sources 278 is disposed on the lower surface of the second lamp substrate 277. In the example of FIG. 21, six second light sources 278 are disposed in two rows of three in an extending direction of the first arm 240. An arrangement density of the second light sources 278 on the second lamp substrate 277 is substantially uniform and is substantially the same as the arrangement density of the first light sources 258. The second lamp substrate 277 is supported from below by a second bottom wall 280 described below via a connector 290. The plurality of second light sources 278 constitutes a second light emitting part 274A which expands in the horizontal direction. The second light emitting part 274A is smaller than the first light emitting part 254A.

The light emitted from each of the second light sources 278 includes at least one of near infrared light, visible light and ultraviolet light. A wavelength of the light emitted from each of the second light sources 278 is a wavelength in a range of 200 nm to 1100 nm, more preferably in a range of 390 nm to 800 nm.

As shown in FIG. 20, the second lamp housing 275 includes a substantially square tubular second side wall 279 and a substantially rectangular second bottom wall 280. The second side wall 279 is made of a material having chemical resistance such as PTFE. The second bottom wall 280 is made of a material allowing light transmission and having heat resistance such as quartz. The second lamp housing 275 is smaller than the substrate W in a plan view.

The second heat sink 276 includes a second heat sink body 281 and a second cooling mechanism 282 which supplies a cooling fluid to the second heat sink body 281 to cool the second heat sink body 281. The second heat sink body 281 is formed in a container shape having a predetermined shape using a metal having excellent heat transfer characteristics (for example, aluminum, iron, copper, or the like). The second cooling mechanism 282 includes a cooling fluid supply source 282a, a cooling fluid supply pipe 282b which supplies a cooling fluid from the supply source 282a to the second heat sink body 281, and a cooling fluid return pipe 282c which returns the cooling fluid supplied to the second heat sink body 281 to the supply source 282a.

In the example of FIG. 20, as the second cooling mechanism 282, a cooling gas is supplied as the cooling fluid to the second heat sink body 281. That is, the second heat sink 276 is an air-cooled heat sink. The second lamp 274 and surroundings thereof are heated according to the light emission of the plurality of second light sources 278. However, since the inside of the second lamp housing 275 is cooled by the second heat sink 276, it is possible to prevent the inside of the second lamp housing 275 from being excessively heated. In the second heat sink 276, a cooling liquid such as cooling water may be used as the cooling fluid.

As shown in FIG. 17, the second lamp heater 272 is mounted on the first arm 240. The second lamp heater 272 is disposed closer to the rotation axis A12 than the chemical liquid nozzle 231. That is, the second heater moving unit which moves the second lamp heater 272 includes a first moving device (a second heating region moving unit, a second spraying region moving unit) 239. The first moving device 239 holds the second lamp heater 272 at a predetermined height. The first moving device 239 moves the second lamp heater 272 horizontally by rotating the first arm 240 around the rotation axis A12.

When the second lamp 274 emits light, that is, when the plurality of second light sources 278 emit light, as shown in FIG. 20, the light emitted from the second lamp 274 (the light containing at least one of near infrared light, visible light, and ultraviolet light) is transmitted through the second lamp housing 275 and is radiated to a second irradiation region R12 on the upper surface of the substrate W held by the spin chuck 5R. As described above, IPA is adopted as the organic solvent, and the IPA transmits almost all light having a wavelength of 200 nm to 1100 nm. Since the wavelength of the light emitted from the second lamp 274 is 200 nm to 1100 nm (more preferably 390 nm to 800 nm), the light emitted from the second lamp 274 is not absorbed by the liquid film LF1 and is transmitted through the liquid film LF1. Therefore, the light radiated from an outer surface of the second lamp housing 275 is transmitted through the liquid film LF1 and is radiated to the second irradiation region R12. Thus, a pattern P1 (refer to FIG. 23) formed in the second irradiation region R12 and surrounding portions thereof (hereinafter, referred to as "second heating region RH12") on the upper surface of the substrate W is heated by radiation, and a temperature thereof is increased. Since the pattern P1 is formed on the surface Wa of the substrate W (refer to FIG. 23), the pattern P1 is warmed by heat transfer from the surface Wa of the substrate W to be heated, and the temperature thereof is increased. The organic solvent in contact with the second heating region RH12 is warmed and the organic solvent is evaporated by the temperature of the pattern P1 formed in the second heating region RH12 being increased to a predetermined heating temperature equal to or higher than the boiling point of the organic solvent. The second heating region RH12 is smaller than the first heating region RH11 (refer to FIG. 18 and the like).

In this state, as shown in FIG. 17, the first moving device 239 moves the second lamp heater 272 horizontally by rotating the first arm 240 around the rotation axis A12. Thus, the second heating region RH12 formed on a part of the upper surface of the substrate W moves within the upper surface of the substrate W.

As shown in FIG. 17, the second gas nozzle 235 is disposed on the tip end side of the first arm 240 with respect to the second lamp heater 272. As shown by an alternate long and two short dashes line in FIG. 17, when the second lamp heater 272 is disposed corresponding to the outer circumferential portion of the upper surface of the substrate W, the second gas nozzle 235 is disposed on the upstream side in the rotation direction R of the substrate W with respect to the second lamp heater 272. That is, the second spraying region RB12 (refer to FIG. 28B and the like described later) on the upper surface of the substrate W on which the gas from the second gas nozzle 235 is sprayed is set on the upstream side in the rotation direction R of the substrate W with respect to the second heating region RH12 which is heated by the radiation of light from the second lamp heater 272.

As shown in FIG. 16, the processing cup 7R includes a plurality of guards 284 which receives the processing liquid excluded outward from the substrate W, a plurality of cups 283 which receives the processing liquid guided downward by the plurality of guards 284, and a cylindrical outer wall member 288 which surrounds the plurality of guards 284 and the plurality of cups 283. FIG. 16 shows an example in which four guards 284 and three cups 283 are provided, and the outermost cup 283 is integrated with the third guard 284 from the top.

The guard 284 includes a cylindrical portion 285 which surrounds the spin chuck 5R, and an annular ceiling portion 286 which extends obliquely upward from an upper end portion of the cylindrical portion 285 toward the rotation axis A11. A plurality of ceiling portions 286 vertically overlaps each other, and a plurality of cylindrical portions 285 is disposed concentrically. An upper end of the annular shape of the ceiling portion 286 corresponds to an upper end 284u of the guard 284 which surrounds the substrate W and the spin base 216 in a plan view. Each of the plurality of cups 283 is disposed below the plurality of cylindrical portions 285. The cup 283 forms an annular liquid receiving groove which receives the processing liquid guided downward by the guard 284.

The processing unit 2R includes a guard lifting unit 287 which individually moves the plurality of guards 284 up and down. The guard lifting unit 287 positions the guard 284 at an arbitrary position from the upper position to the lower position. FIG. 16 shows a state in which two guards 284 are disposed in the upper position and the remaining two guards 284 are disposed in the lower position. The upper position is a position at which the upper end 284u of the guard 284 is disposed above a holding position at which the substrate W held by the spin chuck 5R is disposed. The lower position is a position at which the upper end 284u of the guard 284 is disposed below the holding position.

When the processing liquid is supplied to the rotating substrate W, at least one guard 284 is disposed at the upper position. When the processing liquid is supplied to the substrate W in this state, the processing liquid is shaken off from the substrate W to the outside. The shaken-off processing liquid collides with an inner surface of the guard 284 which horizontally faces the substrate W, and is guided to the cup 283 corresponding to the guard 284. Thus, the processing liquid excluded from the substrate W is collected in the cup 283.

Figure 22:
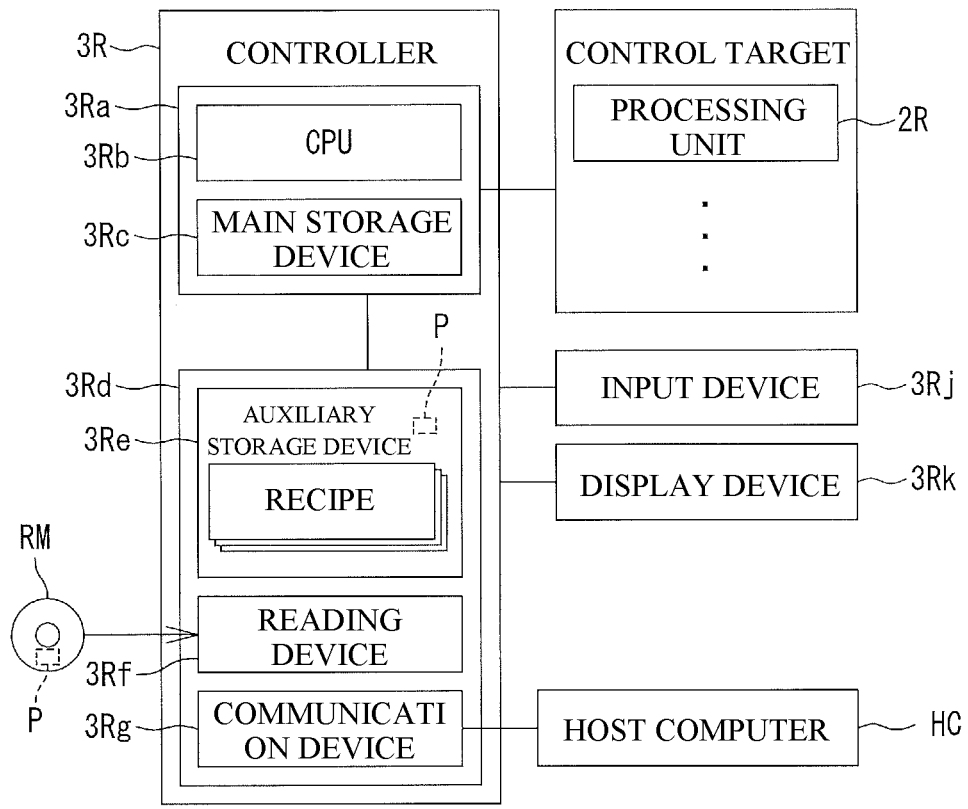
FIG. 22 is a block diagram showing hardware of a controller shown in FIG. 15A.

FIG. 22 is a block diagram showing hardware of the controller 3R.

The controller 3R is a computer including a computer main body 3Ra and a circumferential device 3Rd connected to the computer main body 3Ra. The computer main body 3Ra includes a center processing unit (CPU) 3Rb which executes various instructions and a main storage device 3Rc which stores information. The circumferential device 3Rd includes an auxiliary storage device 3Re which stores information such as a program P, a reading device 3Rf which reads information from a removable media RM, and a communication device 3Rg which communicates with another device such as a host computer HC.

The controller 3R is connected to an input device 3Rj and a display device 3Rk. The input device 3Rj is operated when an operator such as a user and a maintenance person inputs information to the substrate processing apparatus 1R. The information is displayed on a screen of the display device 3Rk. The input device 3Rj may be any one of a keyboard, a pointing device, and a touch panel, or may be a device other than these. A touch panel display which also serves as the input device 3Rj and the display device 3Rk may be provided in the substrate processing apparatus 1R.

The CPU 3Rb executes the program P stored in the auxiliary storage device 3Re. The program P in the auxiliary storage device 3Re may be pre-installed in the controller 3R, may be sent from the removable media RM to the auxiliary storage device 3Re through the reading device 3Rf, and may be sent from an external device such as the host computer HC to the auxiliary storage device 3Re through the communication device 3Rg.

The auxiliary storage device 3Re and the removable media RM are non-volatile memories which retain storage even when electric power is not supplied. The auxiliary storage device 3Re is, for example, a magnetic storage device such as a hard disc drive. The removable media RM is, for example, an optical disc such as a compact disc or a semiconductor memory such as a memory card. The removable media RM is an example of a computer-readable recording medium on which the program P is recorded. The removable media RM is a non-temporary type recording medium.

The auxiliary storage device 3Re stores a plurality of recipes. The recipe is information which defines processing contents, processing conditions, and processing procedures of the substrate W. The plurality of recipes is different from each other in at least one of the processing contents, the processing conditions, and the processing procedures of the substrate W. The controller 3R controls the substrate processing apparatus 1R so that the substrate W is processed according to the recipe specified by the host computer HC.

As shown in FIGS. 16 and 22, the CPU 3Rb of the controller 3R controls each part of the processing unit 2R according to the program P. Specifically, the CPU 3Rb controls operations of the spin motor 219, the chuck pin drive unit 220, the first moving device 239, the second moving device 244, the third moving device 263, the guard lifting unit 287, and the like according to the program P. Further, the controller 3R adjusts the electric power supplied to the first lamp heater 252, the second lamp heater 272, and the like. Further, the controller 3R controls the opening and closing of the chemical liquid valve 237, the rinse liquid valve 242, the organic solvent valve 246, the first gas valve 248, and the like, and controls an actuator of the first flow rate adjusting valve 249 to control the opening degree of the first flow rate adjusting valve 249. The controller 3R is programmed to perform a substrate processing example described below.

Figure 23:
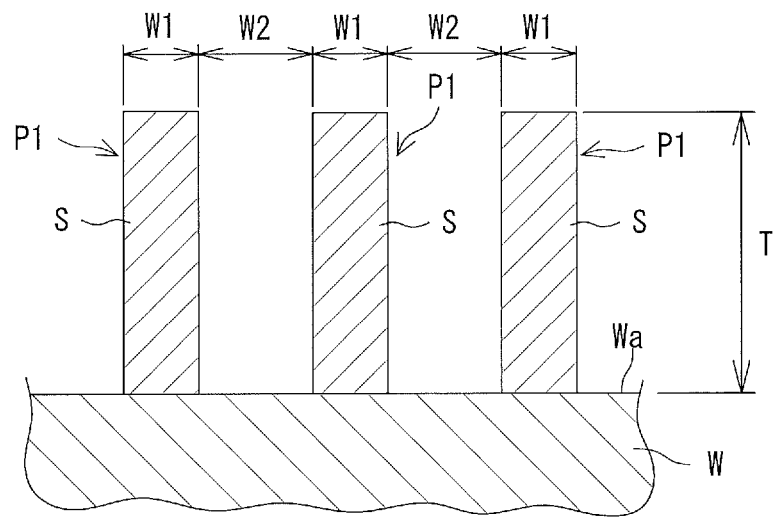
FIG. 23 is an enlarged cross-sectional view showing a surface of a substrate to be processed by the substrate processing apparatus according to the fourth embodiment.

FIG. 23 is an enlarged cross-sectional view showing the surface Wa of the substrate W to be processed by the substrate processing apparatus 1R. The substrate W to be processed is a semiconductor wafer such as a silicon wafer, and the surface Wa of the substrate W corresponds to a device forming surface on which a device such as a transistor or a capacitor is formed. The pattern P1 is formed on the surface Wa of the substrate W which is a pattern forming surface. The pattern P1 is, for example, a fine pattern. As shown in FIG. 23, the pattern P1 may be a structure in which structures S having a convex shape are disposed in a matrix. In this case, a line width W1 of the structure S may be, for example, about 1 nm to 45 nm, and a gap W2 between the patterns P1 may be, for example, about 1 nm to several μm. A height (a film thickness) of the pattern P1 is, for example, about 10 nm to 1 μm. Further, the pattern P1 may have, for example, an aspect ratio (a ratio of the height T to the line width W1) of about 5 to 100 (typically, about 5 to 30). Further, the pattern P1 may be a pattern in which line-shaped patterns formed by fine trenches are repeatedly arranged. Further, the pattern P1 may be formed by providing a plurality of fine holes (voids or pores) in a thin film.

Next, a first example of the substrate processing performed by the substrate processing apparatus 1R according to the fourth embodiment will be described.

Hereinafter, a case in which the substrate W on which the pattern P1 is formed on the surface Wa is processed will be described.

Figure 24:
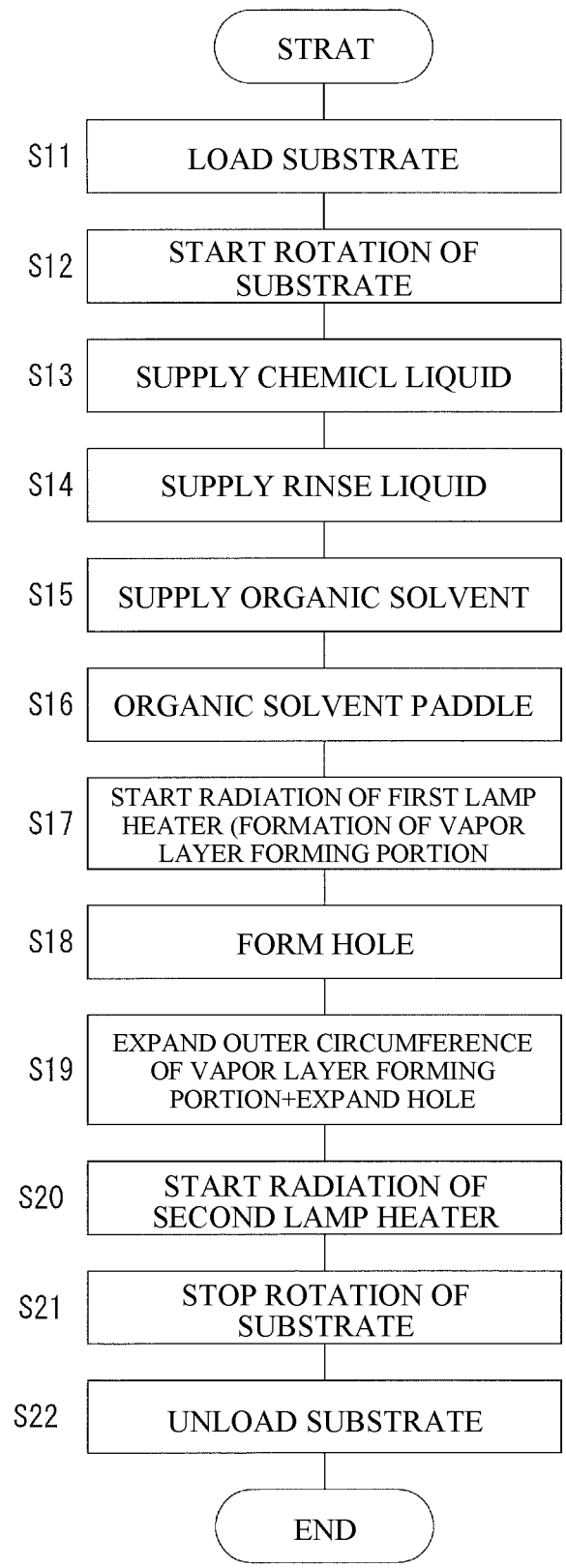
FIG. 24 is a process diagram for explaining a first example of the substrate processing performed by the substrate processing apparatus according to the fourth embodiment.

FIG. 24 is a process diagram for explaining the first example of the substrate processing performed by the substrate processing apparatus 1R. FIGS. 25A to 25F are schematic views showing states of the substrate W when the first example of the substrate processing is performed. FIGS. 26A to 26D are schematic views of the substrate W in each of the states when seen from above. Hereinafter, the first example of the substrate processing performed by the substrate processing apparatus 1R will be described with reference to FIGS. 15A to 24. FIGS. 25A to 25F and 26A to 26D are referred to as appropriate.

When the substrate W is processed by the substrate processing apparatus 1, a loading step (Step S11 in FIG. 24) of loading the substrate W into the chamber 4 is performed.

Specifically, in a state in which all guards 284 are in the lower position and all scan nozzles are in a standby position, the center robot CR1 (refer to FIG. 15A) causes the hand H11 to enter the chamber 4R while the substrate W is supported with the hand H11. Then, the center robot CR1 places the substrate W on the hand H11 on the plurality of chuck pins 217 in a state in which the surface Wa of the substrate W faces upward. After that, the plurality of chuck pins 217 are pressed against the outer circumferential surface of the substrate W, and the substrate W is gripped. The center robot CR1 places the substrate W on the spin chuck 5R and then retracts the hand H11 from the inside of the chamber 4R.

Next, the controller 3R controls the spin motor 219 to start the rotation of the substrate W (Step S12 in FIG. 24). Thus, the substrate W rotates at a chemical liquid supply speed (100 rpm or more, less than 1000 rpm).

Next, a chemical liquid supply step (Step S13 in FIG. 24) of supplying the chemical liquid to the upper surface of the substrate W and forming a liquid film of the chemical liquid which covers the entire upper surface of the substrate W is performed. Specifically, the controller 3R controls the first moving device 239 to move the chemical liquid nozzle 231 from the standby position to the processing position. After that, the controller 3R opens the chemical liquid valve 237 and starts the discharge of the chemical liquid from the chemical liquid nozzle 231. When a predetermined time elapses after the chemical liquid valve 237 is opened, the controller 3R closes the chemical liquid valve 237. Thus, the discharge of the chemical liquid from the chemical liquid nozzle 231 is stopped. After that, the controller 3R controls the first moving device 239 to move the chemical liquid nozzle 231 to the standby position.

The chemical liquid discharged from the chemical liquid nozzle 231 collides with the upper surface of the substrate W which is rotating at the chemical liquid supply speed, and then flows outward along the upper surface of the substrate W by a centrifugal force. Therefore, the chemical liquid is supplied to the entire upper surface of the substrate W, and a liquid film of the chemical liquid which covers the entire upper surface of the substrate W is formed. When the chemical liquid nozzle 231 is discharging the chemical liquid, the controller 3R may control the first moving device 239 to move the landing position of the chemical liquid with respect to the upper surface of the substrate W between the center portion and the outer circumferential portion or to stop the landing position of the chemical liquid at the center portion of the upper surface of the substrate W.

Next, a rinse liquid supply step (Step S14 in FIG. 24) in which a rinse liquid is supplied to the upper surface of the substrate W to wash away the chemical liquid on the substrate W is performed.

Specifically, in a state in which at least one guard 284 is located in the upper position, the controller 3R controls the second moving device 244 to move the rinse liquid nozzle 232 from the standby position to the processing position. After that, the controller 3R opens the rinse liquid valve 242 and starts the discharge of the rinse liquid from the rinse liquid nozzle 232. Before the discharge of the rinse liquid is started, the controller 3R may control the guard lifting unit 287 to move at least one guard 284 vertically to switch the guard 284 which receives the processing liquid excluded from the substrate W. When a predetermined time elapses after the rinse liquid valve 242 is opened, the controller 3R closes the rinse liquid valve 242 and stops the discharge of the rinse liquid from the rinse liquid nozzle 232. After that, the controller 3R controls the second moving device 244 to move the rinse liquid nozzle 232 to the standby position.

Next, an organic solvent supply step (Step S15 in FIG. 24) of supplying the organic solvent to the upper surface of the substrate W to replace the rinse liquid on the upper surface of the substrate W with the organic solvent is performed.

Specifically, in a state in which at least one guard 284 is located at the upper position, the controller 3R controls the spin chuck 5R to rotate the substrate W at a replacement speed (a substrate rotating step). The replacement speed may be equal to or different from the rinse liquid supply speed. Further, the controller 3R controls the third moving device 263 to move the upper surface head 230 including the organic solvent nozzle 233 from the standby position to the processing position. In a state in which the organic solvent nozzle 233 is disposed at the processing position, the controller 3R opens the organic solvent valve 246 and starts the discharge of the organic solvent from the organic solvent nozzle 233. Before the discharge of the organic solvent is started, the controller 3R may control the guard lifting unit 287 to vertically move at least one guard 284 to switch the guard 284 which receives the processing liquid removed from the substrate W.

Figure 25A:
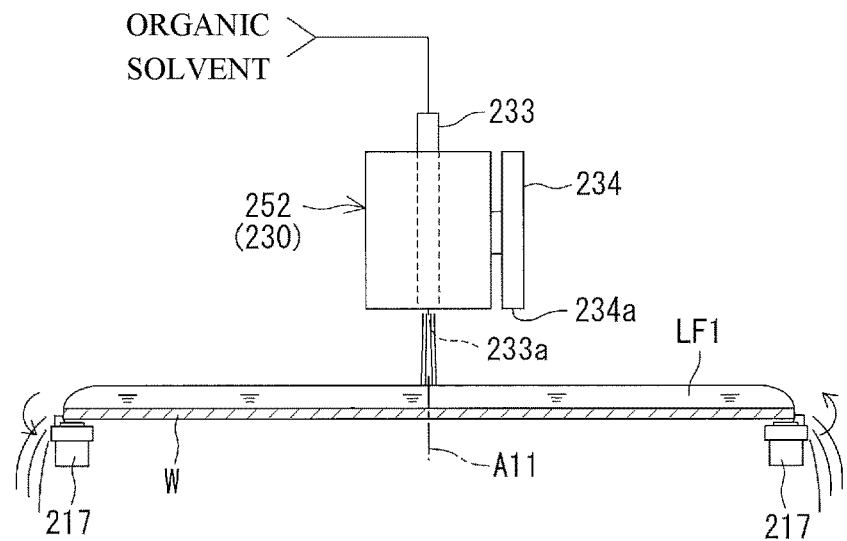
FIGS. 25A and 25B are schematic views showing a state of the substrate when the first example of the substrate processing performed by the substrate processing apparatus according to the fourth embodiment is performed.

The organic solvent discharged from the organic solvent nozzle 233 collides with the upper surface of the substrate W which is rotating at the replacement speed, and then flows outward along the upper surface of the substrate W. The rinse liquid on the substrate W is replaced with the organic solvent discharged from the organic solvent nozzle 233. Thus, as shown in FIG. 25A, a liquid film LF1 of the organic solvent which covers the entire upper surface of the substrate W is formed (a liquid film forming step). In the first example of the substrate processing according to the fourth embodiment, the supply of the organic solvent is performed in a state in which the upper surface head 230 is stationary at a center processing position at which the organic solvent discharged from the organic solvent nozzle 233 collides with the center portion of the upper surface of the substrate W. However, the controller 3R may control the third moving device 263 to move the landing position of the organic solvent with respect to the upper surface of the substrate W between the center portion and the outer circumferential portion.

After that, an organic solvent paddle step (Step S16 in FIG. 24) of holding the liquid film LF1 on the upper surface of the substrate W is performed. Specifically, in a state in which the upper surface head 230 is stationary at the center processing position, the controller 3R controls the spin motor 219 to reduce the rotation speed of the substrate W from the replacement speed to a paddle speed. The paddle speed is, for example, a speed of more than 0 and 50 rpm or less. The deceleration from the replacement speed to the paddle speed is performed stepwise. After the rotation speed of the substrate W is reduced to the paddle speed, the controller 3R closes the organic solvent valve 246 and stops the discharge of the organic solvent.

When the rotation speed of the substrate W is reduced to the paddle speed, the centrifugal force applied to the organic solvent on the substrate W weakens. Therefore, the organic solvent is not excluded from the upper surface of the substrate W, or only a small amount is excluded. Therefore, even after the discharge of the organic solvent is stopped, the liquid film LF1 which covers the entire upper surface of the substrate W is held on the substrate W. Even when a small amount of the rinse liquid remains between patterns P1 (refer to FIG. 23) after the rinse liquid is replaced with liquid film LF1, the rinse liquid is dissolved in the organic solvent constituting the liquid film LF1 and is diffused into the organic solvent. Thus, the rinse liquid remaining between the patterns P1 can be reduced.

Figure 25B:
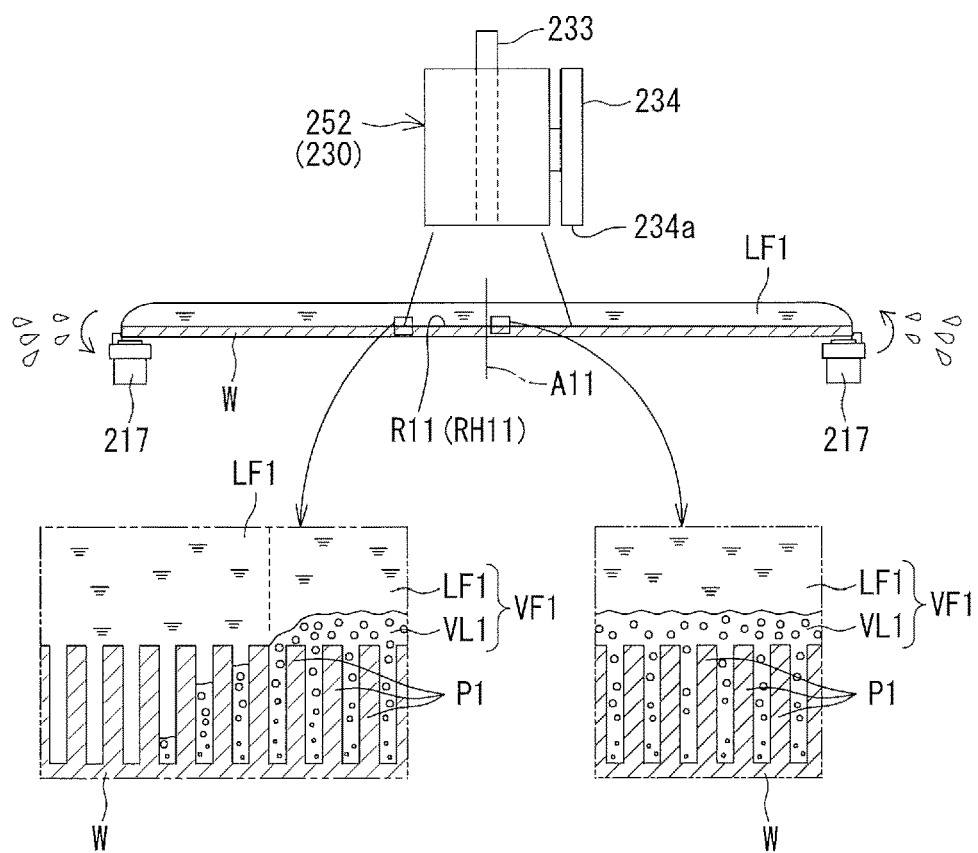

Next, after the liquid film LF1 is formed on the upper surface of the substrate W, a vapor layer forming part forming step (Step S17 in FIG. 24) of forming a vapor layer forming part VF1 on the center portion of the upper surface of the substrate W by the substrate W being heated due to the radiation of the light from the first lamp heater 252 included in the upper surface head 230 is performed. As shown in FIG. 25B, the vapor layer forming part VF1 is a region in which a vapor layer VL1 is formed between the organic solvent and the upper surface of the substrate W and the liquid film LF1 is held on the vapor layer VL1.

Specifically, in a state in which the upper surface head 230 is stationary at the center processing position, the controller 3R starts supplying of electric power to the first lamp heater 252 and starts the light emission of the plurality of first light sources 258 included in the first lamp heater 252 while the rotation of the substrate W is maintained at the paddle speed. When the plurality of first light sources 258 emits light, the light is emitted from the first lamp heater 252 as shown in FIG. 25B. The light emitted from the first lamp heater 252 is not absorbed by the liquid film LF1 and is transmitted through the liquid film LF1 and is radiated to the first irradiation region R11. Thus, the first heating region RH11 is heated by radiation. Then, the pattern P1 of the first heating region RH11 is warmed by the first heating region RH11, and the pattern P1 is heated to a predetermined heating temperature equal to or higher than the boiling point of the organic solvent. Thus, the organic solvent in contact with the pattern P1 of the first heating region RH11 is warmed. The first heating region RH11 is set on the center portion of the upper surface of the substrate W and is not set at the outer circumferential portion of the upper surface of the substrate W.

Figure 26A:
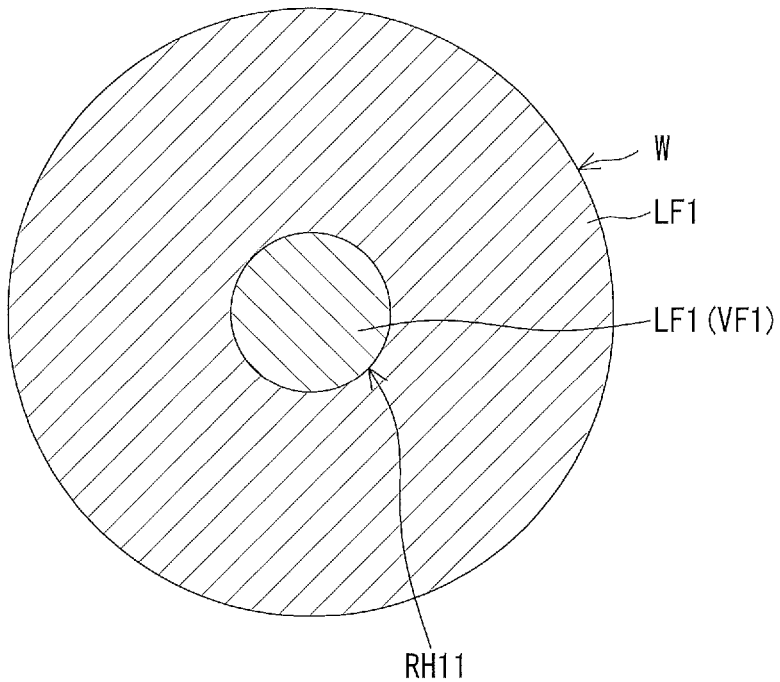
FIGS. 26A and 26B are schematic views of the substrates in the states shown in FIGS. 25B and 25C when seen from above.

Further, when the temperature of the first heating region RH11 (that is, the temperature of the pattern P1 formed in the first heating region RH11) is equal to or higher than the boiling point of the organic solvent, the organic solvent is evaporated at an interface between the liquid film LF1 and the substrate W, and a large number of small bubbles intervene between the organic solvent and the upper surface of the substrate W. As the organic solvent is evaporated everywhere at the interface between the liquid film LF1 and the substrate W, the vapor layer VL1 (refer to FIG. 25B) containing vapor of the organic solvent is formed between the liquid film LF1 and the substrate W. Thus, the organic solvent is separated from the upper surface of the substrate W. and the liquid film LF1 floats from the upper surface of the substrate W. Then, the liquid film LF1 is held on the vapor layer VL1. At this time, the frictional resistance acting on the liquid film LF1 on the substrate W is small enough that it can be regarded as zero. That is, as shown in FIG. 26A, the vapor layer forming part VF1 is formed on the center portion of the upper surface of the substrate W by the first heating region RH11 being heated by the first lamp heater 252.

On the other hand, a region outside the first heating region RH11 on the upper surface of the substrate W has not reached the heating temperature. Therefore, the vapor layer VL1 is not formed at all, or an amount of the vapor layer VL1 formed is insufficient, and the liquid film LF1 cannot be maintained at a sufficient height position by the vapor layer VL1. Therefore, the vapor layer forming part VF1 is not formed in the region outside the first heating region RH11 on the upper surface of the substrate W. Since the substrate W is rotating, the vapor layer forming part VF1 is a substantially circular region which covers the center portion of the upper surface of the substrate W.

Since the substrate W is rotating, a centrifugal force is applied to the liquid film LF1 of the vapor layer forming part VF1. Further, a large temperature difference occurs between the first heating region RH11 and the region outside the first heating region RH11 on the upper surface of the substrate W. Due to such a temperature difference, the heat convection flowing from the center portion to the outer circumferential portion is formed on the upper surface of the substrate W. A hole H is formed in a center portion of the liquid film LF1 of the vapor layer forming part VF1 by the centrifugal force and the heat convection (Step S18 in FIG. 24).

Figure 25C:
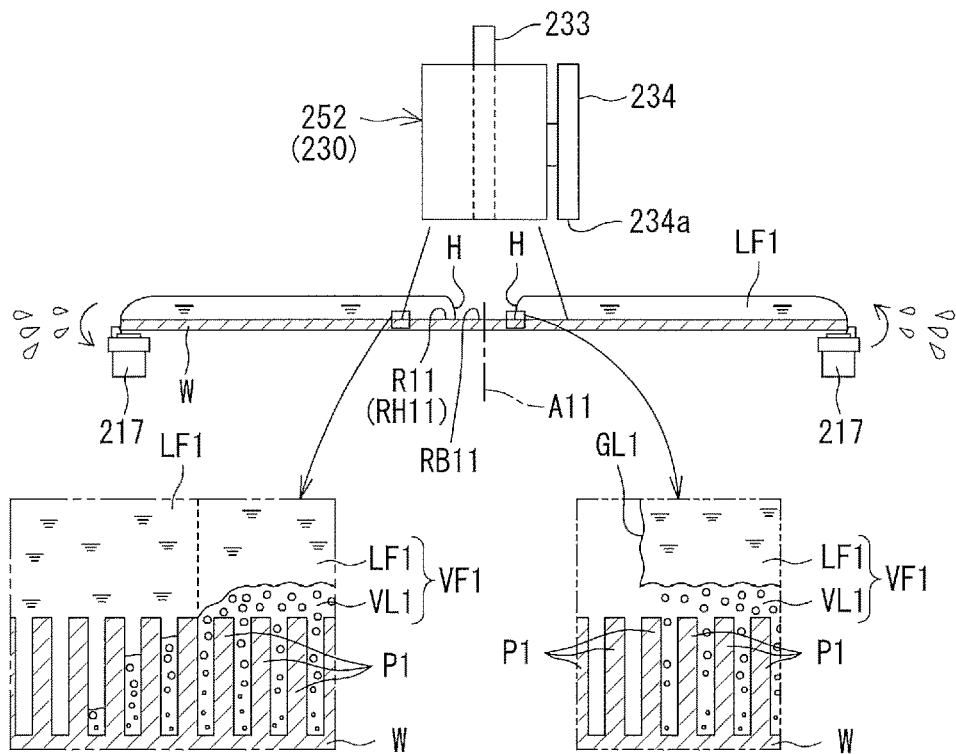
FIGS. 25C and 25D are schematic views showing a state subsequent to that of FIG. 25B.
Figure 26B:
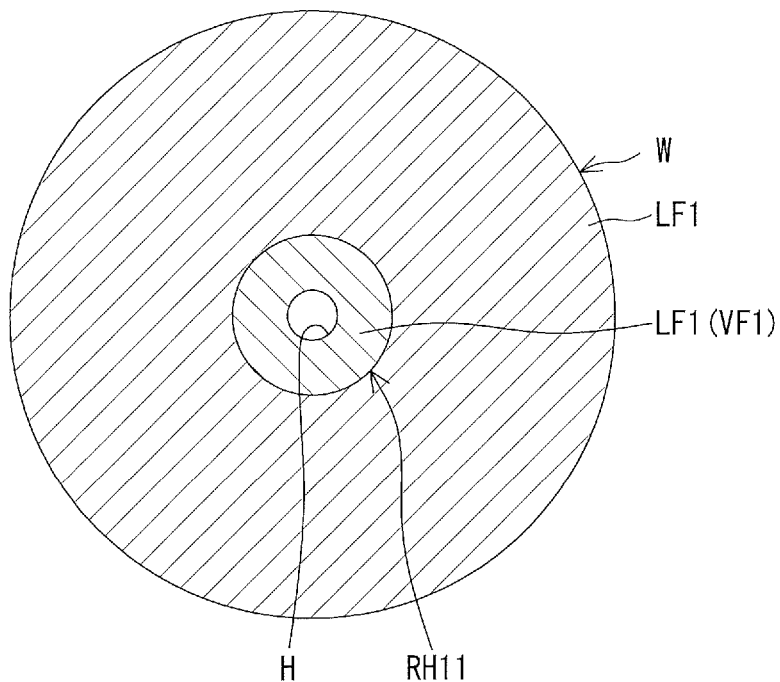

Since the rotation speed of the substrate W is the paddle speed, the centrifugal force applied to the liquid film LF1 of the vapor layer forming part VF1 is weak. Further, the heat convection generated on the upper surface of the substrate W is also relatively weak. However, in the vapor layer forming part VF1, since the frictional resistance acting on the liquid film LF1 on the substrate W is small enough that it can be regarded as zero, the organic solvent included in the liquid film LF1 is pushed outward by a pressure of the gas due to the centrifugal force and the heat convection. Thus, a thickness of the center portion of the liquid film LF1 is reduced, and as shown in FIGS. 25C and 26B, the substantially circular hole H is formed in the center portion of the liquid film LF1. The hole H is an exposing hole which exposes the upper surface of the substrate W. As the liquid film LF1 is partially removed by the formation of the holes H, the vapor layer forming part VF1 has an annular shape. Then, a gas-liquid interface GL1 is formed between the liquid film LF1 of the vapor layer forming part VF1 and the hole H, that is, on an inner circumference of the liquid film LF1 of the vapor layer forming part VF1.

Figure 25D:
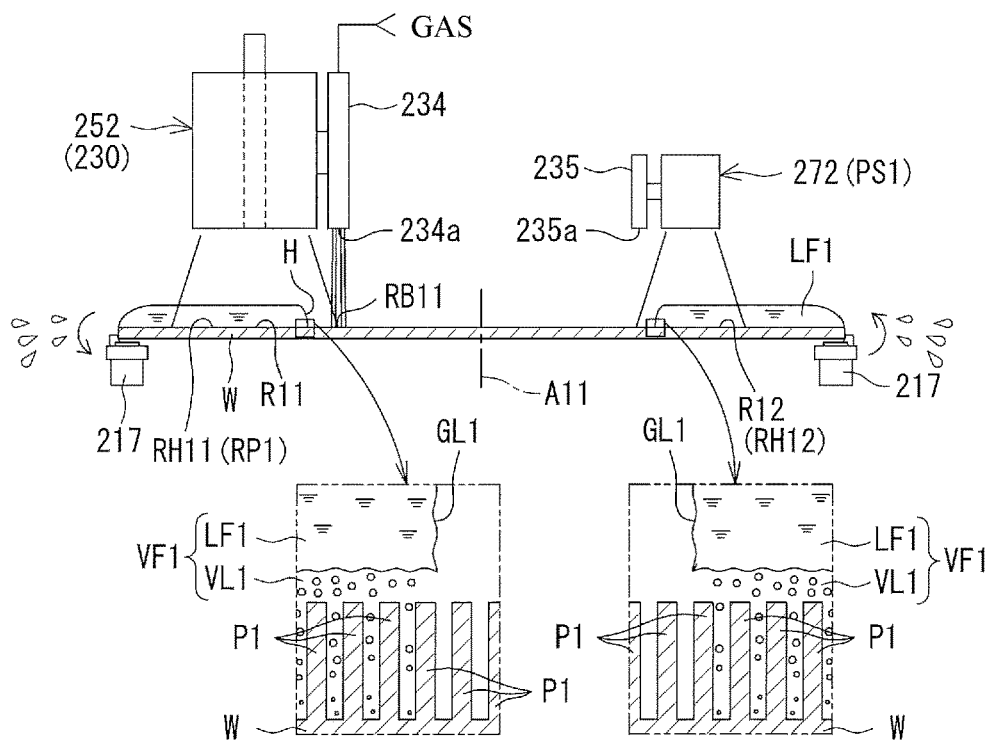
Figure 26C:
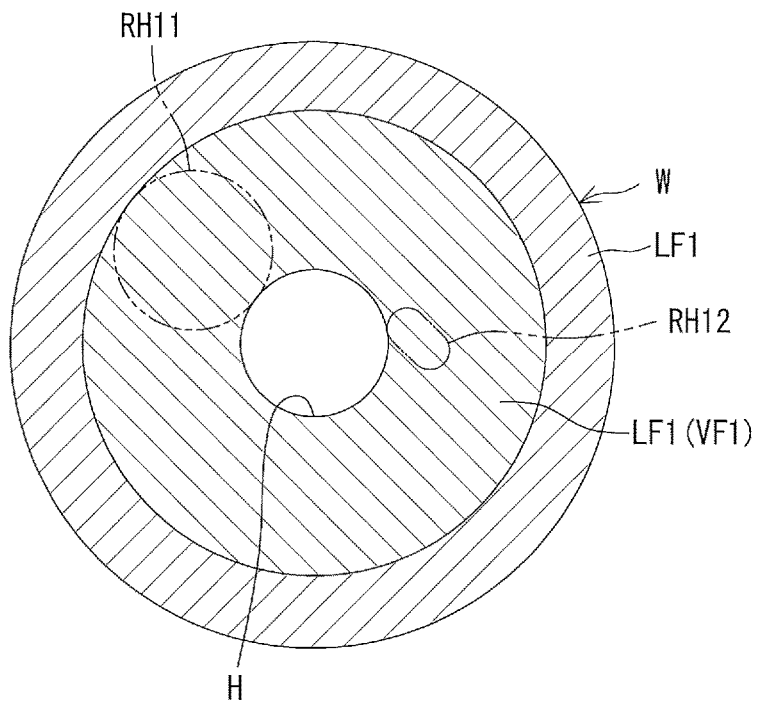
FIGS. 26C and 26D are schematic views of the substrates in the states shown in FIGS. 25D and 25F when seen from above.

Next, as shown in FIGS. 25D and 26C, a vapor layer forming part moving step (Step S19 in FIG. 24) of moving the vapor layer forming portion VF1 toward the outer circumference of the substrate W is performed. The vapor layer forming part moving step (Step S19 in FIG. 24) includes an outer circumference expanding step of expanding an outer circumference of the vapor layer forming part VF1 and a hole expanding step of expanding an outer edge of the hole H (that is, the inner circumference of the vapor layer forming part VF1). The hole expanding step is performed in parallel with the outer circumference expanding step.

Prior to the start of the vapor layer forming part moving step (Step S19 in FIG. 24), the controller 3R controls the spin motor 219 to adjust the rotation speed of the substrate W from the paddle speed to a forming part moving speed. The forming part moving speed is, for example, a speed of more than 0 and 100 rpm or less. The forming part moving speed may be the same as the paddle speed.

Prior to the start of the vapor layer forming part moving step (Step S19 in FIG. 24), the controller 3R opens the first gas valve 248 and starts the discharge of the gas from the first gas discharge port 234a of the first gas nozzle 234 (a first spraying step). A temperature of the gas supplied to the first gas nozzle 234 may be room temperature or higher than room temperature. The gas discharged from the first gas nozzle 234 collides with the liquid film LF1 in the first spraying region RB11 set on the center portion of the upper surface of the substrate W, and then flows outward along the surface of the liquid film LF1 in all directions. Thus, an air flow flowing outward from the center portion of the upper surface of the substrate W is formed. A flow rate of the gas supplied to the first gas nozzle 234 is, for example, 5 L/min. The inner circumference of the vapor layer forming part VF1 is pushed toward the outer circumference of the substrate W by spraying the gas onto the first spraying region RB11 set inside the inner circumference of the vapor layer forming part VF1.

In the vapor layer forming part moving step (Step S19 in FIG. 24), the controller 3R controls the third moving device 263 to move the upper surface head 230 including the first lamp heater 252 horizontally toward the outer circumference of the substrate W while the gas is discharged from the first gas nozzle 234 and the light is radiated from the first lamp heater 252. Thus, the first heating region RH11 moves in the upper surface of the substrate W toward the outer circumference of the substrate W along an arc-shaped trajectory which passes through the center of the substrate W in a plan view. Since the first heating region RH11 is moved toward the outer circumference of the substrate W while the substrate W is rotating, the entire inner circumference of the substrate W can be satisfactorily heated by the first lamp heater 252. As the first heating region RH11 moves, the outer circumference of the annular vapor layer forming part VF1 is expanded (an outer circumference expanding step).

Further, since the first gas nozzle 234 is provided to be movable with the first lamp heater 252, the first spraying region RB11 moves while a constant distance from the first heating region RH11 is maintained (a first spraying region moving step). The first spraying region RB11 moves toward the outer circumference of the substrate W according to the movement of the first heating region RH11 to the outer circumference of the substrate W. An outer edge of the hole H, that is, the inner circumference of the vapor layer forming part VF1 is expanded by moving the first spraying region RB11 toward the outer circumference of the substrate W (a hole expanding step). In the vapor layer forming part VF1, since the frictional resistance acting on the liquid film LF1 on the substrate W is small enough that it can be regarded as zero, the inner circumference of the vapor layer forming part VF1 can be smoothly moved toward the outer circumference of the substrate W by a small pushing force due to the flow of gas. The inner circumference of the vapor layer forming part VF1 can be expanded by spraying the gas onto the first spraying region RB11 and moving the first spraying region RB11 toward the outer circumference of the substrate W while the inner circumference position of the vapor layer forming part VF1 is controlled with high accuracy. The gas-liquid interface GL1 formed on the inner circumference of the vapor layer forming part VF1 moves toward the outer circumference of the substrate W while a height position thereof is maintained to be higher than an upper end of the pattern P1.

Further, the first spraying region RB11 is set on the upstream side in the rotation direction R of the substrate W with respect to the first heating region RH11. Therefore, the gas can be sprayed to the inner circumference of the vapor layer forming part VF1 while an influence of the generated air flow is minimized. Thus, the inner circumference of the vapor layer forming part VF1 can be satisfactorily expanded.

Further, since the first gas discharge port 234a is adjacent to the first light emitting part 254A when seen from below, the gas can be sprayed onto the inner circumference of the annular vapor layer forming part VF1 formed by the first heating region RH11 heated by the first light emitting part 254A.

Further, the expansion of the hole H in the hole expanding step is promoted not only by the spraying of the gas but also by the centrifugal force acting on the organic solvent on the upper surface of the substrate W due to the rotation of the substrate W. Then, the liquid film LF1 outside the vapor layer forming part VF1 is pushed outward and is discharged to the outside of the substrate W by the organic solvent moving from the center portion side of the substrate W.

In the first example of the substrate processing according to the fourth embodiment, the substrate W is heated from the middle of the vapor layer forming part moving step (Step S19 in FIG. 24) not only by the radiation of the light from the first lamp heater 252 but also by the radiation of the light from the second lamp heater 272 (Step S20 in FIG. 24). The heating of the substrate W using the second lamp heater 272 assists the heating of the substrate W by the radiation of the light from the first lamp heater 252 (an auxiliary heating step).

Prior to the start of the radiation of the light from the second lamp heater 272, the controller 3R controls the first moving device 239 to move the second lamp heater 272 from the standby position to the processing position, and disposes the second lamp heater 272 at a predetermined radiation start position PS1.

When a predetermined period elapses from the start of the radiation of the first lamp heater 252 and the first heating region RH11 reaches a predetermined reference position RP1 as shown in FIG. 25D, the controller 3R starts supplying electric power to the second lamp heater 272, and starts light emission from the plurality of second light sources 278 provided in the second lamp heater 272 (Step S20 in FIG. 24). Thus, the heating of the substrate W by the second lamp heater 272 is started. When the plurality of second light sources 278 emits light, the light is emitted from the second lamp heater 272, and the region below the second lamp heater 272 is irradiated with the light. The light emitted from the second lamp heater 272 is not absorbed by the liquid film LF1 and is transmitted through the liquid film LF1 and is radiated to the second irradiation region R12. Thus, the second heating region RH12 is heated by radiation. Then, the pattern P1 in the second heating region RH12 is warmed by the second heating region RH12, and the pattern P1 is heated to a predetermined heating temperature equal to or higher than the boiling point of the organic solvent. Accordingly, the organic solvent in contact with the pattern P1 of the second heating region RH12 is warmed.

The second heating region RH12 by the second lamp heater 272 disposed at the radiation start position PS1 is separated from the first heating region RH11 located at the reference position RP1 in the rotation direction R. Further, a distance between an inner circumferential end of the second heating region RH12 by the second lamp heater 272 disposed at the radiation start position PS1 and the rotation axis A11 is substantially the same as a distance between an inner circumferential end of the first heating region RH11 located at the reference position RP1 and the rotation axis A11.

Further, it is desirable that the second heating region RH12 is separated from the first heating region RH11, but when the entire portion thereof does not overlap the first heating region RH11, a part thereof may overlap. That is, at least a part of the second heating region RH12 may not overlap the first heating region RH11.

Then, the controller 3R controls the first moving device 239 to move the second lamp heater 272 horizontally toward the outer circumference of the substrate W while the substrate W is heated by the second lamp heater 272. Thus, the second irradiation region R12 moves in the upper surface of the substrate W along a predetermined arc-shaped trajectory toward the outer circumference of the substrate W.

At this time, a turning speed of the first arm 240 is the same as a turning speed of the third arm 264. Therefore, a movement speed of the second heating region RH12 in a radial direction of the substrate W is the same as a movement speed of the first heating region RH11 in the radial direction of the substrate W. That is, while the distance between the inner circumferential end of the second heating region RH12 and the rotation axis A11 is maintained at substantially the same distance as the distance between the inner circumferential end of the first heating region RH11 and the rotation axis A11, the first heating region RH11 and the second heating region RH12 move. Since the first heating region RH11 and the second heating region RH12 are moved toward the outer circumference of the substrate W in the state in which the substrate W is rotating, the first lamp heater 252 and the second lamp heater 272 can satisfactorily heat the entire upper surface of the substrate W while scanning it.

Due to the expansion of the outer circumference of the vapor layer forming part VF1 and the outer edge of the hole H, the vapor layer forming part VF1 moves toward the outer circumference of the substrate W while the liquid film LF1 satisfactorily floats over the entire region of the vapor layer forming part VF1. At this time, the gas-liquid interface GL1 formed on the inner circumference of the vapor layer forming part VF1 moves toward the outer circumference of the substrate W while the height position thereof is maintained to be higher than the upper end of the pattern P1.

Figure 25E:
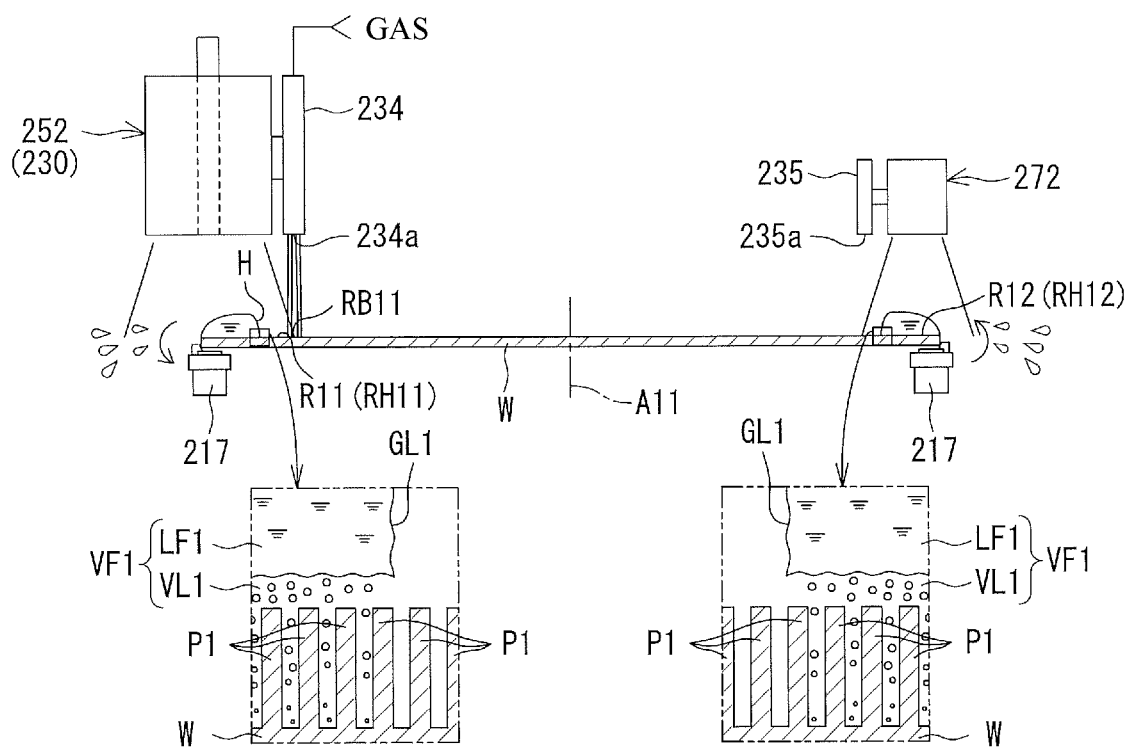
FIGS. 25E and 25F are schematic views showing a state subsequent to that of FIG. 25D.
Figure 25F:
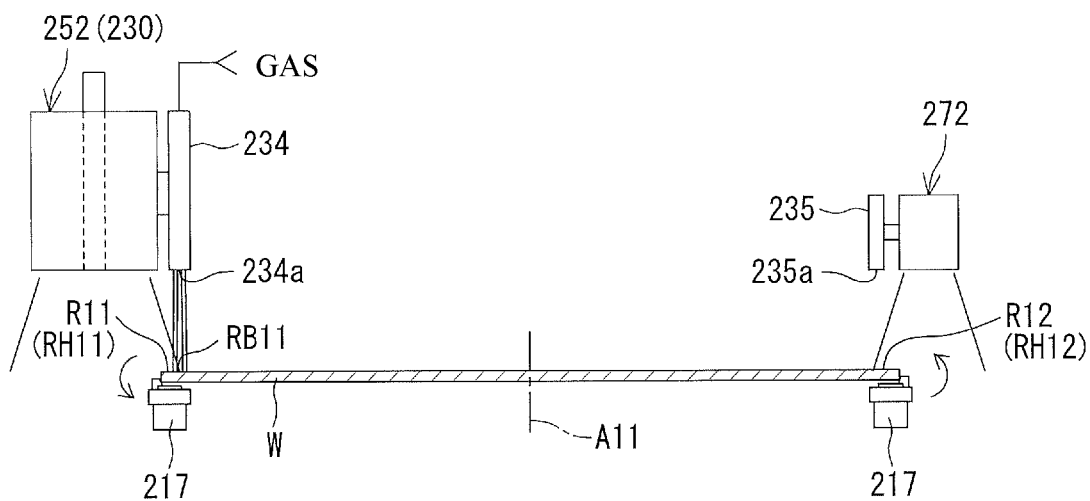
Figure 26D:
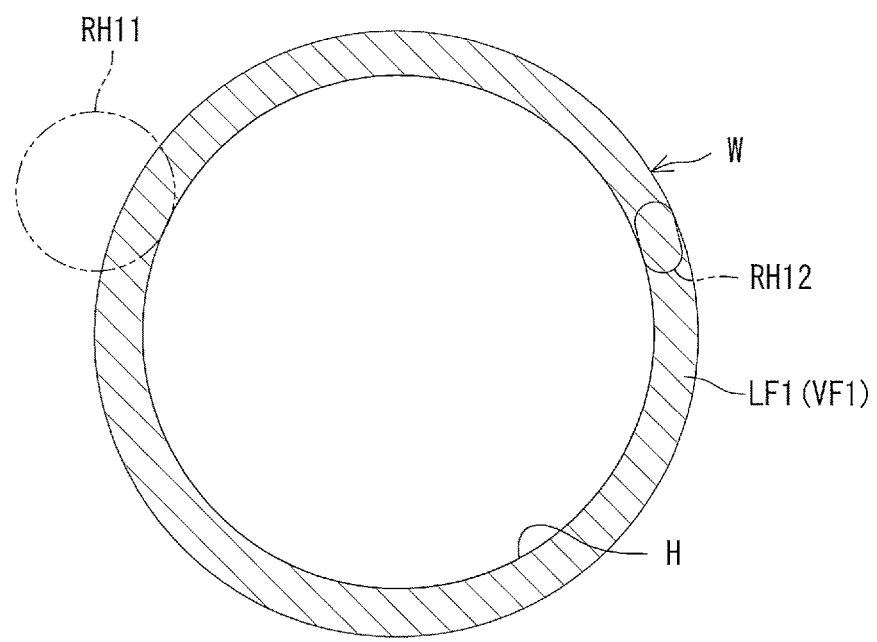

Due to further expansion of the outer circumference of the vapor layer forming part VF1 and the outer edge of the hole H, as shown in FIGS. 25E and 26D, the liquid film LF1 outside the vapor layer forming part VF1 is excluded from the substrate W, and only the annular vapor layer forming part VF1 remains on the upper surface of the substrate W. Then, as shown in FIG. 25F, when the first spraying region RB11 reaches the outer circumferential portion of the substrate W, the outer edge of the hole H (that is, the inner circumference of the vapor layer forming part VF1) is expanded to the outer circumference of the upper surface of the substrate W, and the liquid film LF1 of the vapor layer forming part VF1 is discharged from the substrate W.

Thus, the liquid disappears from the upper surface of the substrate W, and the entire upper surface of the substrate W is exposed. No droplets are present on the upper surface of the substrate W after the hole H is expanded over the entire region. Accordingly, drying of the substrate W is completed.

Due to the movement of the annular vapor layer forming part VF1, the liquid film LF1 can be excluded from the substrate W without bringing the gas-liquid interface GL1 formed on the inner circumference of the vapor layer forming part VF1 into contact with the pattern P1. Thus, since the surface tension exerted on the pattern P1 on the substrate W by the organic solvent can be curbed, the collapse of the pattern P1 can be curbed or prevented.

When a predetermined heating period elapses from the start of the radiation of the first lamp heater 252, the controller 3R stops the supply of electric power to the first lamp heater 252 and the second lamp heater 272 to stop the light emission of the first lamp heater 252 and the second lamp heater 272.

Further, the controller 3R controls the spin motor 219 to stop the rotation of the substrate W (Step S21 in FIG. 24).

After the rotation of the substrate W is stopped, an unloading step (Step S22 in FIG. 24) of unloading the substrate W from the chamber 4R is performed.

Specifically, the controller 3R controls the guard lifting unit 287 to move down all the guards 284 to the lower position. Further, the controller 3R closes the first gas valve 248 and stops the discharge of the gas from the first gas nozzle 234. Further, the controller 3R controls the third moving device 263 to retract the upper surface head 230 to the standby position. Further, the controller 3R controls the first moving device 239 to retract the second lamp heater 272 to the standby position.

Then, the center robot CR1 causes the hand H11 to enter the chamber 4R. After the chuck pin drive unit 220 releases the grip of the substrate W by the plurality of chuck pins 217, the center robot CR1 supports the substrate W on the spin chuck 5R with the hand H11. After that, the center robot CR1 retracts the hand H11 from the inside of the chamber 4 while the substrate W is supported with the hand H11. Thus, the processed substrate W is unloaded from the chamber 4.

Figure 27:
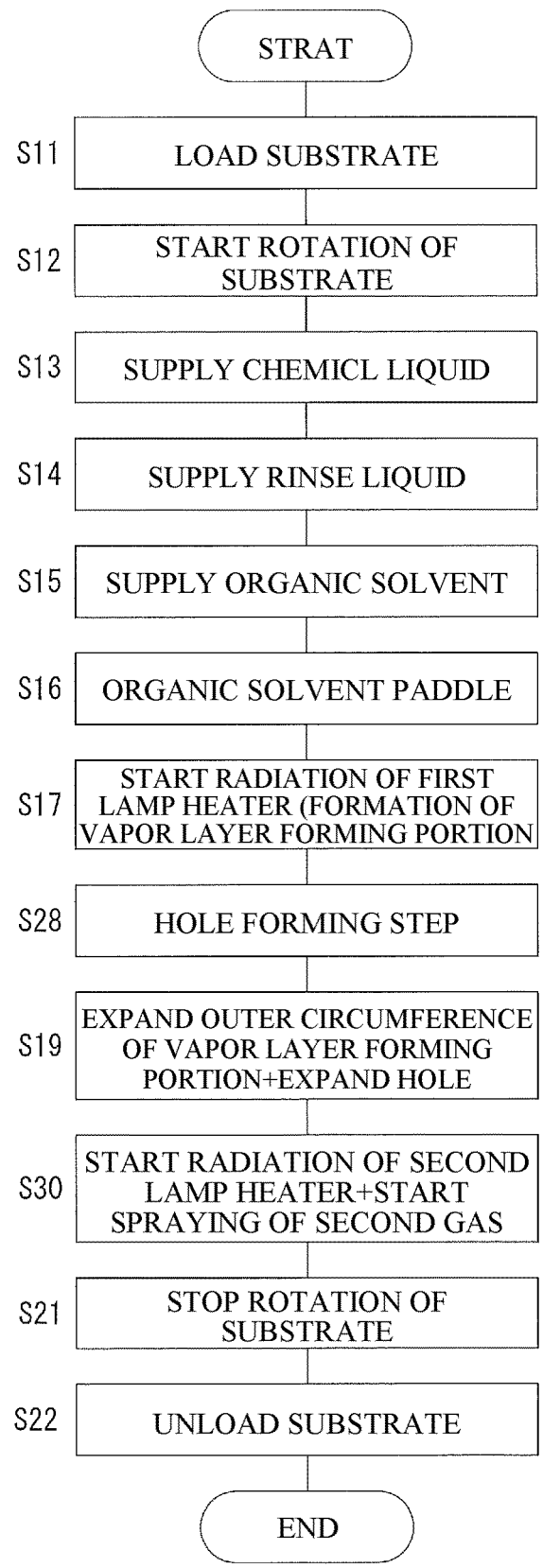
FIG. 27 is a process diagram for explaining a second example of the substrate processing performed by the substrate processing apparatus according to the fourth embodiment.

FIG. 27 is a process diagram for explaining a second example of the substrate processing performed by the substrate processing apparatus IR according to the fourth embodiment. FIGS. 28A to 28D are schematic views showing states of the substrate W when the second example of the substrate processing according to the fourth embodiment is performed. In the second example of the substrate processing according to the fourth embodiment, the same steps as those of the first example of the substrate processing according to the fourth embodiment in FIG. 27 are designated by the same reference numerals as those in FIG. 24.

A difference (a first difference) between the second example of the substrate processing according to the fourth embodiment and the first example (refer to FIG. 24) of the substrate processing according to the fourth embodiment is that the hole H is opened (the hole H is formed) in the liquid film LF1 by spraying a gas on the liquid film LF1 of the vapor layer forming part VF1 and partially excluding the organic solvent. In the second example of the substrate processing according to the fourth embodiment, Step S28 of FIG. 27 is performed instead of Step S18 of the first example (refer to FIG. 24) of the substrate processing according to the fourth embodiment.

Further, a difference (a second difference) between the second example of the substrate processing according to the fourth embodiment and the first example (refer to FIG. 24) of the substrate processing according to the fourth embodiment is that the gas is sprayed not only from the first gas nozzle 234 but also from the second gas nozzle 235 toward the inside of the inner circumference of the vapor layer forming part VF1. Additionally, in the movement of the vapor layer forming part VF1, not only the first spraying region RB11 from the first gas nozzle 234, but also the second spraying region RB12 from the second gas nozzle 235 are moved toward the outer circumference of the substrate W. In the second example of the substrate processing according to the fourth embodiment. Step S30 of FIG. 27 is performed instead of Step S20 of the first example (refer to FIG. 24) of the substrate processing according to the fourth embodiment.

Figure 28A:
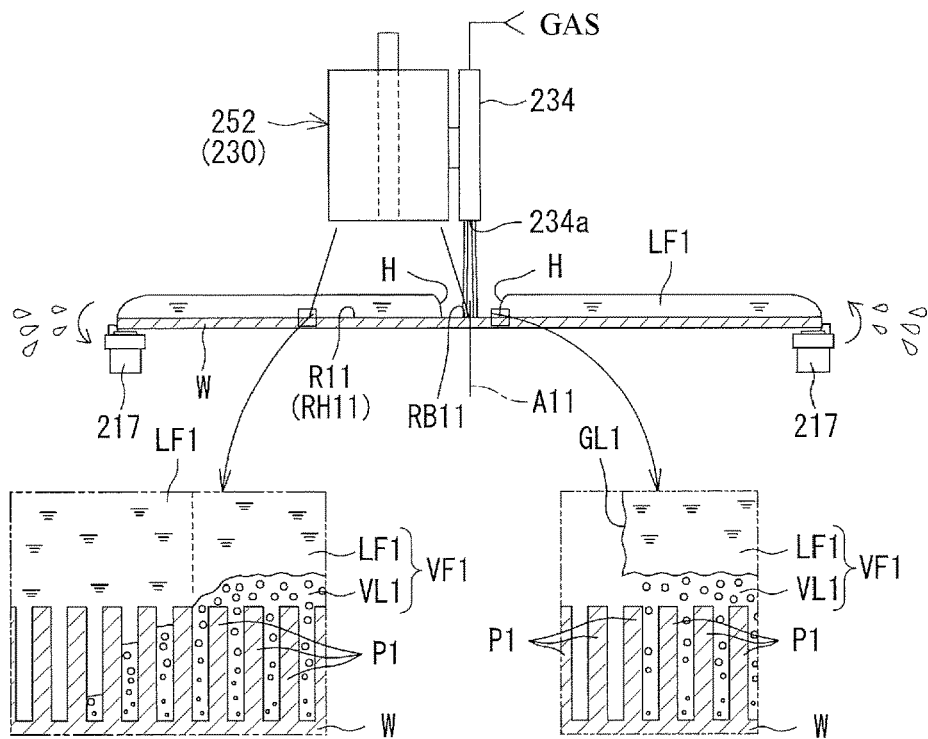
FIGS. 28A and 28B are schematic views showing a state of the substrate when the second example of the substrate processing is performed.

Hereinafter, a specific description will be provided, a hole forming step (Step S28 in FIG. 27) of forming a hole H in the liquid film LF1 of the vapor layer forming part VF1 by spraying a gas on the liquid film LF1 of the vapor layer forming part VF1 and partially excluding the organic solvent is performed after the formation of the vapor layer forming part VF1 in the center portion of the upper surface of the substrate W (Step S17 in FIG. 27). Specifically, from the state shown in FIG. 25B, the controller 3R controls the third moving device 263 to move the upper surface head 230 including the first gas nozzle 234 horizontally and disposes the first gas discharge port 234a of the first gas nozzle 234 on or near the rotation axis A11 as shown in FIG. 28A. After that, the controller 3R opens the first gas valve 248 and starts the discharge of the gas from the first gas discharge port 234a of the first gas nozzle 234 as shown in FIG. 28A (a first spraying step). The gas discharged from the first gas nozzle 234 collides with the liquid film LF1 in the first spraying region RB11 set on the center portion of the upper surface of the substrate W, and then flows outward along the surface of the liquid film LF1 in all directions. Thus, an air flow flowing outward from the center portion of the upper surface of the substrate W is formed.

When the gas is sprayed to the center portion of the liquid film LF1, the organic solvent included in the liquid film LF1 is pushed outward by the pressure of the gas. In addition, the evaporation of the organic solvent is promoted by the supply of the gas. Thus, the thickness of the center portion of the liquid film LF1 is reduced, and as shown in FIGS. 25C and 26B, a substantially circular hole H is formed in the center portion of the liquid film LF1. The hole H is an exposing hole which exposes the upper surface of the substrate W. A flow rate of the gas supplied to the first gas nozzle 234 for forming the hole H is, for example, 5 L/min.

Then, in the vapor layer forming part moving step (Step S19 in FIG. 23), the controller 3R controls the third moving device 263 to move the upper surface head 230 including the first lamp heater 252 horizontally toward the outer circumference of the substrate W while the gas is discharged from the first gas nozzle 234 and the light is radiated from the first lamp heater 252.

In the second example of the substrate processing according to the fourth embodiment, as in the first example of the substrate processing according to the fourth embodiment, the substrate W is heated from the middle of the vapor layer forming part moving step (Step S19 in FIG. 27) not only by the radiation of the light from the first lamp heater 252 but also by the radiation of the light from the second lamp heater 272. The heating of the substrate W using the second lamp heater 272 assists the heating of the substrate W by the radiation of the light from the first lamp heater 252 (an auxiliary heating step).

Prior to the start of the radiation of the light from the second lamp heater 272, the controller 3R controls the first moving device 239 to move the second lamp heater 272 from the standby position to the processing position and disposes the second lamp heater 272 at a predetermined radiation start position PS1.

Figure 28B:
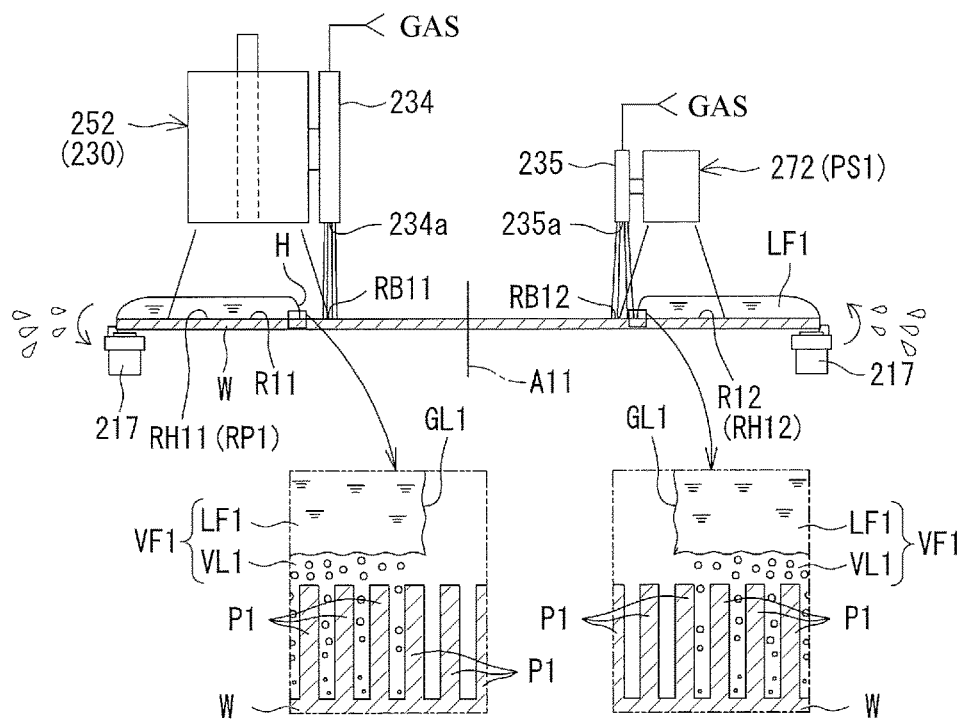

When a predetermined period elapses from the start of the radiation of the first lamp heater 252 and the first heating region RH11 reaches the predetermined reference position RP1 as shown in FIG. 28B, the controller 3R starts the supply of electric power to the second lamp heater 272, and starts light emission from the plurality of second light sources 278 included in the second lamp heater 272 (Step S30 in FIG. 27). Thus, the heating of the substrate W by the second lamp heater 272 is started. When the plurality of second light sources 278 emits light, the light is emitted from the second lamp heater 272, and the region below the second lamp heater 272 is irradiated with the light. The light emitted from the second lamp heater 272 is not absorbed by the liquid film LF1 and is transmitted through the liquid film LF1 and is radiated to the second irradiation region R12. Thus, the second heating region RH12 is heated by radiation. Then, the pattern P1 in the second heating region RH12 is warmed by the second heating region RH12, and the pattern P1 is heated to a predetermined heating temperature equal to or higher than the boiling point of the organic solvent. Thus, the organic solvent in contact with the pattern P1 in the second heating region RH12 is warmed.

Further, when a predetermined period elapses from the start of the radiation of the first lamp heater 252 and the first heating region RH11 reaches the predetermined reference position RP1, a gas is sprayed toward the inside of the inner circumference of the vapor layer forming part VF1. The controller 3R opens the second gas valve 298 and starts the discharge of the gas from the second gas discharge port 235a of the second gas nozzle 235 (a second spraying step). A temperature of the gas supplied to the second gas nozzle 235 may be room temperature or higher than room temperature. The gas discharged from the second gas nozzle 235 collides with the second spraying region RB12 set on the upper surface of the substrate W, and then flows outward along the upper surface of the substrate W in all directions. Thus, an air flow flowing outward from the center portion of the upper surface of the substrate W is formed.

Then, the controller 3R controls the first moving device 239 to move the second lamp heater 272 horizontally toward the outer circumference of the substrate W while the light is radiated from the second lamp heater 272. Since the second gas nozzle 235 is provided to be movable with the second lamp heater 272, the second spraying region RB12 moves while a constant distance is maintained from the second heating region RH12 (a second spraying region moving step). Thus, the second spraying region RB12 also moves toward the outer circumference of the substrate W according to the movement of the second heating region RH12 to the outer circumference of the substrate W.

At this time, a turning speed of the first arm 240 is the same as a turning speed of the third arm 264. Therefore, a movement speed of the second irradiation region R12 in the radial direction of the substrate W is the same as a movement speed of the first irradiation region R11 in the radial direction of the substrate W. That is, while a distance between the inner circumferential end of the second heating region RH12 and the rotation axis A11 is maintained at substantially the same distance as a distance between the inner circumferential end of the first heating region RH11 and the rotation axis A11, the first heating region RH11 and the second heating region RH12 move. Since the first heating region RH11 and the second heating region RH12 are moved toward the outer circumference of the substrate W in the state in which the substrate W is rotating, the first lamp heater 252 and the second lamp heater 272 can satisfactorily heat the entire upper surface of the substrate W while scanning it. Further, while a distance between the second spraying region RB12 and the rotation axis A11 is maintained at substantially the same distance as a distance between the first spraying region RB11 and the rotation axis A11, the first spraying region RB11 and the second spraying region RB12 move.

Due to the expansion of the outer circumference of the vapor layer forming part VF1 and the outer edge of the hole H, the vapor layer forming part VF1 moves toward the outer circumference of the substrate W while the liquid film LF1 floats over the entire inner circumference of the vapor layer forming part VF1. At this time, the gas-liquid interface GL1 formed on the inner circumference of the vapor layer forming part VF1 moves toward the outer circumference of the substrate W while a height position thereof is maintained to be higher than the upper end of the pattern P1.

Figure 28C:
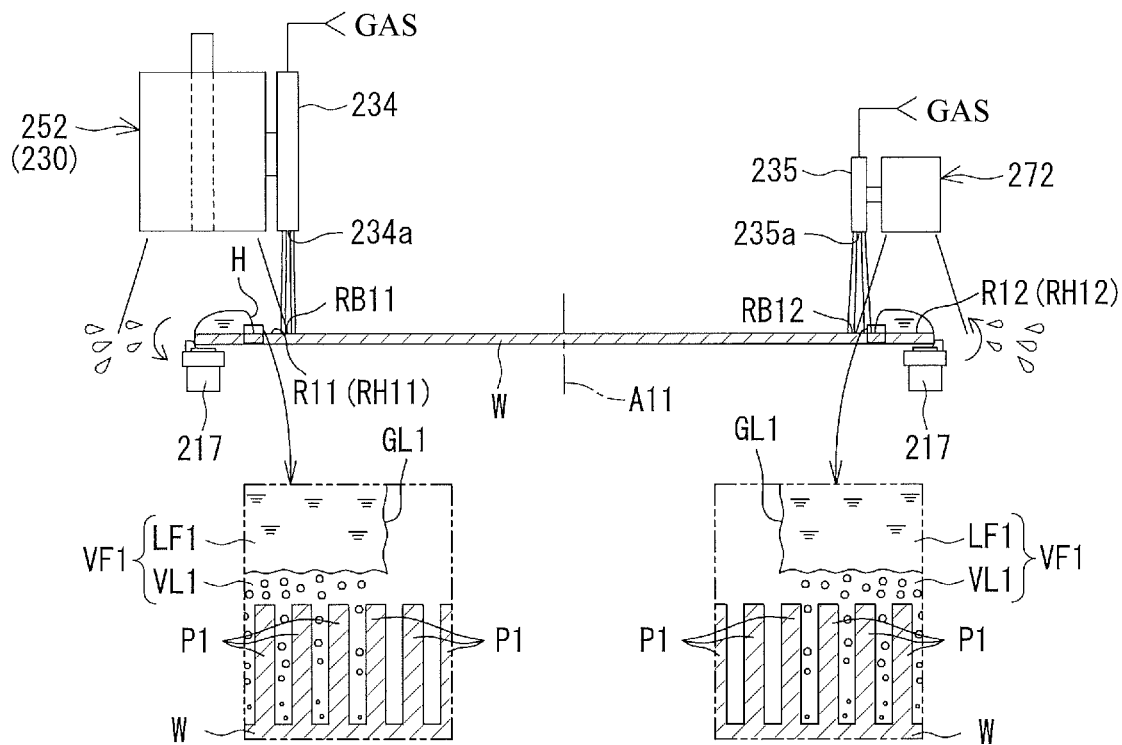
FIGS. 28C and 28D are schematic views showing a state subsequent to that of FIG. 28B.
Figure 28D:
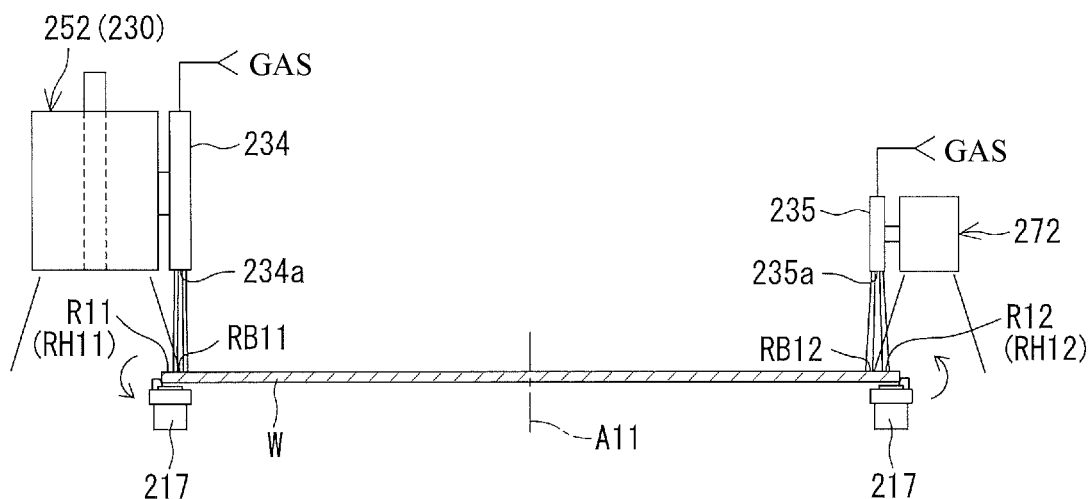

Due to further expansion of the outer circumference of the vapor layer forming part VF1 and the outer edge of the hole H, as shown in FIG. 28C, the liquid film LF1 outside the vapor layer forming part VF1 is excluded from the substrate W, and only the annular vapor layer forming part VF1 remains on the upper surface of the substrate W. Then, as shown in FIG. 28D, when the first spraying region RB11 and the second spraying region RB12 reach the outer circumferential portion of the substrate W, the outer edge of the hole H (that is, the inner circumference of the vapor layer forming part VF1) is expanded to the outer circumference of the upper surface of the substrate W, and the liquid film LF1 of the vapor layer forming part VF1 is discharged from the substrate W.

Thus, the liquid disappears from the upper surface of the substrate W, and the entire upper surface of the substrate W is exposed. No droplets are present on the upper surface of the substrate W after the hole H is expanded over the entire region. Accordingly, drying of the substrate W is completed.

According to the second example of the substrate processing according to the fourth embodiment, the hole H is formed in the liquid film LF1 by spraying the gas on the liquid film LF1 of the vapor layer forming part VF1. Although a centrifugal force is applied to the liquid film LF1 of the vapor layer forming part VF1, and the heat convection is generated on the upper surface of the substrate W, the hole H may not be formed well in the liquid film LF1 of the vapor layer forming part VF1 by these forces alone according to a magnitude of the paddle speed of the substrate W and a magnitude of the heating temperature of the first heating region RH11. The hole H can be surely formed in the liquid film LF1 of the vapor layer forming part VF1 by spraying the gas onto the liquid film LF1 of the vapor layer forming part VF1.

Figure 29:
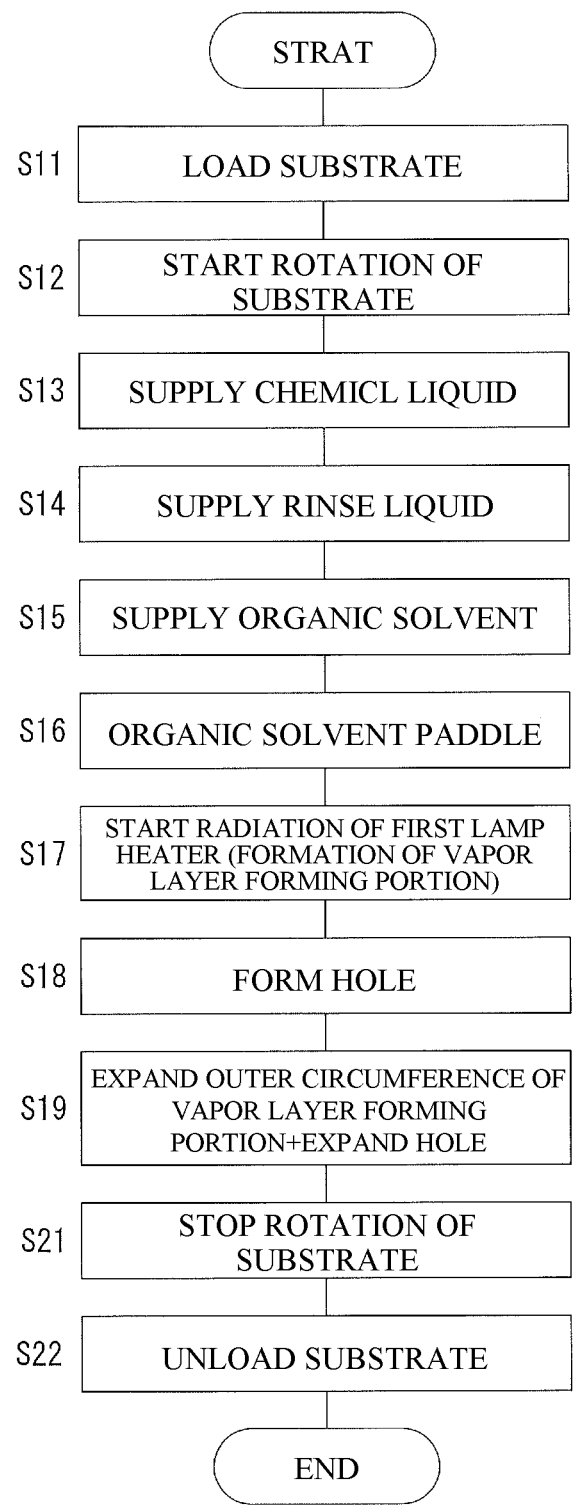
FIG. 29 is a process diagram for explaining a third example of the substrate processing performed by the substrate processing apparatus according to the fourth embodiment.
Figure 30A:
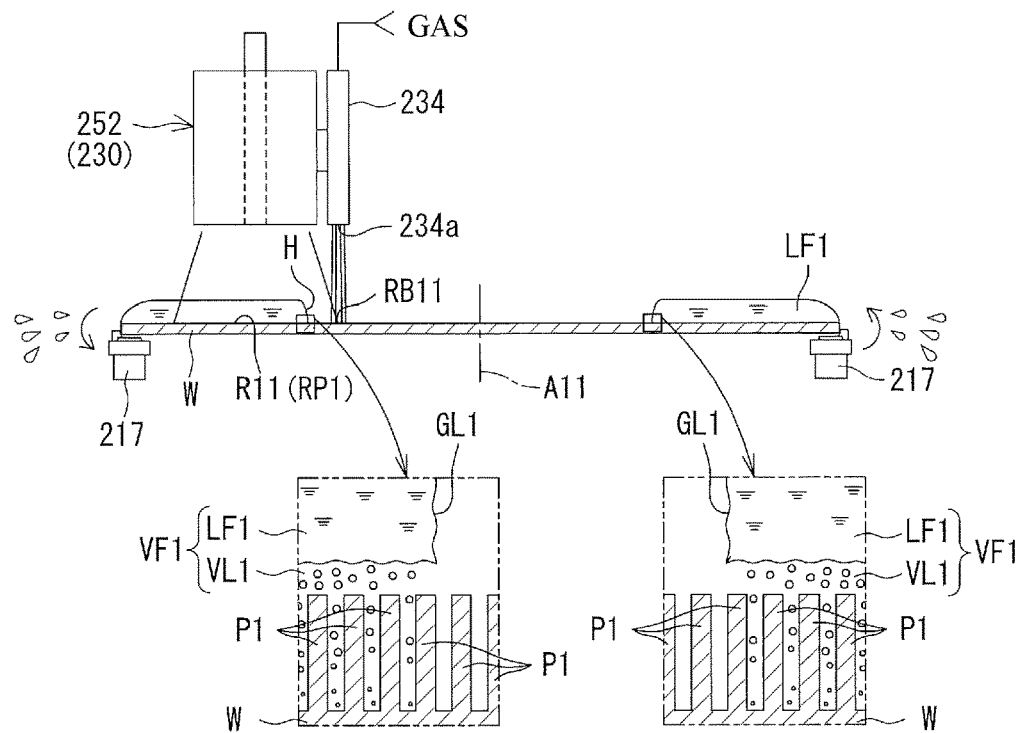
FIGS. 30A and 30B are schematic views showing a state of the substrate when the third example of the substrate processing performed by the substrate processing apparatus according to the fourth embodiment is performed.
Figure 30B:
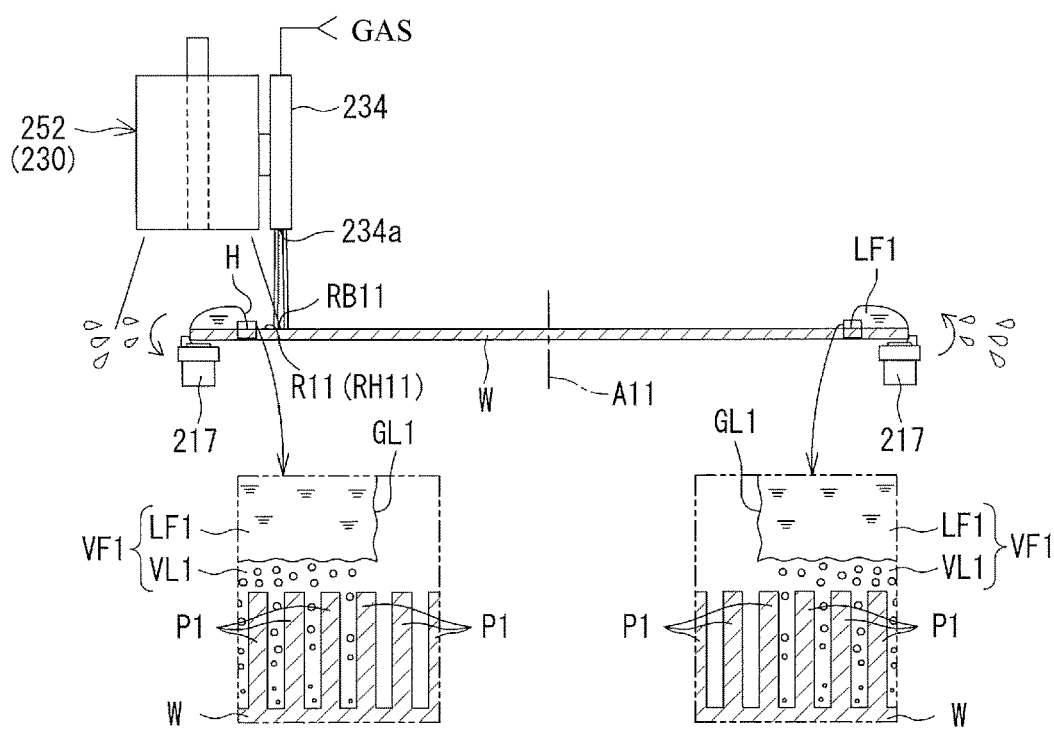
Figure 30C:
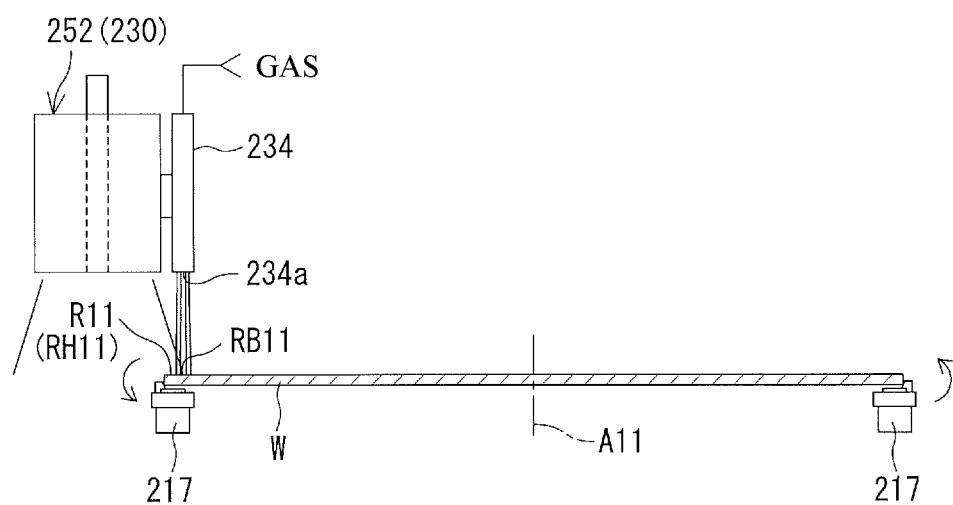
FIG. 30C is a schematic view showing a state subsequent to that of FIG. 30B.

FIG. 29 is a process diagram for explaining a third example of the substrate processing performed by the substrate processing apparatus 1R. FIGS. 30A to 30C are schematic views showing states of the substrate W when the third example of the substrate processing according to the fourth embodiment is performed. In the third example of the substrate processing according to the fourth embodiment, the same steps as those of the first example of the substrate processing according to the fourth embodiment in FIG. 29 are designated by the same reference numerals as those in FIG. 24.

In the third example of the substrate processing according to the fourth embodiment, in the vapor layer forming part moving step, the substrate W is heated simply by the radiation of the light from the first lamp heater 252 without using the second lamp heater 272. That is, in FIG. 29, there is no step corresponding to Step S20 in FIG. 24.

After the hole H is formed, as in the first example of the substrate processing according to the fourth embodiment, the vapor layer forming part moving step (Step S19 in FIG. 29) of moving the vapor layer forming part VF1 toward the outer circumference of the substrate W is performed. As described in the first example of the substrate processing according to the fourth embodiment, the vapor layer forming part moving step (Step S19 in FIG. 29) includes an outer circumference expanding step of expanding the outer circumference of the vapor layer forming part VF1 and a hole expanding step of expanding the outer edge of the hole H. The hole expanding step is performed in parallel with the outer circumference expanding step.

As shown in FIG. 30A, the first heating region RH11 and the first spraying region RB11 are moved toward the outer circumference of the substrate W. Thus, the outer circumference of the vapor layer forming part VF1 and the outer edge of the hole H are expanded. When the expansion of the outer circumference of the vapor layer forming part VF1 and the outer edge of the hole HI further progresses, as shown in FIG. 30B, the liquid film LF1 outside the vapor layer forming part VF1 is excluded from the substrate W, and only the annular vapor layer forming part VF1 remains on the upper surface of the substrate W. Then, as shown in FIG. 30C, when the first spraying region RB11 reaches the outer circumferential portion of the substrate W, the outer edge of the hole H (that is, the inner circumference of the vapor layer forming part VF1) is expanded to the outer circumference of the upper surface of the substrate W, and the liquid film LF1 of the vapor layer forming part VF1 is discharged from the substrate W.

Thus, the liquid disappears from the upper surface of the substrate W, and the entire upper surface of the substrate W is exposed. No droplets are present on the upper surface of the substrate W after the hole H is expanded over the entire region. Accordingly, drying of the substrate W is completed.

In a method described in U.S. Patent Application Publication No. 2017/282210, since the substrate is heated in a stationary state while the substrate is supported by the hot plate, the centrifugal force due to the rotation of the substrate cannot be applied to the substrate at the time of drying. Therefore, liquid residue may be generated on the upper surface of the substrate. In addition, in a device described in U.S. Patent Application Publication No. 2017/282210, an outer diameter of the hot plate is set to be smaller than a diameter of the substrate to deliver the substrate between the chuck pin and the hot plate. Therefore, the outer circumferential portion of the substrate cannot be satisfactorily heated at the time of drying. As a result, the liquid of the organic solvent may remain on the outer circumferential portion of the upper surface of the substrate. When the liquid of the organic solvent remains on the outer circumferential portion of the upper surface of the substrate after the drying processing, a defect (a defect of the outer circumferential portion) may occur in the outer circumferential portion of the substrate.

Further, in the method described in U.S. Patent Application Publication No. 2017/282210, the hot plate is maintained at a high temperature in the retracted position even when the substrate is not heated. Therefore, the processing performed before drying (for example, the chemical liquid processing using the chemical liquid) may be affected by the radiant heat from the hot plate.

According to the first to third examples of the substrate processing according to the fourth embodiment, the first heating region RH11 which is set on the center portion of the upper surface of the substrate W and is not set at the outer circumferential portion of the upper surface of the substrate W is heated by irradiating the center portion of the upper surface of the substrate W with the light from above the liquid film LF1. Thus, the organic solvent in contact with the first heating region RH11 is evaporated to form the vapor layer VL1, and the liquid film LF1 is held on the vapor layer VL1. That is, the vapor layer forming part VF1 in which the vapor layer VL1 is formed between the organic solvent and the upper surface of the substrate W and the liquid film LF1 is held on the vapor layer VL1 is formed on the center portion of the upper surface of the substrate W. In the vapor layer forming part VF1, the liquid film LF1 floats from the upper surface of the substrate W at the center portion of the substrate W.

In that state, the hole H is formed by spraying a gas onto the liquid film LF1 of the vapor layer forming part VF1, and a gas-liquid interface GL1 is formed between the liquid film LF1 of the vapor layer forming part VF1 and the hole H, that is, on the inner circumference of the liquid film LF1 of the vapor layer forming part VF1. Then, due to the expansion of the outer circumference of the annular vapor layer forming part VF1 and the expansion of the hole H, the annular vapor layer forming part VF1 moves toward the outer circumference of the substrate W. The liquid film LF1 can be moved without bringing the gas-liquid interface GL1 on the inner circumference of the liquid film LF1 of the vapor layer forming part VF1 into contact with the pattern P1 by moving the annular vapor layer forming part VF1. Due to the expansion of the inner circumference of the vapor layer forming part VF1 to the outer circumference of the substrate W, the liquid film LF1 can be satisfactorily excluded from the entire upper surface of the substrate W. Since the liquid film LF1 can be excluded from the substrate W while the surface tension exerted on the pattern P1 on the substrate W by the organic solvent is curbed, the collapse of the pattern P1 can be curbed or prevented.

Further, since the vapor layer forming part VF1 is moved while the substrate W is rotated, it is possible to exert a centrifugal force due to the rotation of the substrate W on the vapor layer forming part VF1 which has reached the outer circumferential portion of the substrate W. Thus, since remaining of the organic solvent on the outer circumferential portion of the substrate W can be curbed or prevented, occurrence of defects on the outer circumferential portion of the substrate W can be curbed or prevented.

Further, since the heating of the substrate W is started by the start of the radiation of light, the substrate W is not heated during the period other than the radiation of light. Therefore, as compared with the case in which the substrate W is heated using a hot plate as in US Patent Application Publication No. 2017/282210, a thermal effect (a change in a processing rate, or the like) in the chemical liquid supply step (Step S13) can be excluded or reduced.

Further, the vapor layer forming part VF1 is formed on the center portion of the upper surface of the substrate W, and the vapor layer forming part VF1 is moved toward the outer circumference of the substrate W by providing the first heating region RH11 on the center portion of the upper surface of the substrate W. Since the first heating region RH11 is set only on a part of the upper surface of the substrate W, a small area is sufficient for the first heating region RH11 as compared with the case in which the entire upper surface of the substrate W is heated to form the vapor layer forming part VF1 on the entire upper surface of the substrate W. Therefore, it is possible to satisfactorily heat the entire first heating region RH11. Thus, the liquid film LF1 can be satisfactorily floats over the entire region of the vapor layer forming part VF1.

Further, in order to provide the first heating region RH11 in the entire region of the substrate W, it is necessary to increase the diameter of the first lamp heater 252 or to increase the number of lamp heaters. In this case, other peripheral members in the chamber 4R may be unnecessarily heated, or power consumption may increase.

On the other hand, in the embodiment, since the first heating region RH11 is provided only on a part of the substrate W, the unnecessary heating of other peripheral members and the increase in power consumption can be curbed or prevented.

Further, since a circumferential speed of the substrate W is high in the outer circumferential portion of the substrate W, when the first heating region RH11 is disposed on the outer circumferential portion of the substrate W, an amount of heat per unit area applied to the substrate W by the radiation of light decreases. When the first heating region RH11 is moved toward the outer circumference of the substrate W to move the vapor layer forming part VF1 toward the outer circumference of the substrate W, the amount of heat per unit area applied to the substrate W may decrease, and the liquid film may not float over the entire region of the vapor layer forming part VF1. When the liquid film LF1 does not float on at least the entire inner circumference of the vapor layer forming part VF1, the gas-liquid interface GL1 on the inner circumference of the liquid film LF1 of the vapor layer forming part VF1 may come into contact with the pattern, and the pattern P1 may collapse.

On the other hand, in the first example and the second example of the substrate processing according to the fourth embodiment, the first heating region RH11 and the second heating region RH12 which are separated from each other in the rotation direction R of the substrate W are heated by the radiation of light. That is, a total area of the heating region can be increased. Thus, the amount of heat per unit area applied to the substrate W can be maintained to be high. Therefore, even when the vapor layer forming part VF1 moves toward the outer circumference of the substrate W, it is possible to maintain the state in which the liquid film LF1 floats over the entire region of the vapor layer forming part VF1. Since the vapor layer forming part VF1 is moved while the liquid film LF1 floats over the entire inner circumference of the vapor layer forming part VF1, it is possible to reliably prevent the gas-liquid interface GL1 from coming into contact with the pattern P1 and causing the pattern P1 to collapse.

Further, in the first example and the second example of the substrate processing according to the fourth embodiment, the outer circumference of the vapor layer forming part VF1 is expanded by moving both the first heating region RH11 and the second heating region RH12 toward the outer circumference of the substrate W. In this case, the vapor layer forming part VF1 can be moved toward the outer circumference of the substrate W while the vapor layer forming part VF1 is heated by the radiation of light to the first heating region RH11 and the second heating region RH12. Thus, the outer circumference of the vapor layer forming part VF1 can be expanded while the state in which the liquid film LF1 floats over the entire region of the vapor layer forming part VF1 is maintained.

Further, according to the second example of the substrate processing according to the fourth embodiment, in the movement of the vapor layer forming part VF1, both the first spraying region RB11 and the second spraying region RB12 are moved toward the outer circumference of the substrate W. Since the hole H is expanded by spraying a gas into a plurality of regions separated in the rotation direction R of the substrate W, the hole H can be expanded while an inner circumferential position of the vapor layer forming part VF1, that is, an outer edge position of the hole H is controlled with high accuracy.

Fifth Embodiment

Figure 31:
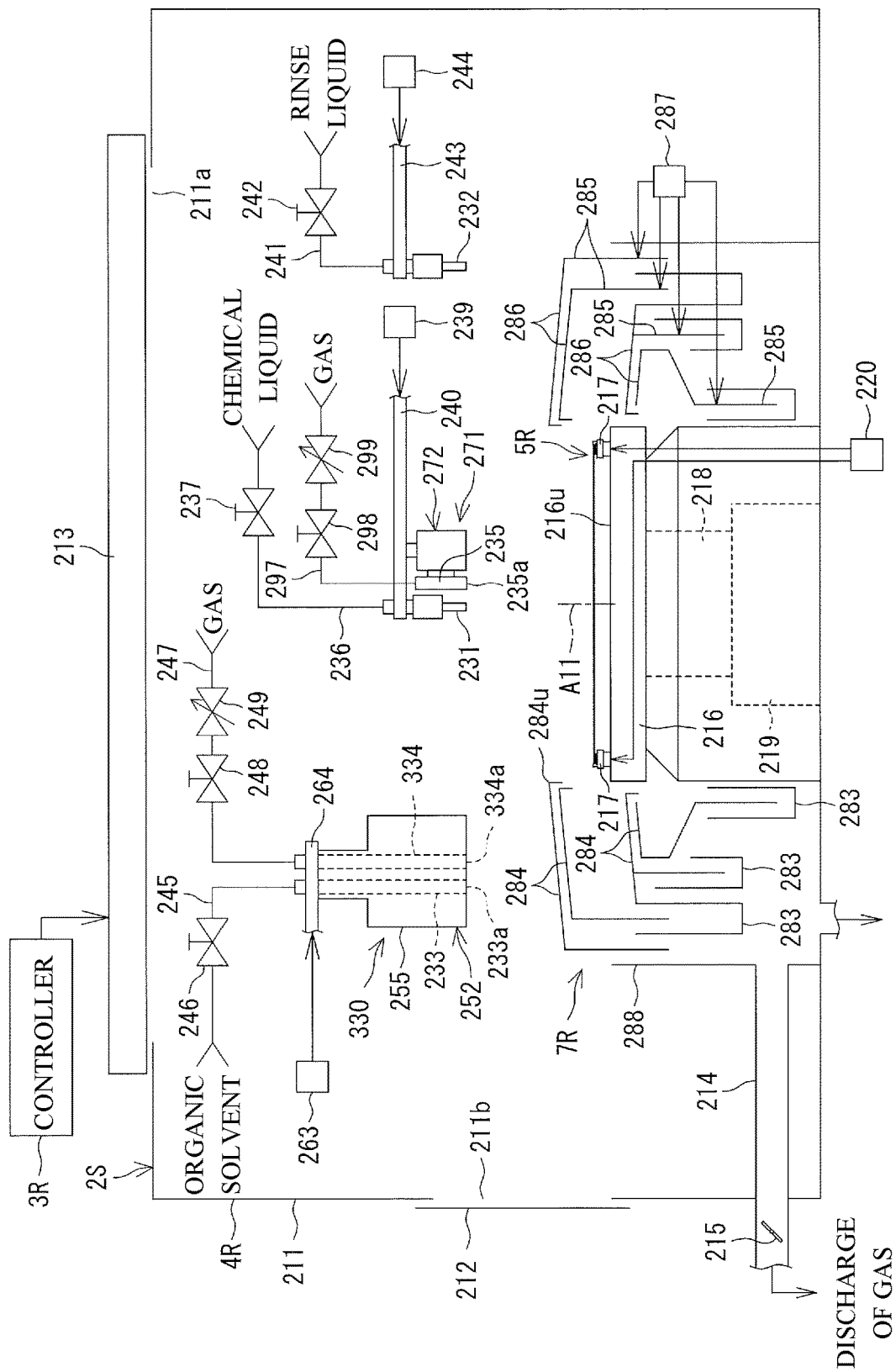
FIG. 31 is a schematic view of the inside of a processing unit provided in a substrate processing apparatus according to a fifth embodiment of the disclosure when seen horizontally.
Figure 32:
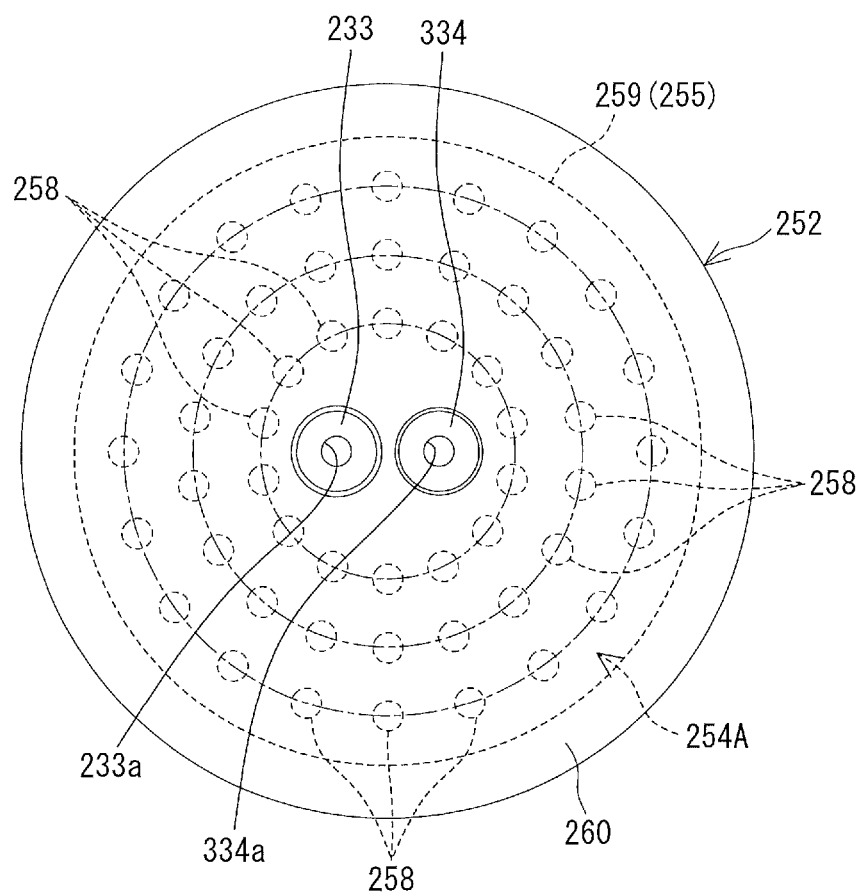
FIG. 32 is a schematic view of an upper surface head shown in FIG. 31 when seen from below.

FIG. 31 is a schematic view of the inside of a processing unit 2S provided in a substrate processing apparatus 1S according to a fifth embodiment of the present disclosure when seen horizontally. FIG. 32 is a schematic view of an upper surface head 330 when seen from below. In the fifth embodiment, the parts common to those in the above-described fourth embodiment are designated by the same reference numerals as those in the cases of FIGS. 15A to 30C, and the description thereof will be omitted.

A main difference between the substrate processing apparatus 1S according to the fifth embodiment and the substrate processing apparatus 1R according to the fourth embodiment is that, in the first lamp heater 252, a first gas nozzle 334 is integrated with the first lamp heater 252, and the first light emitting part 254A surrounds the first gas discharge port 334a in an annular shape when seen from below. Hereinafter, a specific description will be provided.

The processing unit 2S includes the upper surface head 330 instead of the upper surface head 230 of the fourth embodiment. The upper surface head 330 has a configuration in which the organic solvent nozzle 233 and the first gas nozzle 334 are integrated with the first lamp heater 252. That is, the first lamp heater 252 and the organic solvent nozzle 233 are included in the upper surface head 330. The upper surface head 330 has a function as a processing liquid nozzle which discharges an organic solvent as a processing liquid, a function as a lamp heater, and a function as a gas nozzle which discharges a gas. The upper surface head 330 includes the first lamp housing 255 as a housing. The organic solvent nozzle 233 and the first gas nozzle 334 are inserted through the inside of the first lamp housing 255 in the vertical direction. The first gas pipe 247 is connected to the first gas nozzle 334. When the first gas valve 248 is opened, a gas is continuously discharged downward from a first gas discharge port 334a of the first gas nozzle 334 at a flow rate corresponding to the opening degree of the first flow rate adjusting valve 249 which changes the gas flow rate. A temperature of the gas supplied to the first gas nozzle 334 may be room temperature or higher than room temperature.

The first light emitting part 254A of the first lamp heater 252 surrounds the organic solvent discharge port 233a and the first gas discharge port 334a in an annular shape when seen from below. Therefore, on the upper surface of the substrate W, a first spraying region RB13 (refer to FIG. 34C described later) on which the gas from the first gas discharge port 334*a* is sprayed is smaller than the first heating region RH11 (refer to FIG. 34C described later) by the first lamp heater 252. Further, on the upper surface of the substrate W, the entire first spraying region RB13 is disposed inside the outer edge of the first heating region RH11.

Figure 33:
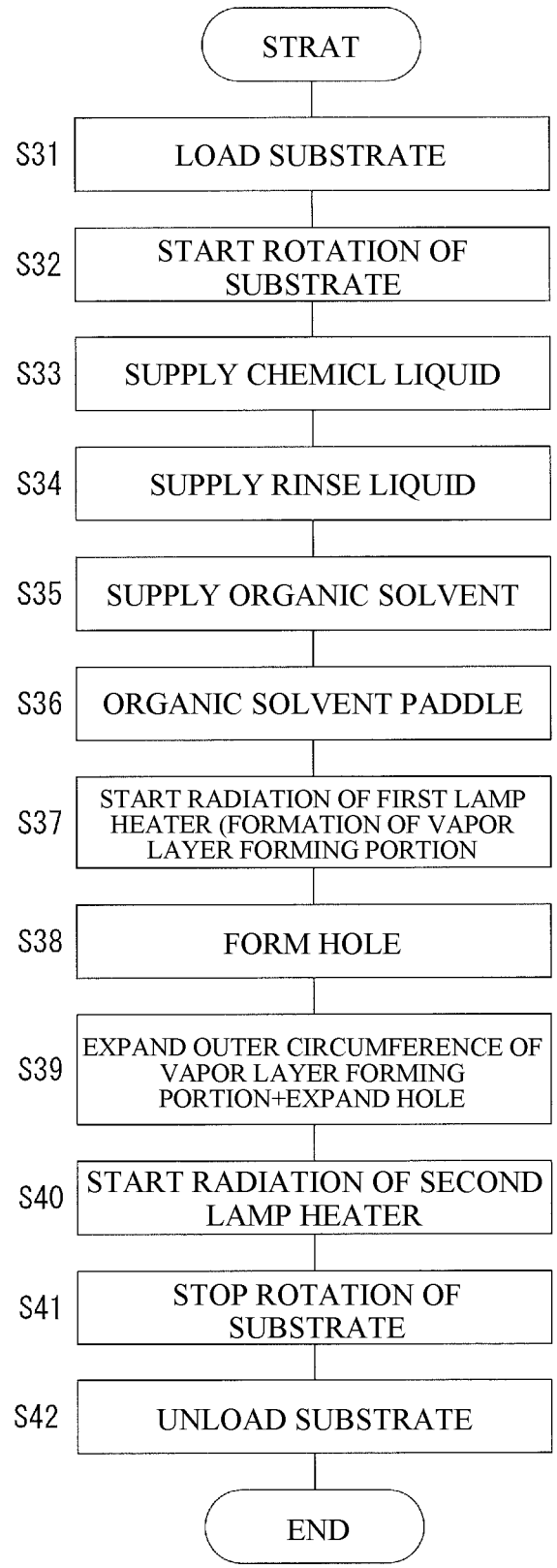
FIG. 33 is a process diagram for explaining a first example of the substrate processing performed by a substrate processing apparatus according to the fifth embodiment.

FIG. 33 is a process diagram for explaining a first example of the substrate processing performed by the substrate processing apparatus 1S. FIGS. 34A to 34F are schematic views showing states of the substrate W when the first example of the substrate processing performed by the substrate processing apparatus 1S is performed.

The substrate W is loaded into the chamber 4R (Step S31 in FIG. 33), and the substrate W is gripped by the plurality of chuck pins 217. Then, the rotation of the substrate W is started (Step S32 in FIG. 33), and the substrate W rotates at the chemical liquid supply speed (100 rpm or more and less than 1000 rpm). After that, the chemical liquid supply step (Step S33 in FIG. 33), the rinse liquid supply step (Step S34 in FIG. 33), and the organic solvent supply step (Step S35 in FIG. 33) are performed in this order. Steps S31 to S35 of FIG. 33 are the same as Steps S11 to S15 in the first example of the substrate processing (refer to FIG. 24).

Figure 34A:
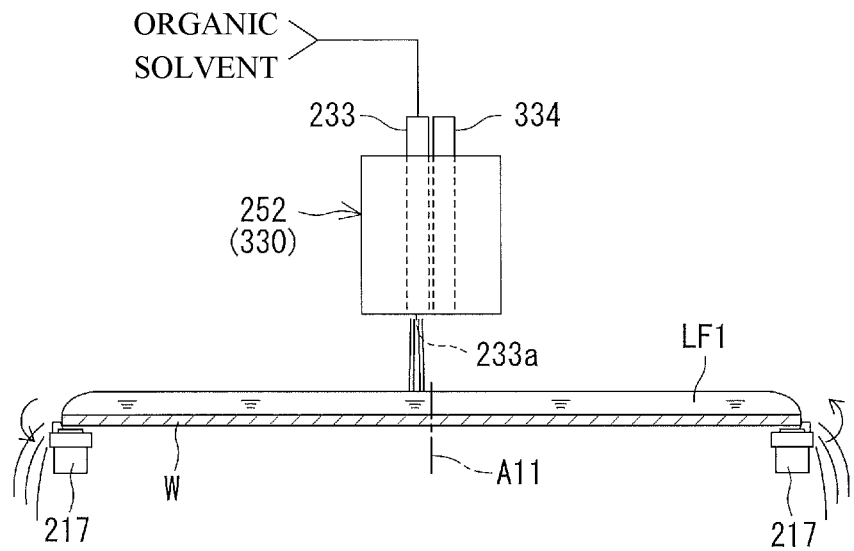
FIGS. 34A and 34B are schematic views showing a state of the substrate when the first example of the substrate processing performed by the substrate processing apparatus according to the fifth embodiment is performed.

In the organic solvent supply step (Step S35 in FIG. 33), the organic solvent is discharged from the organic solvent nozzle 233 included in the upper surface head 330. Thus, as shown in FIG. 34A, the liquid film LF1 which covers the entire upper surface of the substrate W is formed. After that, an organic solvent paddle step (Step S36 in FIG. 33) of holding the liquid film LF1 on the upper surface of the substrate W is performed. This step is the same as Step S16 of the first example of the substrate processing (refer to FIG. 24).

Next, after the liquid film LF1 is formed on the upper surface of the substrate W, a vapor layer forming part forming step (Step S37 in FIG. 33) of forming the vapor layer forming part VF1 on the center portion of the upper surface of the substrate W is performed. The vapor layer forming part forming step (Step S37 in FIG. 33) is performed by the substrate W being heated by the radiation of light from the first lamp heater 252 included in the upper surface head 330.

Figure 34B:
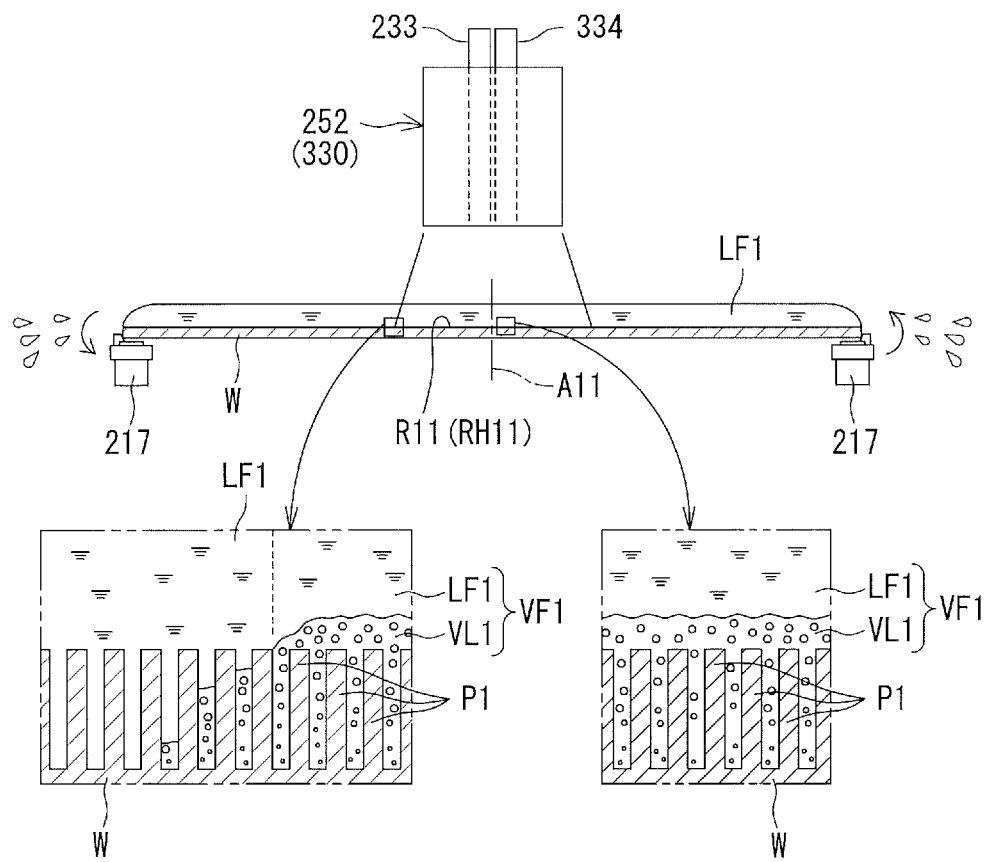

Specifically, in a state in which the upper surface head 330 is stationary at the center processing position, the controller 3R starts supply of electric power to the first lamp heater 252 while the rotation of the substrate W is maintained at the paddle speed, and starts light emission of the plurality of first light sources 258 included in the first lamp heater 252. When the plurality of first light sources 258 emit light, the light is emitted from the first lamp heater 252 as shown in FIG. 34B. The light emitted from the first lamp heater 252 is not absorbed by the liquid film LF1 and is transmitted through the liquid film LF1 and is radiated to the first irradiation region R11. Thus, the pattern P1 formed in the first heating region RH11 is heated by radiation, and the pattern P1 is heated to a predetermined heating temperature equal to or higher than the boiling point of the organic solvent. Accordingly, the organic solvent in contact with the first heating region RH11 is warmed. The first heating region RH11 is set on the center portion of the upper surface of the substrate W, and is not set at the outer circumferential portion of the upper surface of the substrate W.

Further, when the temperature of the first heating region RH11 (that is, the temperature of the pattern P1 formed in the first heating region RH11) is equal to or higher than the boiling point of the organic solvent, the organic solvent is evaporated at the interface between the liquid film LF1 and the substrate W, and a large number of small bubbles intervene between the organic solvent and the upper surface of the substrate W. As the organic solvent is evaporated everywhere at the interface between the liquid film LF1 and the substrate W, the vapor layer VL1 (refer to FIG. 34B) containing the vapor of the organic solvent is formed between the liquid film LF1 and the substrate W. Thus, the vapor layer forming part VF1 is formed in the first heating region RH11. On the other hand, the vapor layer forming part is not formed in the region outside the first heating region RH11 on the upper surface of the substrate W. Since the substrate W is rotating, the vapor layer forming part VF1 is a substantially circular region which covers the center portion of the upper surface of the substrate W.

Since the substrate W is rotating, a centrifugal force is applied to the liquid film LF1 of the vapor layer forming part VF1. Further, a large temperature difference occurs between the first heating region RH11 and the region outside the first heating region RH11 on the upper surface of the substrate W. Due to the temperature difference, the heat convection flowing from the center portion to the outer circumferential portion is formed on the upper surface of the substrate W. A hole H is formed in the center portion of the liquid film LF1 of the vapor layer forming part VF1 by the centrifugal force and the heat convection (Step S38 in FIG. 33).

Figure 34C:
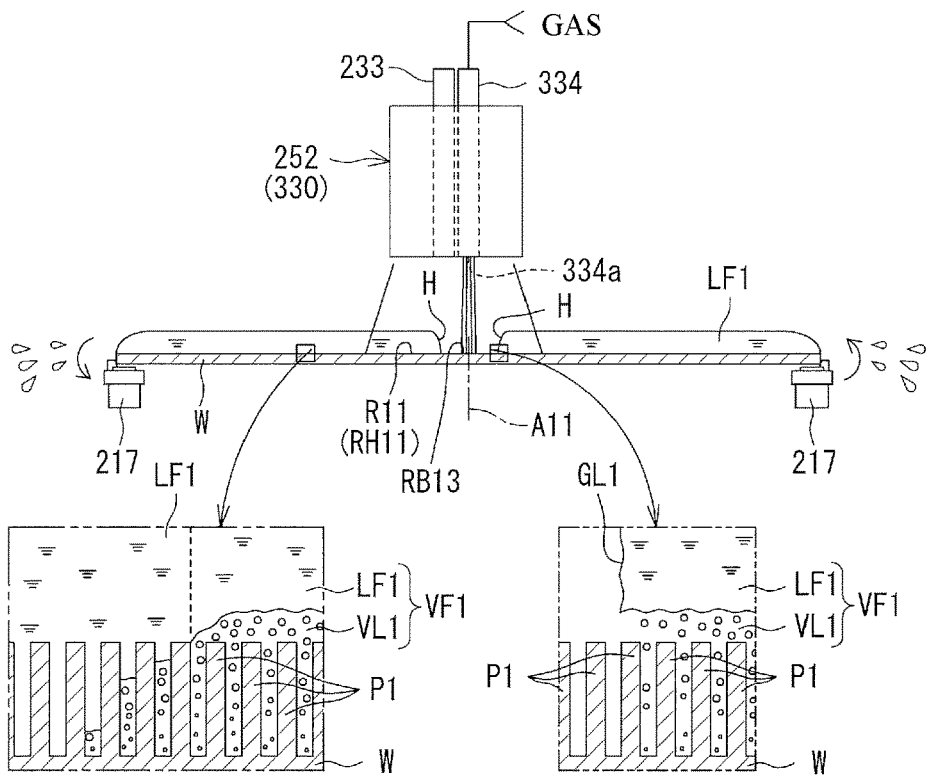
FIGS. 34C and 34D are schematic views showing a state subsequent to that of FIG. 34B.

Since the rotation speed of the substrate W is the paddle speed, the centrifugal force applied to the liquid film LF1 of the vapor layer forming part VF1 is weak. Further, the heat convection generated on the upper surface of the substrate W is also relatively weak. However, in the vapor layer forming part VF1, since the frictional resistance acting on the liquid film LF1 on the substrate W is small enough that it can be regarded as zero, the organic solvent included in the liquid film LF1 is pushed outward by a pressure of the gas due to the centrifugal force and the heat convection. Thus, the thickness of the center portion of the liquid film LF1 is reduced, and as shown in FIG. 34C, the substantially circular hole H is formed in the center portion of the liquid film LF1. The hole H is an exposing hole which exposes the upper surface of the substrate W.

Since the first light emitting part 254A surrounds the first gas discharge port 334*a* in an annular shape when seen from below, it is possible to spray the gas to the inside of the outer edge of the vapor layer forming part VF1 formed by heating the first heating region RH11 with the first lamp heater 252. Accordingly, the hole H can be satisfactorily provided in the vapor layer forming part VF1.

As the liquid film LF1 is partially removed by the formation of the hole H, the vapor layer forming part VF1 has an annular shape. Then, the gas-liquid interface GL1 is formed between the liquid film LF1 of the vapor layer forming part VF1 and the hole H, that is, on the inner circumference of the liquid film LF1 of the vapor layer forming part VF1.

Figure 34D:
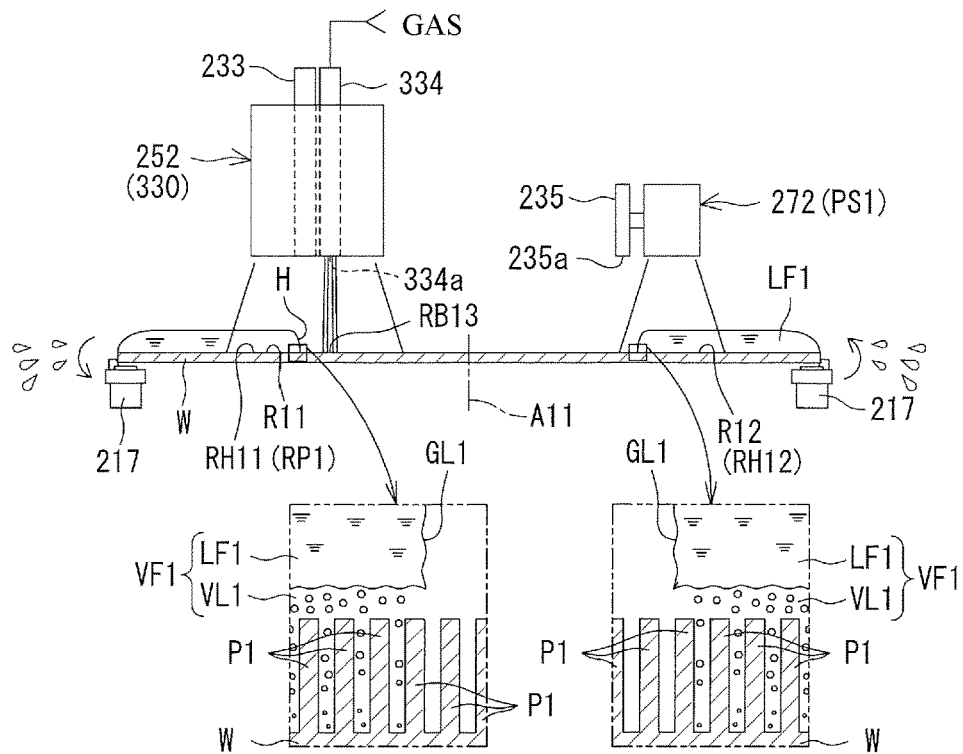

Next, as shown in FIG. 34D, a vapor layer forming part moving step (Step S39 in FIG. 33) of moving the vapor layer forming part VF1 toward the outer circumference of the substrate W is performed. The vapor layer forming part moving step (Step S39 in FIG. 33) includes an outer circumference expanding step of expanding the outer circumference of the vapor layer forming part VF1 and a hole expanding step of expanding the outer edge of the hole H (that is, the inner circumference of the vapor layer forming part VF1). The hole expanding step is performed in parallel with the outer circumference expanding step.

Prior to the start of the vapor layer forming part moving step (Step S39 in FIG. 33), the controller 3R opens the first gas valve 248 and starts the discharge of the gas from the first gas discharge port 334a of the first gas nozzle 334 (a first spraying step). A temperature of the gas supplied to the first gas nozzle 334 may be room temperature or higher than room temperature. The gas discharged from the first gas nozzle 334 collides with the liquid film LF1 in the first spraying region RB13 set on the center portion of the upper surface of the substrate W and then flows outward in all directions along the surface of the liquid film LF1. Thus, an air flow flowing outward from the center portion of the upper surface of the substrate W is formed. A flow rate of the gas supplied to the first gas nozzle 334 is, for example, 5 L/min. The inner circumference of the vapor layer forming part VF1 is pushed toward the outer circumference of the substrate W by spraying the gas into the first spraying region RB13 set inside the inner circumference of the vapor layer forming part VF1.

In the vapor layer forming part moving step (Step S39 in FIG. 33), the controller 3R controls the third moving device 263 (refer to FIG. 17) and horizontally moves the upper surface head 330 including the first lamp heater 252 toward the outer circumference of the substrate W while the gas is discharged from the first gas nozzle 334 and the light is radiated from the first lamp heater 252. Thus, the first heating region RH11 moves in the upper surface of the substrate W toward the outer circumference of the substrate W along an arc-shaped trajectory which passes through the center of the substrate W in a plan view. As the first heating region RH11 moves, the outer circumference of the annular vapor layer forming part VF1 is expanded (an outer circumference expanding step).

The inner circumference of the vapor layer forming part VF1 is pushed toward the outer circumference of the substrate W in the first spraying region RB13 set inside the inner circumference of the vapor layer forming part VF1. Since the first gas nozzle 334 is integrated with the first lamp heater 252, the first spraying region RB13 moves while a constant distance from the first heating region RH11 is maintained (a first spraying region moving step). The first spraying region RB13 moves toward the outer circumference of the substrate W according to the movement of the first heating region RH11 to the outer circumference of the substrate W. The outer edge of the hole H, that is, the inner circumference of the vapor layer forming part VF1 is expanded by moving the first spraying region RB13 toward the outer circumference of the substrate W (a hole expanding step). In the vapor layer forming part VF1, since the frictional resistance acting on the liquid film LF1 on the substrate W is small enough that it can be regarded as zero, the inner circumference of the vapor layer forming part VF1 can be smoothly moved toward the outer circumference of the substrate W by a small pushing force due to a flow of the gas. The inner circumference of the vapor layer forming part VF1 can be expanded by spraying the gas onto the first spraying region RB13 and moving the first spraying region RB13 toward the outer circumference of the substrate W while the inner circumference position of the vapor layer forming part VF1 is controlled with high accuracy. The gas-liquid interface GL1 formed on the inner circumference of the vapor layer forming part VF1 moves toward the outer circumference of the substrate W while a height position thereof is maintained to be higher than the upper end of the pattern P1.

Further, the expansion of the hole H in the hole expanding step is promoted not only by spraying of the gas but also by the centrifugal force due to the rotation of the substrate W acting on the organic solvent on the upper surface of the substrate W. Additionally, the liquid film LF1 outside the vapor layer forming part VF1 is pushed outward and discharged to the outside of the substrate W by the organic solvent moving from the center portion side of the substrate W.

Also in the first example of the substrate processing according to the fifth embodiment, as in the first example of the substrate processing according to the fourth embodiment (refer to FIG. 24), the substrate W is heated from the middle of the vapor layer forming part moving step not only by the radiation of the light from the first lamp heater 252 but also by the radiation of the light from the second lamp heater 272 (Step S40 in FIG. 33; an auxiliary heating step). A mode of radiating the light from the second lamp heater 272 is the same as that of the first example (refer to FIG. 24) of the substrate processing according to the fourth embodiment, and thus the description thereof will be omitted.

Figure 34E:
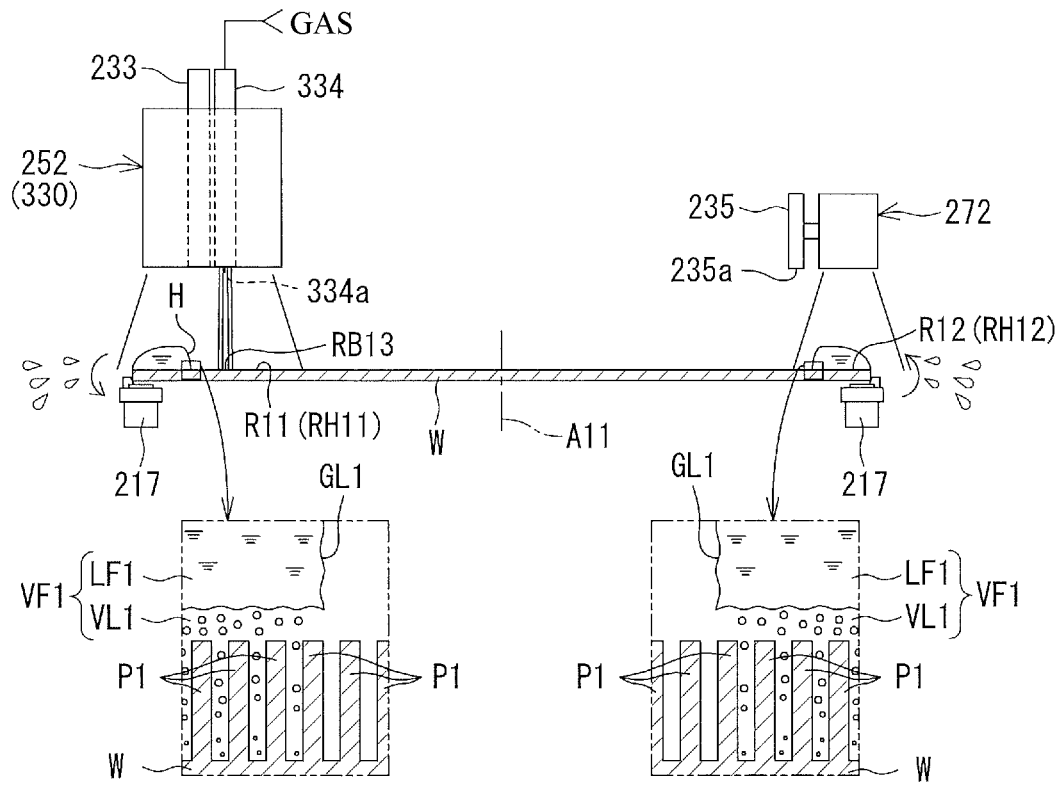
FIGS. 34E and 34F are schematic views showing a state subsequent to that of FIG. 34D.
Figure 34F:
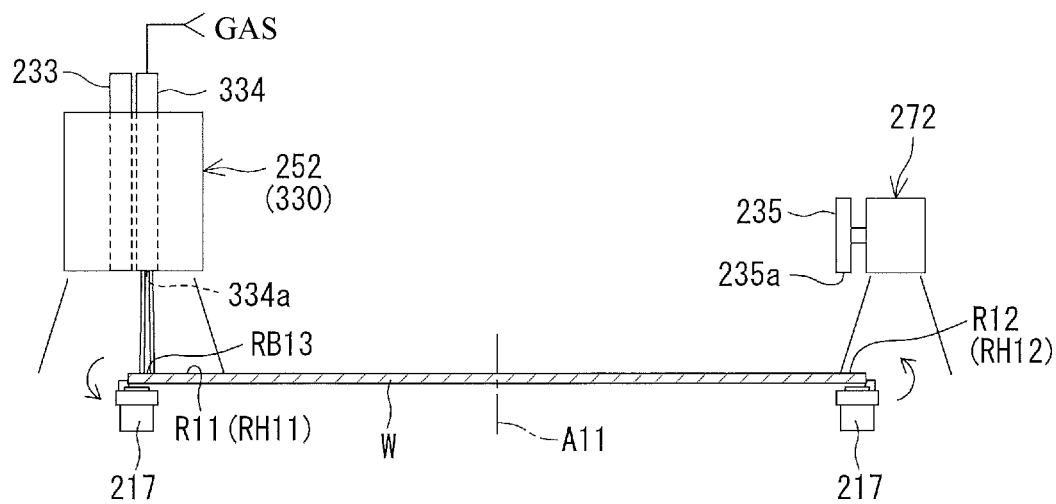

Due to the further expansion of the outer circumference of the vapor layer forming part VF1 and the outer edge of the hole H, as shown in FIG. 34E, the liquid film LF1 outside the vapor layer forming part VF1 is excluded from the substrate W, and only the annular vapor layer forming part VF1 remains on the upper surface of the substrate W. Then, as shown in FIG. 34F, when the first spraying region RB13 reaches the outer circumferential portion of the substrate W, the outer edge of the hole H (that is, the inner circumference of the vapor layer forming part VF1) is expanded to the outer circumference of the upper surface of the substrate W, and the liquid film LF1 of the vapor layer forming part VF1 is discharged from the substrate W.

Thus, the liquid disappears from the upper surface of the substrate W, and the entire upper surface of the substrate W is exposed. No droplets are present on the upper surface of the substrate W after the hole H is expanded over the entire region. Accordingly, drying of the substrate W is completed.

The liquid film LF1 can be removed from the substrate W without bringing the gas-liquid interface GL1 formed on the inner circumference of the vapor layer forming part VF1 into contact with the pattern P1 by moving the annular vapor layer forming part VF1. Thus, since the surface tension exerted by the organic solvent on the pattern P1 on the substrate W can be curbed, the collapse of the pattern P1 can be curbed or prevented.

When the predetermined heating period elapses from the start of the radiation of the first lamp heater 252, the controller 3R stops the supply of electric power to the first lamp heater 252 and the second lamp heater 272 to stop the light emission of the first lamp heater 252 and the second lamp heater 272.

Further, the controller 3R controls the spin motor 219 to stop the rotation of the substrate W (Step S41 in FIG. 33).

After the rotation of the substrate W is stopped, an unloading step (Step S42 in FIG. 33) of unloading the substrate W from the chamber 4 is performed. Step S42 of FIG. 33 is the same as Step S22 of the first example of the substrate processing (refer to FIG. 24).

According to the fifth embodiment, in addition to the effects described in relation to the fourth embodiment, the following effects are exhibited.

That is, on the upper surface of the substrate W, the first spraying region RB13 is smaller than the first heating region RH11. Additionally, on the upper surface of the substrate W, the entire first spraying region RB13 is disposed inside the outer edge of the first heating region RH11. Therefore, the gas can be reliably sprayed to the vapor layer forming part VF1 formed by heating the heating region. Thus, the hole HI can be easily formed in the vapor layer forming part VF1.

Further, in the first example of the substrate processing according to the fifth embodiment, as in the second example of the substrate processing according to the fourth embodiment, in the movement of the vapor layer forming part VF1, a gas may be sprayed not only on the first spraying region RB13 but also on the second spraying region RB12, and the second spraying region RB12 may be moved according to the movement of the first spraying region RB13.

Further, in the first example of the substrate processing according to the fifth embodiment, as in the third example of the substrate processing according to the fourth embodiment, in the movement of the vapor layer forming part VF1, the substrate W may be heated simply by heating the first heating region RH11 from the first lamp heater 252 without performing the heating of the second heating region RH12 from the second lamp heater 272.

Figure 35:
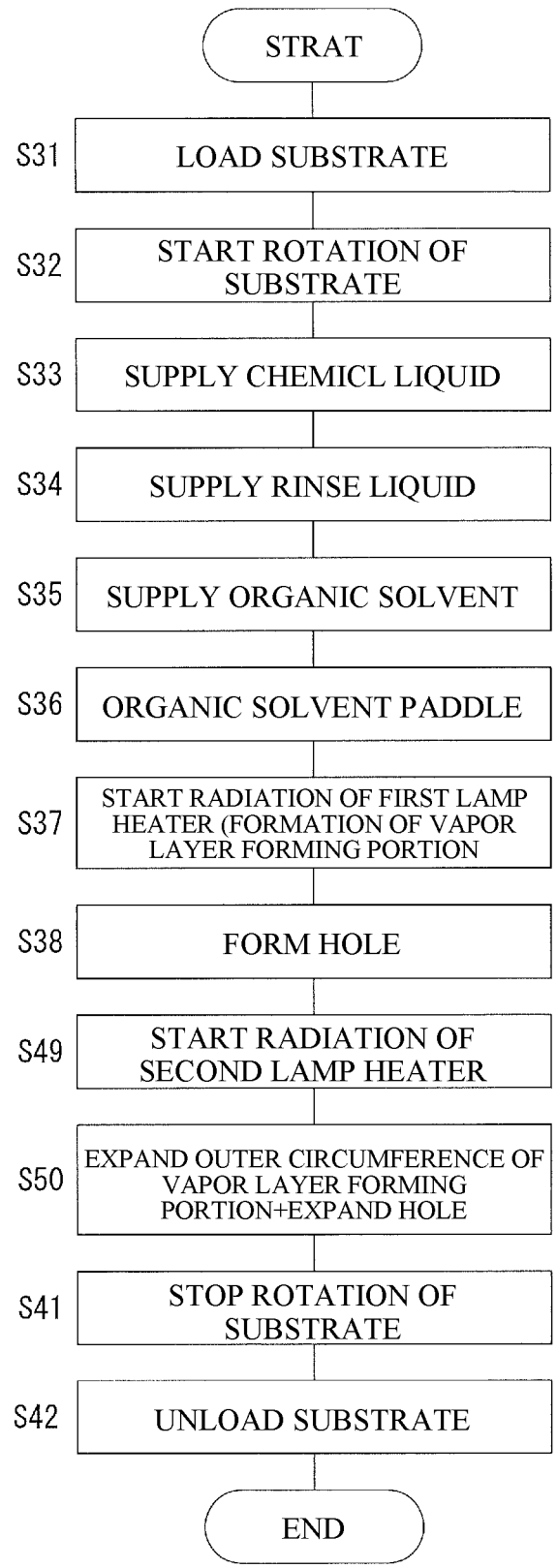
FIG. 35 is a process diagram for explaining a second example of the substrate processing performed by the substrate processing apparatus according to the fifth embodiment.

FIG. 35 is a process diagram for explaining a second example of the substrate processing performed by the substrate processing apparatus 1S according to the fifth embodiment. FIGS. 36A to 36D are schematic views showing states of the substrate W when the second example of the substrate processing according to the fifth embodiment is performed. In the second example of the substrate processing according to the fifth embodiment, the same steps as those of the first example of the substrate processing according to the fifth embodiment are designated by the same reference numerals in FIG. 35.

In the second example of the substrate processing according to the fifth embodiment, the vapor layer forming part moving step (Step S50 in FIG. 35) is started after the start of the radiation of the light from the second lamp heater 272. Further, in the vapor layer forming part moving step (Step S50 in FIG. 35), the upper surface head 330 does not move in the horizontal direction. That is, the vapor layer forming part VF1 is moved toward the outer circumference of the substrate W while the upper surface head 330 is stationary at the center processing position.

In the second example of the substrate processing according to the fifth embodiment, after the hole forming step (Step S38 in FIG. 35) of forming a hole H in the liquid film LF1 is performed, the heating of the substrate W by the second lamp heater 272 is started (Step S49 in FIG. 35). Prior to the start of the light emission of the second lamp heater 272, the second lamp heater 272 is disposed at a radiation start position PS2 closer to the rotation axis A11 than the radiation start position PS1 (refer to FIG. 25D and the like) in the first to third examples of the substrate processing according to the fourth embodiment. Then, at a predetermined timing after the formation of the hole H, the controller 3R starts the supply of electric power to the second lamp heater 272 to start the light emission of the second lamp heater 272. The second heating region RH12 is formed by the substrate W being heated by the second lamp heater 272. Further, the heating of the substrate W by the second lamp heater 272 may be started before the formation of the hole H. A distance between the inner circumferential end of the second heating region RH12 by the second lamp heater 272 disposed at the radiation start position PS2 and the rotation axis A11 is shorter than a distance between the outer circumferential end of the first heating region RH11 disposed in the center portion of the substrate W and the rotation axis A11.

Figure 36A:
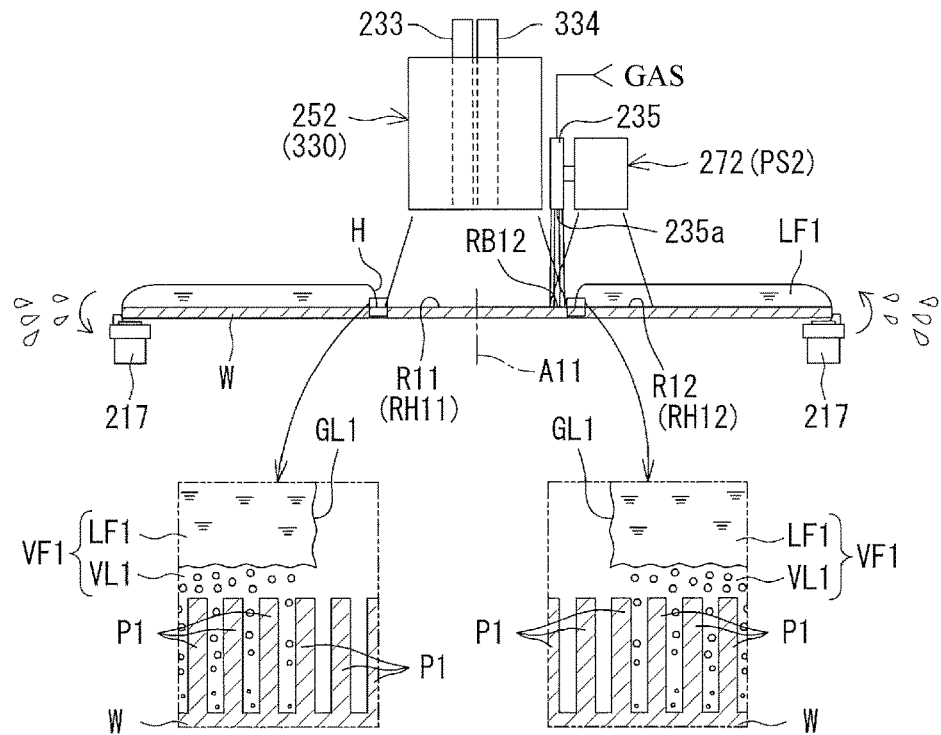
FIGS. 36A and 36B are schematic views showing a state of the substrate when the second example of the substrate processing performed by the substrate processing apparatus according to the fifth embodiment is performed.

Further, the hole HI formed by the hole forming step (step S38 in FIG. 35) is expanded. The expansion of the hole H is performed by the controller 3R controlling the spin motor 219 to temporarily increase a rotation speed of the substrate W. Then, the controller 3R opens the second gas valve 298 and starts the discharge of the gas from the second gas discharge port 235a of the second gas nozzle 235 (a second spraying step). A temperature of the gas supplied to the second gas nozzle 235 may be room temperature or higher than room temperature. Thus, as shown in FIG. 36A, an outer diameter of the hole H is expanded.

Prior to the performance of the vapor layer forming part moving step (Step S50 in FIG. 35), the heating of the substrate W by the second lamp heater 272 is started (Step S49 in FIG. 35).

Next, a vapor layer forming part moving step (Step S50 in FIG. 35) is performed. The vapor layer forming part moving step (Step S50 in FIG. 35) includes an outer circumference expanding step of expanding the outer circumference of the vapor layer forming part VF1 and a hole expanding step of expanding the outer edge of the hole H (that is, the inner circumference of the vapor layer forming part VF1). The hole expanding step is performed in parallel with the outer circumference expanding step.

Figure 36B:
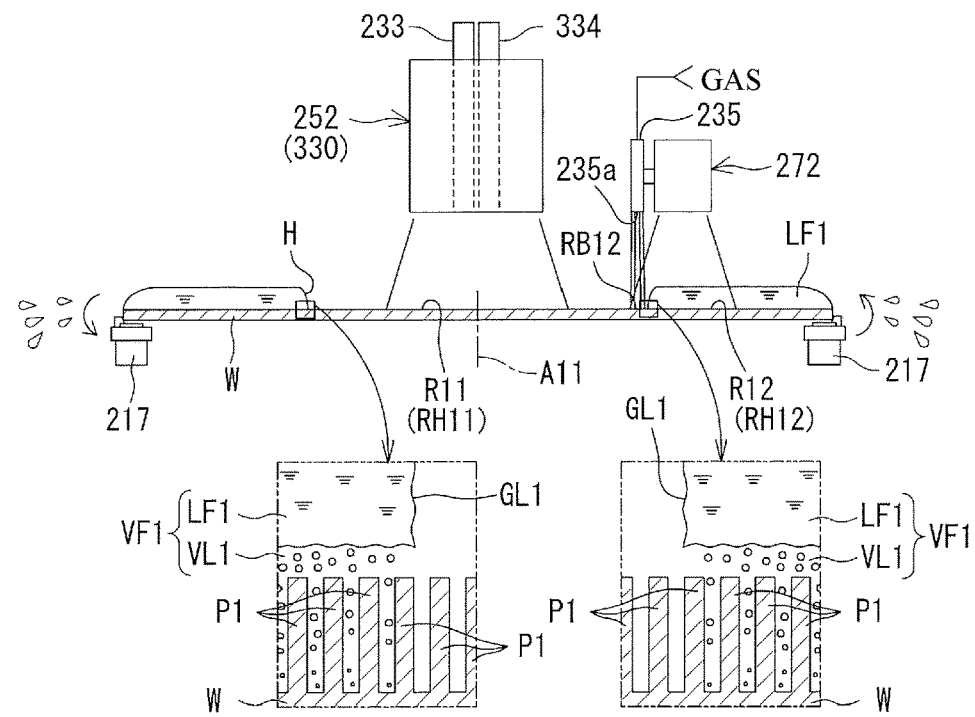

In the second example of the substrate processing according to the fifth embodiment, as shown in FIG. 36B, in the vapor layer forming part moving step (Step S50 in FIG. 35), the vapor layer forming part VF1 is moved toward the outer circumference of the substrate W while the upper surface head 330 is stationary at the center processing position.

In the vapor layer forming part moving step (Step S50 in FIG. 35), the controller 3R controls the first moving device 239 (refer to FIG. 17) to move the second lamp heater 272 and the second gas nozzle 235 horizontally toward the outer circumference of the substrate W while the gas is discharged from the second gas nozzle 235 and the light is radiated from the second lamp heater 272. Thus, the second heating region RH12 moves in the upper surface of the substrate W toward the outer circumference of the substrate W. As the second heating region RH12 moves, the outer circumference of the annular vapor layer forming part VF1 is expanded (an outer circumference expanding step).

Further, the inner circumference of the vapor layer forming part VF1 is pushed toward the outer circumference of the substrate W by spraying the gas into the second spraying region RB12 set inside the inner circumference of the vapor layer forming part VF1. Since the second gas nozzle 235 is provided to be movable with the second lamp heater 272, the second spraying region RB12 moves while a constant distance from the second heating region RH12 is maintained (a second spraying region moving step). The second spraying region RB12 moves toward the outer circumference of the substrate W according to the movement of the second heating region RH12 to the outer circumference of the substrate W. The outer edge of the hole H, that is, the inner circumference of the vapor layer forming part VF1 is expanded by moving the second spraying region RB12 toward the outer circumference of the substrate W (a hole expanding step). In the vapor layer forming part VF1, since the frictional resistance acting on the liquid film LF1 on the substrate W is small enough that it can be regarded as zero, the inner circumference of the vapor layer forming part VF1 can be smoothly expanded toward the outer circumference of the substrate W by a small pushing force due to the flow of gas. The inner circumference of the vapor layer forming part VF1 can be expanded by spraying the gas onto the second spraying region RB12 and moving the second spraying region RB12 toward the outer circumference of the substrate W while the inner circumference position of the vapor layer forming part VF1 is controlled with high accuracy. The gas-liquid interface GL1 formed on the inner circumference of the vapor layer forming part VF1 moves toward the outer circumference of the substrate W while a height position thereof is maintained to be higher than the upper end of the pattern P1.

Further, the expansion of the hole HI in the hole expanding step is promoted not only by the spraying of the gas but also by the centrifugal force due to the rotation of the substrate W acting on the organic solvent on the upper surface of the substrate W. Then, the liquid film LF1 outside the vapor layer forming part VF1 is pushed outward and discharged to the outside of the substrate W by the organic solvent moving from the center portion side of the substrate W.

Figure 36C:
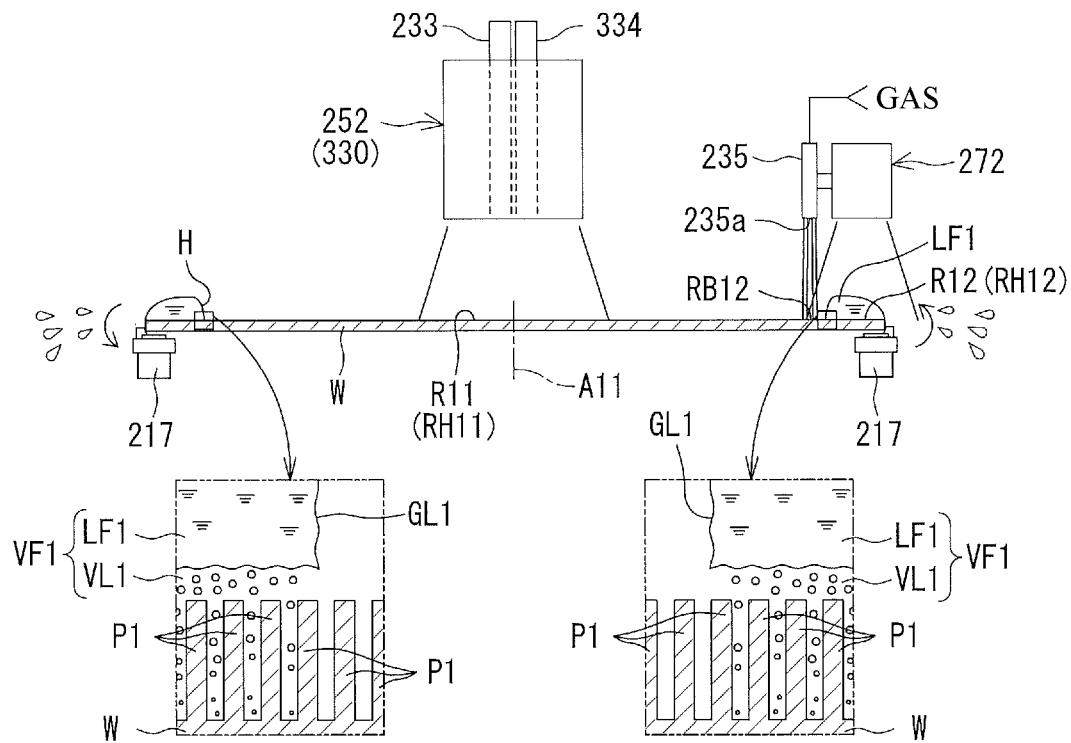
FIGS. 36C and 36D are schematic views showing a state subsequent to that of FIG. 36B.

As shown in FIG. 36B, due to the further expansion of the outer circumference of the vapor layer forming part VF1 and the outer edge of the hole H, the liquid film LF1 outside the vapor layer forming part VF1 is excluded from the substrate W, and only the annular vapor layer forming part VF1 remains on the upper surface of the substrate W. Then, as shown in FIG. 36C, when the second spraying region RB12 reaches the outer circumferential portion of the substrate W, the outer edge of the hole H (that is, the inner circumference of the vapor layer forming part VF1) is expanded to the outer circumference of the upper surface of the substrate W, and the liquid film LF1 of the vapor layer forming part VF1 is discharged from the substrate W.

Figure 36D:
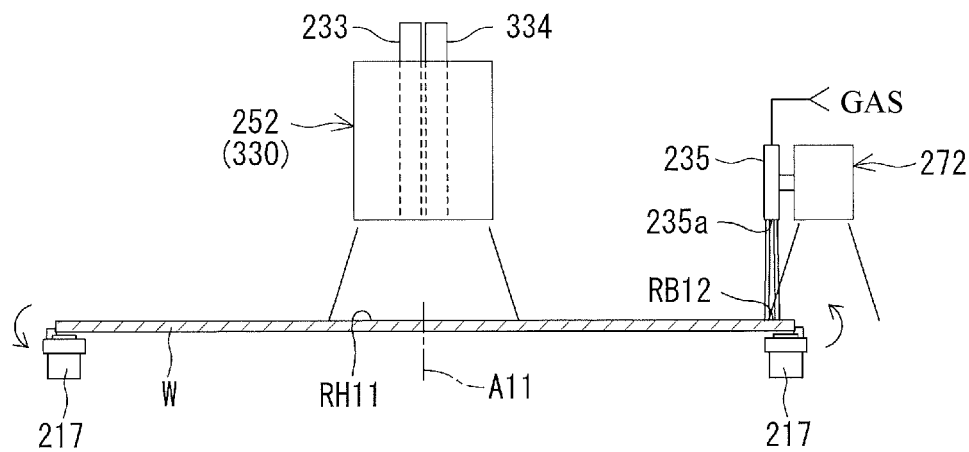

Thus, the liquid disappears from the upper surface of the substrate W, and as shown in FIG. 36D, the entire upper surface of the substrate W is exposed. No droplets are present on the upper surface of the substrate W after the hole H is expanded over the entire region. Accordingly, drying of the substrate W is completed.

Figure 37A:
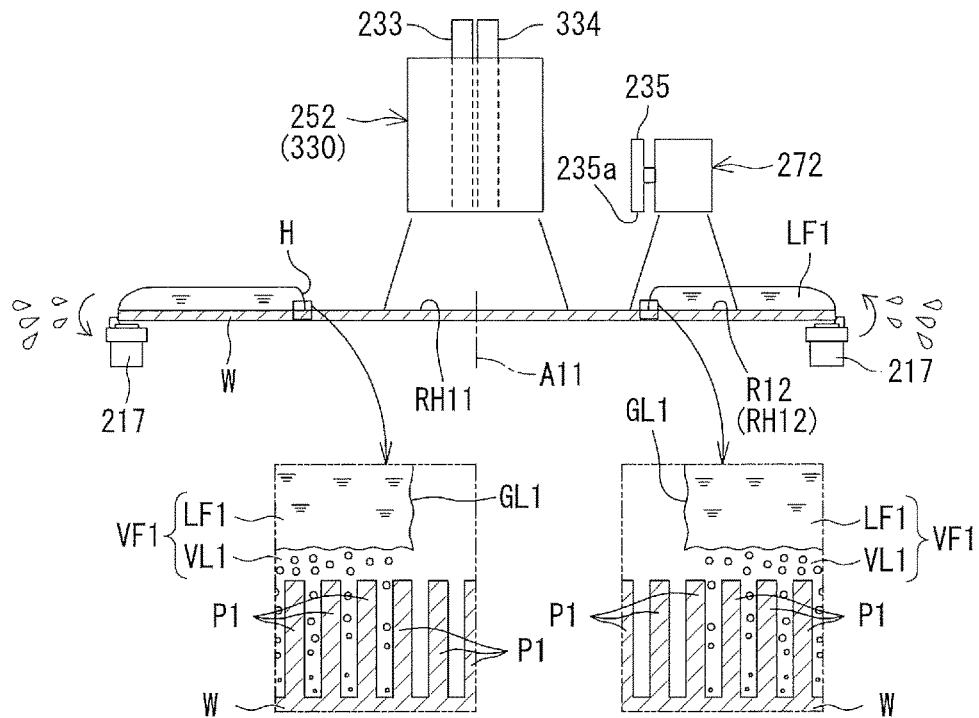
FIGS. 37A and 37B are schematic views showing a state of the substrate when a modified example of the second example of the substrate processing performed by the substrate processing apparatus according to the fifth embodiment is performed.
Figure 37B:
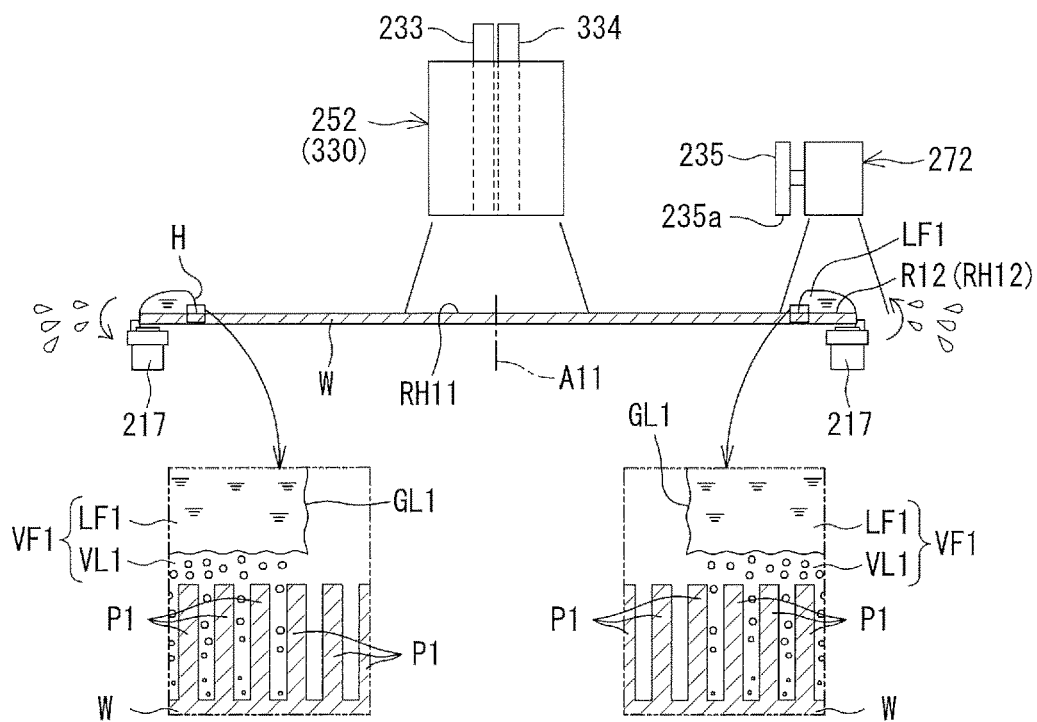
Figure 37C:
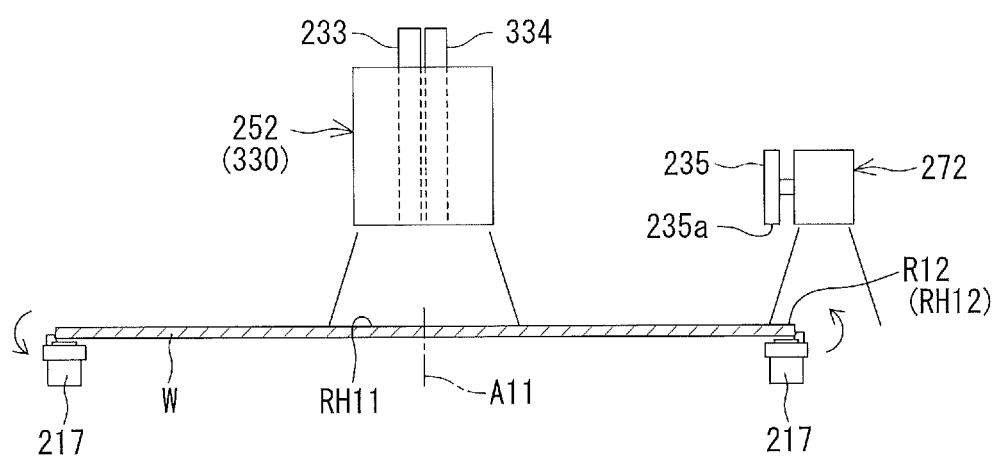
FIG. 37C is a schematic view showing a state subsequent to that of FIG. 37B.

FIGS. 37A to 37C are schematic views showing states of the substrate W when a modified example of the second example of the substrate processing according to the fifth embodiment is performed.

In the modified examples shown in FIGS. 37A to 37C, the gas is not sprayed to the inside of the inner circumference of the vapor layer forming part VF1 by the second gas nozzle 235. The expansion of the hole H in the vapor layer forming part moving step (Step S50 in FIG. 36) is performed mainly by applying a centrifugal force due to the rotation of the substrate W to the organic solvent on the upper surface of the substrate W.

In the modified example, as shown in FIG. 37A, in the vapor layer forming part moving step (Step S50 in FIG. 35), the controller 3R controls the first moving device 239 to move the second lamp heater 272 horizontally toward the outer circumference of the substrate W while the light is radiated from the second lamp heater 272. Thus, the second heating region RH12 moves in the upper surface of the substrate W toward the outer circumference of the substrate W. The outer circumference of the annular vapor layer forming part VF1 is expanded according to the movement of the second heating region RH12 (an outer circumference expanding step).

Further, a moving speed of the forming part in the vapor layer forming part moving step (Step S50 in FIG. 35) is set to a speed at which a centrifugal force due to the rotation of the substrate W acts on the vapor layer forming part VF1 disposed at the center portion of the upper surface of the substrate W. The inner circumference of the vapor layer forming part VF1 is pushed toward the outer circumference of the substrate W by the centrifugal force due to the rotation of the substrate W. Due to the centrifugal force generated by the rotation of the substrate W, the outer edge of the hole H, that is, the inner circumference of the vapor layer forming part VF1 is expanded (a hole expanding step). In the vapor layer forming part VF1, since the frictional resistance acting on the liquid film LF1 on the substrate W is small enough that it can be regarded as zero, the inner circumference of the vapor layer forming part VF1 can be smoothly expanded toward the outer circumference of the substrate W by a small force such as the centrifugal force due to the rotation of the substrate W. The gas-liquid interface GL1 formed on the inner circumference of the vapor layer forming part VF1 moves toward the outer circumference of the substrate W while a height position thereof is maintained to be higher than the upper end of the pattern P1.

Due to the further expansion of the outer circumference of the vapor layer forming part VF1 and the outer edge of the hole H, as shown in FIG. 37B, the liquid film LF1 outside the vapor layer forming part VF1 is excluded from the substrate W, and only the annular vapor layer forming part VF1 remains on the upper surface of the substrate W. Additionally, as shown in FIG. 37C, when the second spraying region RB12 reaches the outer circumferential portion of the substrate W, the outer edge of the hole H (that is, the inner circumference of the vapor layer forming part VF1) is expanded to the outer circumference of the upper surface of the substrate W, and the liquid film LF1 of the vapor layer forming part VF1 is discharged from the substrate W.

Thus, the liquid disappears from the upper surface of the substrate W, and the entire upper surface of the substrate W is exposed. No droplets are present on the upper surface of the substrate W after the hole H is expanded over the entire region. Accordingly, drying of the substrate W is completed.

In the second example of the substrate processing according to the fifth embodiment and the modified example thereof shown in FIGS. 35 to 37C, after the movement of the vapor layer forming part VF1 is started, the controller 3R closes the first gas valve 248 to stop the discharge of the gas from the first gas nozzle 334. However, the gas may be continuously discharged from the first gas nozzle 334 even after the movement of the vapor layer forming part VF1 is started, and the gas may be discharged until the liquid film LF1 is removed from the substrate W.

Further, in the second example of the substrate processing according to the fifth embodiment and the modified example thereof shown in FIGS. 35 to 37C, although the heating of the first heating region RH11 by the first lamp heater 252 is continued until the liquid film LF1 of the vapor layer forming part VF1 is discharged from the substrate W, the heating of the first heating region RH11 by the first heating region RH11 may be stopped at a predetermined timing after the start of movement of the vapor layer forming part VF1.

Further, in the modified example of the second example of the substrate processing according to the fifth embodiment shown in FIGS. 37A to 37C, the outer edge of the hole H (that is, the inner circumference of the vapor layer forming part VF1) may be expanded by increasing the flow rate of the gas discharged from the first gas nozzle 334. Specifically, the controller 3R increases an opening degree of the first flow rate adjusting valve 249 to gradually (stepwise or continuously) increase the flow rate of the gas discharged from the first gas nozzle 334. Thus, the outer edge of the hole H (that is, the inner circumference of the vapor layer forming part VF1) is gradually expanded.

Sixth Embodiment

Figure 38:
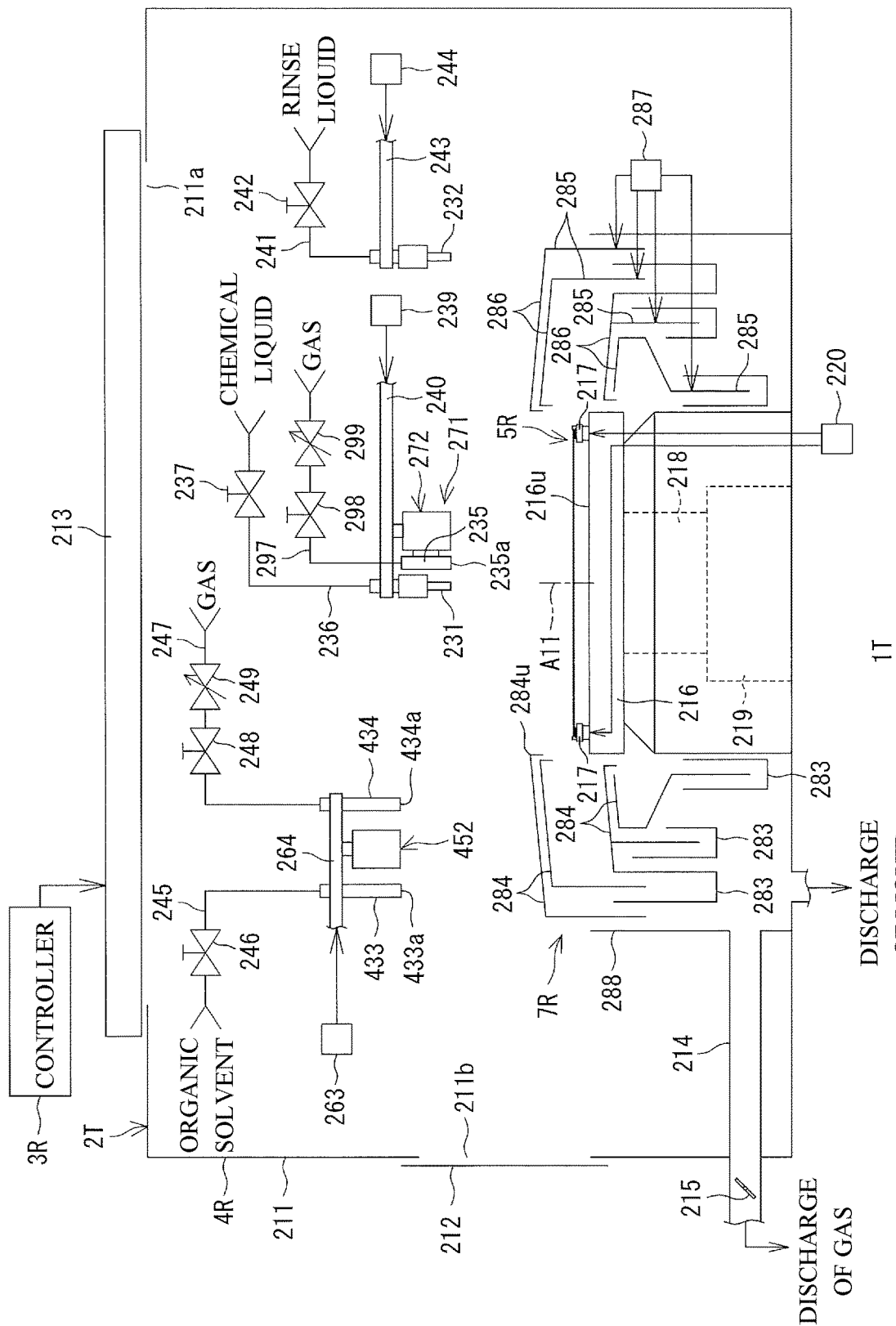
FIG. 38 is a schematic view of the inside of a processing unit provided in a substrate processing apparatus according to a sixth embodiment of the disclosure when seen horizontally.
Figure 39:
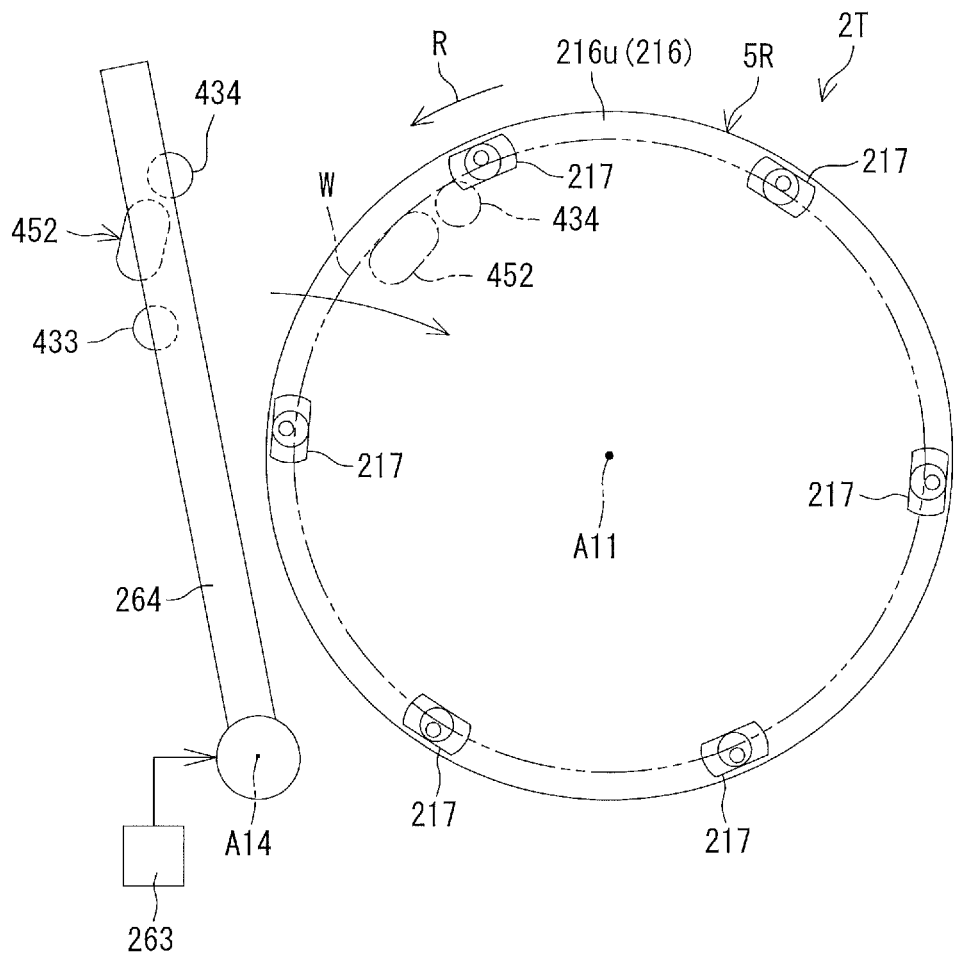
FIG. 39 is a schematic view of a spin base shown in FIG. 38 and related configurations thereof when seen from above.
Figure 40:
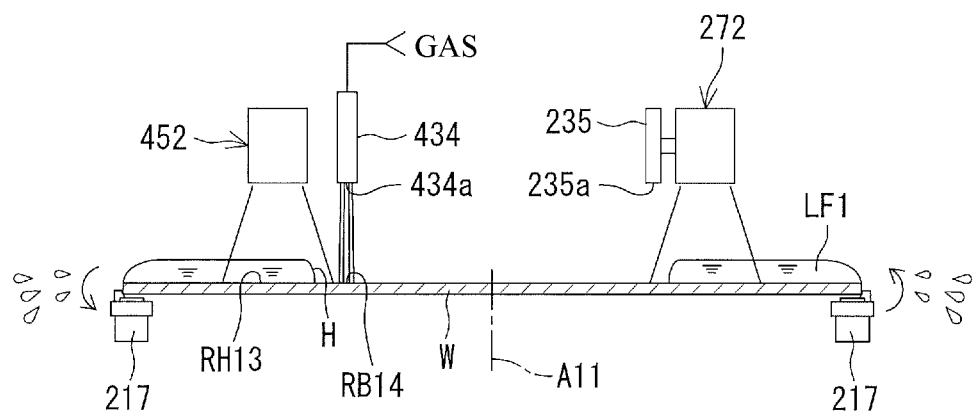
FIG. 40 is a process diagram for explaining an example of the substrate processing performed by the substrate processing apparatus.

FIG. 38 is a schematic view of the inside of a processing unit 2T provided in a substrate processing apparatus 1T according to a sixth embodiment of the disclosure when seen horizontally. FIG. 39 is a schematic view of the spin base 216 and related configurations thereof when seen from above. FIG. 40 is a process diagram for explaining an example of the substrate processing performed by the substrate processing apparatus 1T.

A main difference between the substrate processing apparatus 1T according to the sixth embodiment and the substrate processing apparatus 1 according to the first embodiment is that the first gas nozzle 434 and the first lamp heater 452 have different housings from each other. The first gas nozzle 434 is not supported by the first lamp heater 452, but is supported by the third arm 264 which supports the first lamp heater 452. Hereinafter, a specific description will be provided.

The processing unit 2T includes an organic solvent nozzle (a processing liquid nozzle) 433, a first gas nozzle 434, and a first lamp heater 452, instead of the organic solvent nozzle 233, the first gas nozzle 234 and the first lamp heater 252 according to the first embodiment. The organic solvent nozzle 433, the first gas nozzle 434, and the first lamp heater 452 are individually supported by the third arm 264. FIG. 39 shows the third arm 264 and related configurations thereof, and the illustration of the first arm 240, the second arm 243 and the related configurations thereof is omitted.

The organic solvent pipe 245 is connected to the organic solvent nozzle 433. When the organic solvent valve 246 is opened, the organic solvent is continuously discharged downward from the discharge port of the organic solvent nozzle 233. The organic solvent supply unit (the processing liquid supply unit) is configured of the organic solvent nozzle 433, the organic solvent pipe 245, and the organic solvent valve 246.

The first gas pipe 247 is connected to the first gas nozzle 434. When the first gas valve 248 is opened, the gas is continuously discharged downward from a first gas discharge port 434a of the first gas nozzle 434 at a flow rate corresponding to the opening degree of the first flow rate adjusting valve 249 which changes the gas flow rate.

The first lamp heater 452 has a configuration equivalent to that of the second lamp heater 272 (refer to FIGS. 20 and 21 and the like). The first heating region RH13 on the upper surface of the substrate W is heated by heating the substrate W due to the radiation of the light from the first lamp heater 452. The first heating region RH13 is smaller than the first heating region RH11 (refer to FIG. 25D and the like) by the first lamp heater 252.

As shown by an alternate long and two short dashes line in FIG. 39, when the first lamp heater 452 is disposed corresponding to the outer circumferential portion of the upper surface of the substrate W, the first gas nozzle 434 is disposed on the upstream side in the rotation direction R of the substrate W with respect to the first lamp heater 452.

That is, on the upper surface of the substrate W, a fourth spraying region RB14 (refer to FIG. 40) on which the gas from the first gas nozzle 434 is sprayed is set on the upstream side in the rotation direction R of the substrate W with respect to the first heating region RH13 (refer to FIG. 40) which is heated by the radiation of light from the first lamp heater 452.

In the processing unit 2T, the processing equivalent to each substrate processing according to the fourth embodiment and the substrate processing according to the fifth embodiment is performed.

OTHER EMBODIMENTS

The disclosure is not limited to the above-described embodiments and can be implemented in other embodiments.

For example, in the substrate processing apparatus 1P according to the second embodiment, the heating fluid nozzle 13 according to the third embodiment can be provided instead of the heater unit 6.

Further, the low surface tension liquid nozzle 10 may be disposed between the lamp unit 12 and the gas nozzle 11. Specifically, the low surface tension liquid nozzle 10 may be mounted on the outer wall surface 81a of the lamp housing 81 of the lamp unit 12, and the gas nozzle 11 may be mounted on the low surface tension liquid nozzle 10 at a position opposite to the lamp unit 12. Further, the lamp unit 12, the low surface tension liquid nozzle 10, and the gas nozzle 11 may be configured to be movable independently.

After the liquid film excluding step is completed, a spin drying step of shaking off the liquid from the upper surface of the substrate W may be performed. Specifically, after the liquid film L is excluded from the upper surface of the substrate W, the spin motor 23 accelerates the rotation of the substrate W to rotate the substrate W at a high speed which is a predetermined drying speed. The drying speed is, for example, 1500 rpm. The spin drying step is performed for a predetermined time, for example 30 seconds. Accordingly, even when a small amount of the low surface tension liquid remains on the substrate W, a large centrifugal force acts on the low surface tension liquid, and the low surface tension liquid is shaken off around the substrate W.

In each substrate processing according to the fourth embodiment and the substrate processing according to the fifth embodiment, after the liquid film LF1 of the vapor layer forming part VF1 is discharged from the substrate W, the shaking-off drying processing may be performed. Specifically, the controller 3R controls the spin motor 219 to rotate the substrate W at a high rotation speed (for example, several thousand rpm) higher than the chemical liquid supply speed, the rinse liquid supply speed, and the replacement speed. Even when droplets of the organic solvent remain on the upper surface of the substrate W, the droplets are removed from the upper surface of the substrate W, and the substrate W is dried. When a predetermined time elapses from the start of high-speed rotation of the substrate W, the controller 3R controls the spin motor 219 to stop the rotation of the substrate W.

Further, in the movement of the vapor layer forming part VF1 according to each substrate processing according to the fourth embodiment and the substrate processing according to the fifth embodiment, the amount of heat applied to the first heating regions RH11 and RH13 and/or the second heating region RH12 may be increased toward the outer circumference of the substrate W. Specifically, an output of the first lamp heaters 252 and 452 and/or the second lamp heater 272 may be increased toward the outer circumference of the substrate W, and the height positions of the first lamp heaters 252 and 452 and the second lamp heater 272 may be lowered toward the outer circumference of the substrate W to be closer to the substrate W. Also, both an increase in the output and a descent in the height position may be performed. Thus, the amount of heat per unit area applied to the substrate W can be maintained to be high.

Further, the second example of the substrate processing of the fifth embodiment and the modified example thereof may be combined with the fourth embodiment and the sixth embodiment. That is, in a state in which the upper surface head 230 and the first lamp heater 452 are maintained in a stationary state at the center processing position, the outer circumference of the vapor layer forming part VF1 may be expanded by moving the second heating region RH12 heated by the second lamp heater 272 toward the outer circumference of the substrate W.

In the first example of the substrate processing of the fourth embodiment and the first example of the substrate processing of the fifth embodiment, although the example in which the hole H is formed after the vapor layer forming part forming step (S17 in FIG. 24) and the vapor layer forming part forming step (S37 in FIG. 33) (S18 in FIGS. 24 and S38 in FIG. 33) has been described, the hole HI may be formed at the time when the vapor layer forming part VF1 is formed. That is, the ring-shaped vapor layer forming part VF1 may be formed in the vapor layer forming part forming step (S17 in FIG. 24) and the vapor layer forming part forming step (S37 in FIG. 33).

Further, in the second example of the substrate processing of the fourth embodiment, the hole H was formed in the liquid film LF1 of the vapor layer forming part VF1 by spraying a gas on the liquid film LF1 of the vapor layer forming part VF1 to partially exclude the organic solvent. However, as in the first example of the substrate processing of the fourth embodiment or the like, the hole HI may be formed in the center portion of the liquid film LF1 of the vapor layer forming part VF1 by the centrifugal force applied to the liquid film LF1 of the vapor layer forming part VF1 or the heat convection generated on the upper surface of the substrate W.

Further, in the first and third examples of the substrate processing according to the fourth embodiment, and the fifth embodiment and the sixth embodiment, the hole H may be formed in the center portion of the liquid film LF1 of the vapor layer forming part VF1 by spraying a gas onto the liquid film LF1 of the vapor layer forming part VF1 to partially exclude the organic solvent.

Further, in the fourth to sixth embodiments, although the configuration in which the second gas nozzle 235 is supported by the first arm 240 which supports the second lamp heater 272 has been described as an example, the second gas nozzle 235 may be supported by an arm different from the arm which supports the second lamp heater 272. That is, the second gas nozzle 235 may not be provided to be movable with the second lamp heater 272.

Further, in the fourth to sixth embodiments, a discharge direction of the gas discharged from the first gas nozzles 234, 334 and 434 and/or the second gas nozzle 235 may be inclined outward with respect to the upper surface of the substrate W. That is, the gas discharged from the first gas nozzles 234, 334, and 434 and/or the second gas nozzle 235 moves toward the outside of the substrate W as it approaches the upper surface of the substrate W. In this case, the gas discharged from the first gas nozzles 234, 334, and 434 and/or the second gas nozzle 235 can be satisfactorily sprayed to the inside of the inner circumference of the vapor layer forming part VF1.

Further, in the fourth to sixth embodiments, when the gas is not sprayed on the second spraying region RB12 in the movement of the vapor layer forming part VF1, the second gas nozzle 235 and related configurations thereof (the second gas pipe 297, the second gas valve 298, the second flow rate adjusting valve 299, and the like) may be abolished.

Further, in the fourth to sixth embodiments, although the configuration in which the second lamp heater 272 is supported by the first arm 240 which supports the chemical liquid nozzle 231 has been described as an example, the second lamp heater 272 may be supported by an arm different from the arm which supports the chemical liquid nozzle 231.

Further, in the fourth to sixth embodiments, when the substrate W is not heated by the second lamp heater 272 in the movement of the vapor layer forming part VF1, the second lamp heater 272 may be abolished.

Further, in the fourth to sixth embodiments, the first gas nozzles 234,334, and 434 may be supported by an arm different from the third arm 264 which supports the first lamp heaters 252 and 452. That is, the first gas nozzles 234, 334 and 434 may not be provided to be movable with the first lamp heaters 252 and 452.

Further, in the fourth to sixth embodiments, although the example in which a total of two lamp heaters of the first lamp heaters 252 and 452 and the second lamp heater 272 are used has been described, the number of lamp heaters may be three or more.

Further, in the fourth to sixth embodiments, the light source (the first light source 258 or the second light source 278) used for the first lamp heaters 252 and 452 or the second lamp heater 272 may be a high output LED. In this case, a large LED can be exemplified as the high output LED. The liquid film LF1 can satisfactorily float in the vapor layer forming part VF1 by adopting a high output LED. Therefore, the collapse of the pattern P1 can be effectively curbed or prevented.

Further, the upper surface head 330 according to the second embodiment may be provided in a size which can cover not only a part of the substrate W held by the spin chuck 5R but also the entire upper surface of the substrate W. That is, a diameter of the lower surface of the upper surface head 330 may be equal to or larger than a diameter of the substrate W.

Further, a mode different from the above-described first lamp heaters 252 and 452 and second lamp heater 272 can be adopted as a mode of the lamp heater. For example, in lamp heaters 501 and 601 shown in FIGS. 41 and 42, two light emitting parts 501A and 601A are arranged at the bottom portions of lamp heaters 501 and 601 in a moving direction D1, and gas discharge ports 503 and 603 are formed between the two light emitting parts 501A and 601A in a bottom view.

Figure 41:
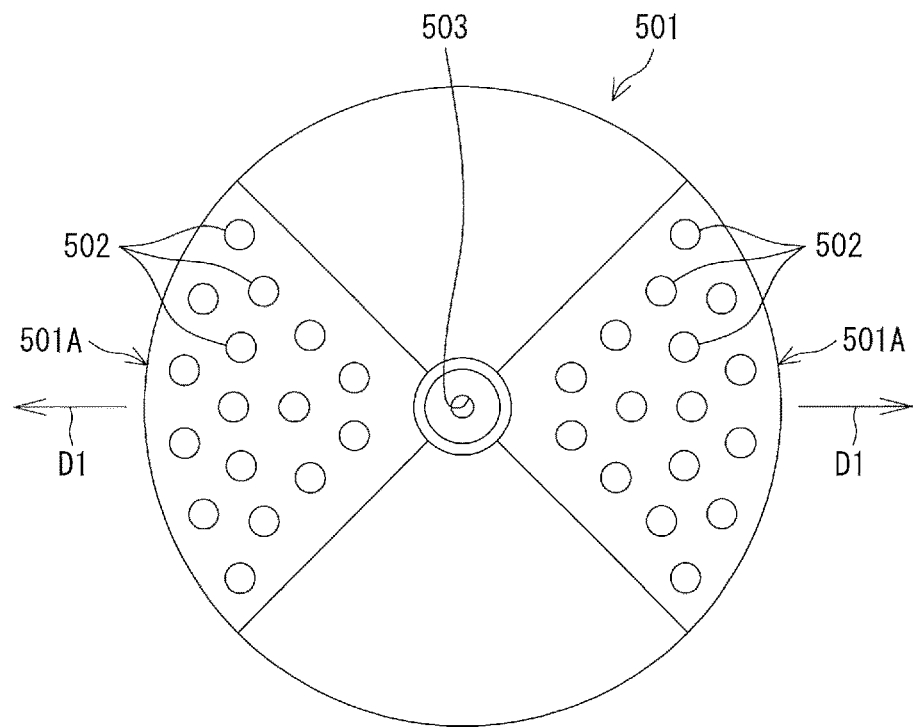
FIG. 41 is a schematic bottom view for explaining a first modified example according to the disclosure.

In the lamp heater 501 shown in FIG. 41, the light emitting part 501A including a plurality of light sources 502 is formed only in two regions in the moving direction D1 among the regions in which the circular bottom surface is divided into four.

Figure 42:
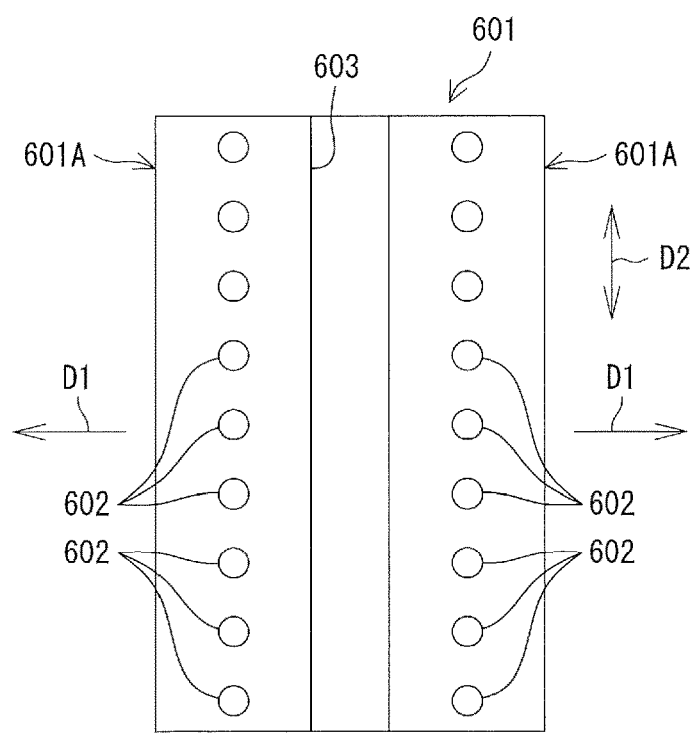
FIG. 42 is a schematic bottom view for explaining a second modified example according to the disclosure.

In the lamp heater 601 shown in FIG. 42, light sources 602 included in each of light emitting parts 601A are arranged in an arrangement direction D2 orthogonal to the moving direction D1 in a bottom view. A gas discharge port 603 extends in an elongated shape in the arrangement direction D2.

Moreover, although the organic solvent has been exemplified as the processing liquid included in the liquid film LF1, a liquid other than the organic solvent may be used as the processing liquid.

In each of the above-described embodiments, the first light source 58 of the first lamp heaters 252 and 452 and the second light source 278 of the second lamp heater 272 may be other than the LED light source. Examples of the first light source 258 and the second light source 278 include fluorescent lamps, mercury lamps, metal halide lamps, halogen lamps, xenon lamps, Na lamps. UV lamps and the like. Further, the first light source 258 and the second light source 278 may be configured of a planar illuminant instead of a point illuminant.

Further, in the above-described embodiment, although the case in which the substrate processing apparatuses 1, 1P, 1Q, 1R, 1S, and 1T are apparatuses for processing the substrate W made of a semiconductor wafer has been described, they may be apparatuses for processing a substrate such as an LCD display device substrate, a flat panel display (FPD) substrate for an organic electroluminescence (EL) display device, an optical disc substrate, a magnetic disc substrate, a magneto-optical disc substrate, a photo-mask substrate, and a ceramic substrate, a solar cell substrate.

Two or more of all the above-described configurations may be combined. Two or more of all the above-described steps may be combined.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A substrate processing method, comprising:
    a liquid film forming step of supplying a processing liquid to an upper surface of a substrate which is horizontally held and has a pattern formed on the upper surface and forming a liquid film of the processing liquid on the upper surface of the substrate;
    a vapor layer forming part forming step of forming a vapor layer between the processing liquid and the upper surface of the substrate at a center portion of the upper surface of the substrate and forming a vapor layer forming part, in which the liquid film is held, on the vapor layer by radiating light to the center portion of the upper surface of the substrate from above the liquid film and heating a heating region which is set on the center portion of the upper surface of the substrate and is not set at an outer circumferential portion of the upper surface of the substrate;
    a substrate rotating step of forming the vapor layer forming part in an annular shape having a hole formed in the liquid film inside by rotating the substrate, in which the vapor layer forming part is formed on the center portion of the upper surface, around a vertical rotation axis passing through the center portion of the substrate; and
    a vapor layer forming part moving step of moving the annular vapor layer forming part toward an outer circumference of the substrate by moving the heating region toward the outer circumference of the substrate to expand an outer circumference of the vapor layer forming part and to expand the hole in parallel with the substrate rotating step.

2. The substrate processing method according to claim 1, wherein the vapor layer forming part forming step comprises a step of forming the vapor layer forming part by radiating light to the center portion of the upper surface of the substrate and heating a first heating region which is set on the center portion of the upper surface of the substrate and is not set at the outer circumferential portion of the upper surface of the substrate, and
    an auxiliary heating step of assisting heating of the vapor layer forming part by radiating light to the upper surface of the substrate and heating a second heating region on the upper surface of the substrate of which at least a part does not overlap the first heating region in a rotation direction of the substrate is further comprised in parallel with the vapor layer forming part moving step.

3. The substrate processing method according to claim 2, wherein the vapor layer forming part moving step comprises a step of moving at least one of the first heating region and the second heating region toward the outer circumference of the substrate.

4. The substrate processing method according to claim 3, wherein the vapor layer forming part moving step comprises a step of moving both the first heating region and the second heating region toward the outer circumference of the substrate.

5. The substrate processing method according to claim 1, wherein the vapor layer forming part moving step comprises a spraying step of spraying a gas toward a spraying region set inside an inner circumference of the vapor layer forming part.

6. The substrate processing method according to claim 5, wherein the spraying region is set on an upstream side in a rotation direction of the substrate with respect to the heating region.

7. The substrate processing method according to claim 5, wherein:
    the spraying region is smaller than the heating region, and
    the entire spraying region is disposed inside an outer edge of the heating region.

8. The substrate processing method according to claim 5, further comprising a spraying region moving step of moving the spraying region toward the outer circumference of the substrate in parallel with the spraying step.

9. The substrate processing method according to claim 8, wherein:
    the spraying step comprises a first spraying step of spraying a gas toward a first spraying region set inside the inner circumference of the vapor layer forming part, and a second spraying step of spraying a gas toward a second spraying region set inside the inner circumference of the vapor layer forming part and separated from the first spraying region in a rotation direction of the substrate in parallel with the first spraying step, and
    the spraying region moving step comprises a first spraying region moving step of moving the first spraying region toward the outer circumference of the substrate in parallel with the first spraying step, and a second spraying region moving step of moving the second spraying region toward the outer circumference of the substrate in parallel with the second spraying step.

10. The substrate processing method according to claim 1, further comprising a step of forming the hole in the liquid film of the vapor layer forming part by spraying a gas onto the liquid film of the vapor layer forming part and partially excluding the processing liquid in parallel with the substrate rotating step.

11. The substrate processing method according to claim 1, wherein the light radiated to the heating region has a wavelength which is able to be transmitted through the processing liquid.

12. The substrate processing method according to claim 1, wherein an outer circumference of the vapor layer formed in the vapor layer forming part forming step is positioned more inside than the outer circumferential portion of the upper surface of the substrate.

13. A substrate processing apparatus, comprising:
    a substrate holding unit which horizontally holds a substrate having a pattern formed on a surface thereof;
    a substrate rotating unit which rotates the substrate held by the substrate holding unit around a vertical rotation axis which passes through a center portion of the substrate;

a processing liquid supply unit which has a processing liquid nozzle and supplies a processing liquid from the processing liquid nozzle to an upper surface of the substrate held by the substrate holding unit;

a lamp heater which has a light emitting part, is provided to be smaller than the substrate held by the substrate holding unit when seen from above, and radiates light from the light emitting part toward the upper surface of the substrate held by the substrate holding unit;

a heating region moving unit which moves a heating region heated by radiation of light by the lamp heater on the upper surface of the substrate held by the substrate holding unit within the upper surface of the substrate;

a spraying unit which has a gas nozzle having a gas discharge port and sprays a gas from the gas nozzle onto the upper surface of the substrate held by the substrate holding unit; and a controller which controls the substrate rotating unit, the processing liquid supply unit, the lamp heater, the heating region moving unit, and the spraying unit, wherein the controller is programmed to perform a liquid film forming step of supplying the processing liquid to the upper surface of the substrate, which is the surface, with the processing liquid supply unit and forming a liquid film of the processing liquid on the upper surface of the substrate, a vapor layer forming part forming step of forming a vapor layer between the processing liquid and the upper surface of the substrate at a center portion of the upper surface of the substrate and forming a vapor layer forming part, in which the liquid film is held, on the vapor layer by radiating light to the center portion of the upper surface of the substrate from above the liquid film with the lamp heater and heating a heating region which is set on the center portion of the upper surface of the substrate and is not set at an outer circumferential portion of the upper surface of the substrate, a substrate rotating step of forming the vapor layer forming part in an annular shape having a hole formed in the liquid film inside by rotating the substrate, in which the vapor layer forming part is formed on the center portion of the upper surface, around the rotation axis with the substrate rotating unit, and a vapor layer forming part moving step of moving the annular vapor layer forming part toward an outer circumference of the substrate by moving the heating region toward the outer circumference of the substrate with the heating region moving unit to expand an outer circumference of the vapor layer forming part and to expand the hole with at least one of the spraying unit and the substrate rotating unit in parallel with the substrate rotating step.

14. The substrate processing apparatus according to claim 13, wherein an outer circumference of the vapor layer formed in the vapor layer forming part forming step is positioned more inside than the outer circumferential portion of the upper surface of the substrate.

15. The substrate processing apparatus according to claim 13, further comprising a spraying region moving unit that moves, within the upper surface of the substrate, a spraying region to which the gas is sprayed by the spraying unit, wherein the controller further controls the spraying region moving unit, and the controller is further programmed to perform a spraying step of spraying a gas by the spraying unit toward a spraying region set inside an inner circumference of the vapor layer forming part in the vapor layer forming part moving step, and to further perform a spraying region moving step of controlling the spraying region moving unit to move the spraying region toward the outer circumference of the substrate in parallel with the spraying step.

* * * * *